United States Patent
Dominguez

(10) Patent No.: US 10,240,339 B1
(45) Date of Patent: Mar. 26, 2019

(54) MOBILE CELLULAR TRANSMISSION SYSTEM

(71) Applicant: Eddy Dominguez, Fremont, CA (US)

(72) Inventor: Eddy Dominguez, Fremont, CA (US)

(*) Notice: Subject to any disclaimer, the term of this patent is extended or adjusted under 35 U.S.C. 154(b) by 6 days.

(21) Appl. No.: 15/814,391

(22) Filed: Nov. 16, 2017

(51) Int. Cl.
| | | |
|---|---|---|
| *H02K 7/14* | (2006.01) | |
| *H05K 7/20* | (2006.01) | |
| *H01Q 1/02* | (2006.01) | |
| *E04H 1/12* | (2006.01) | |
| *E04B 1/348* | (2006.01) | |
| *E04B 1/343* | (2006.01) | |
| *E04H 12/18* | (2006.01) | |
| *H01Q 1/24* | (2006.01) | |
| *H05K 7/14* | (2006.01) | |
| *E04B 1/35* | (2006.01) | |
| *E04H 5/00* | (2006.01) | |
| *H01Q 1/12* | (2006.01) | |
| *G06F 1/16* | (2006.01) | |

(52) U.S. Cl.
CPC ...... *E04B 1/34869* (2013.01); *E04B 1/34336* (2013.01); *E04H 1/1205* (2013.01); *E04H 12/182* (2013.01); *H01Q 1/246* (2013.01); *H05K 7/1497* (2013.01); *E04B 2001/3588* (2013.01); *E04H 2001/1283* (2013.01); *E04H 2005/005* (2013.01); *G06F 1/16* (2013.01); *H01Q 1/02* (2013.01); *H01Q 1/1235* (2013.01); *H05K 7/14* (2013.01); *H05K 7/20* (2013.01)

(58) Field of Classification Search
CPC .................................................. H05K 7/1497
See application file for complete search history.

(56) References Cited

U.S. PATENT DOCUMENTS

| | | | | |
|---|---|---|---|---|
| 5,237,784 | A * | 8/1993 | Ros ....................... | B60P 1/6427 52/67 |
| 5,285,604 | A * | 2/1994 | Carlin ...................... | B60P 3/14 52/143 |
| 6,104,910 | A * | 8/2000 | Koths ..................... | H04B 7/155 343/878 |
| 6,906,684 | B2 | 6/2005 | Turner | |
| 7,000,357 | B1 * | 2/2006 | Stearns ................ | H01Q 1/1235 52/110 |
| 7,100,896 | B1 | 9/2006 | Cox | |
| 7,385,147 | B2 * | 6/2008 | Garmong ............. | H05K 9/0001 174/364 |
| 7,717,290 | B2 * | 5/2010 | Gerding ............... | B65D 88/121 220/1.5 |
| 7,828,162 | B2 * | 11/2010 | Wiesbauer ............ | B66C 23/185 212/238 |
| 8,550,274 | B2 * | 10/2013 | Gerding ............... | B65D 88/121 220/1.5 |
| 8,770,422 | B2 * | 7/2014 | Cantin .................. | E04B 1/3442 206/386 |
| 8,882,441 | B2 * | 11/2014 | Harrison .................. | E03B 3/03 415/4.2 |

(Continued)

*Primary Examiner* — Robert J Hoffberg
(74) *Attorney, Agent, or Firm* — Tran & Associates

(57) ABSTRACT

A portable cellular site includes a modular shelter having pre-configured equipment to communicate with a telecommunication facility, wherein the shelter is combinable with one or more additional modular units, wherein the modular unit and the modular shelter conforms to at least one common dimension associated with a standard International Organization for Standardization (ISO) freight container.

14 Claims, 72 Drawing Sheets

(56) References Cited

U.S. PATENT DOCUMENTS

| | | | | |
|---|---|---|---|---|
| 8,950,158 B2* | 2/2015 | Walton | ............. | H01Q 1/12 |
| | | | | 52/110 |
| 9,115,504 B2* | 8/2015 | Wallance | ............. | E04B 1/003 |
| 9,308,410 B2* | 4/2016 | Beaver | ............. | A63B 17/00 |
| 9,509,036 B2* | 11/2016 | Garmong | ............. | H01Q 1/3216 |
| 9,907,212 B2* | 2/2018 | Parizeau | ............. | H05K 7/20745 |
| 2005/0181783 A1* | 8/2005 | Foosaner | ............. | H04B 1/03 |
| | | | | 455/424 |
| 2012/0151851 A1 | 6/2012 | Cantin | | |
| 2014/0283452 A1* | 9/2014 | Dittman | ............. | A01G 31/06 |
| | | | | 47/62 R |
| 2014/0298741 A1* | 10/2014 | Reddicliffe | ............. | E04C 2/523 |
| | | | | 52/302.1 |
| 2015/0136939 A1* | 5/2015 | Haselden | ............. | H05K 7/1497 |
| | | | | 248/608 |
| 2015/0244056 A1* | 8/2015 | Walton | ............. | H01Q 1/12 |
| | | | | 52/79.8 |
| 2015/0337527 A1* | 11/2015 | Wallance | ............. | E04B 1/003 |
| | | | | 52/79.9 |
| 2018/0109163 A1* | 4/2018 | Paine | ............. | B65D 88/022 |
| 2018/0238770 A1* | 8/2018 | Annunen | ............. | E04B 1/3483 |

* cited by examiner

FIG. 11 MTP & Base Ballast Module – Mast side view (Outrigger Closed & Extended)

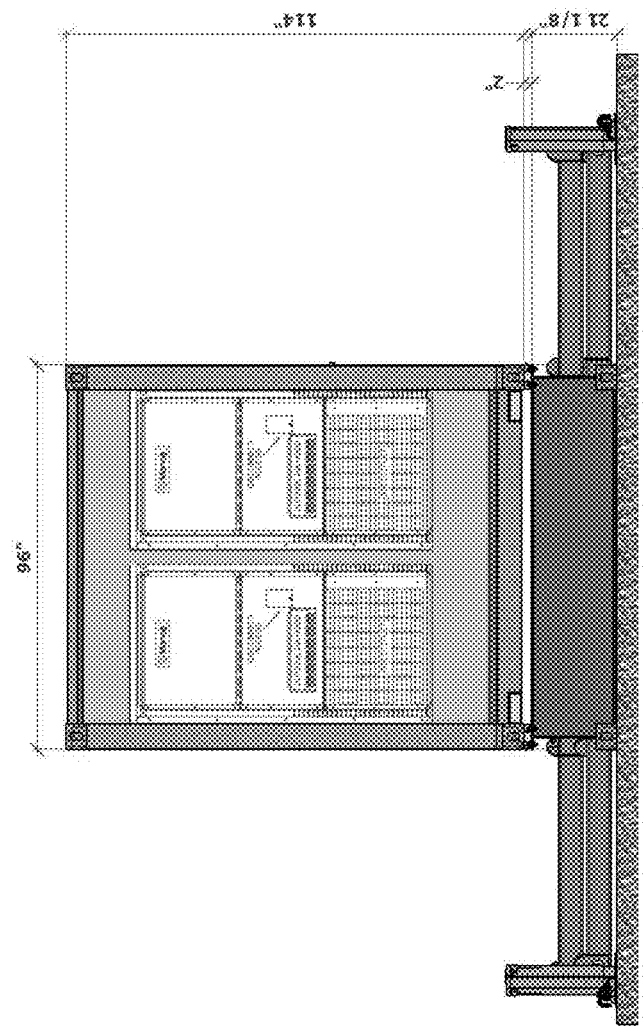
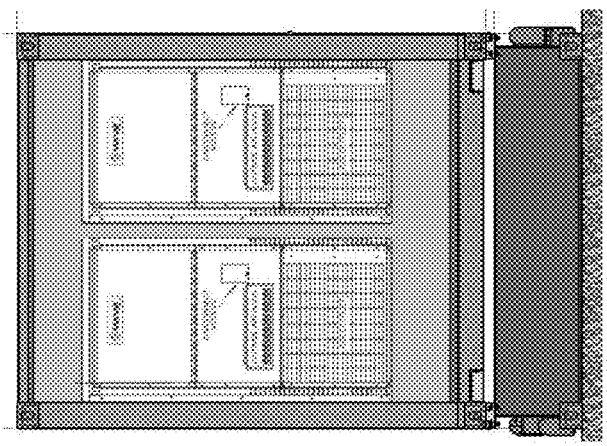
FIG. 12

Split Room with Pocket Door
Top Side View - A

FIG. 14 — Split Room with Pocket Door Top Side View - B

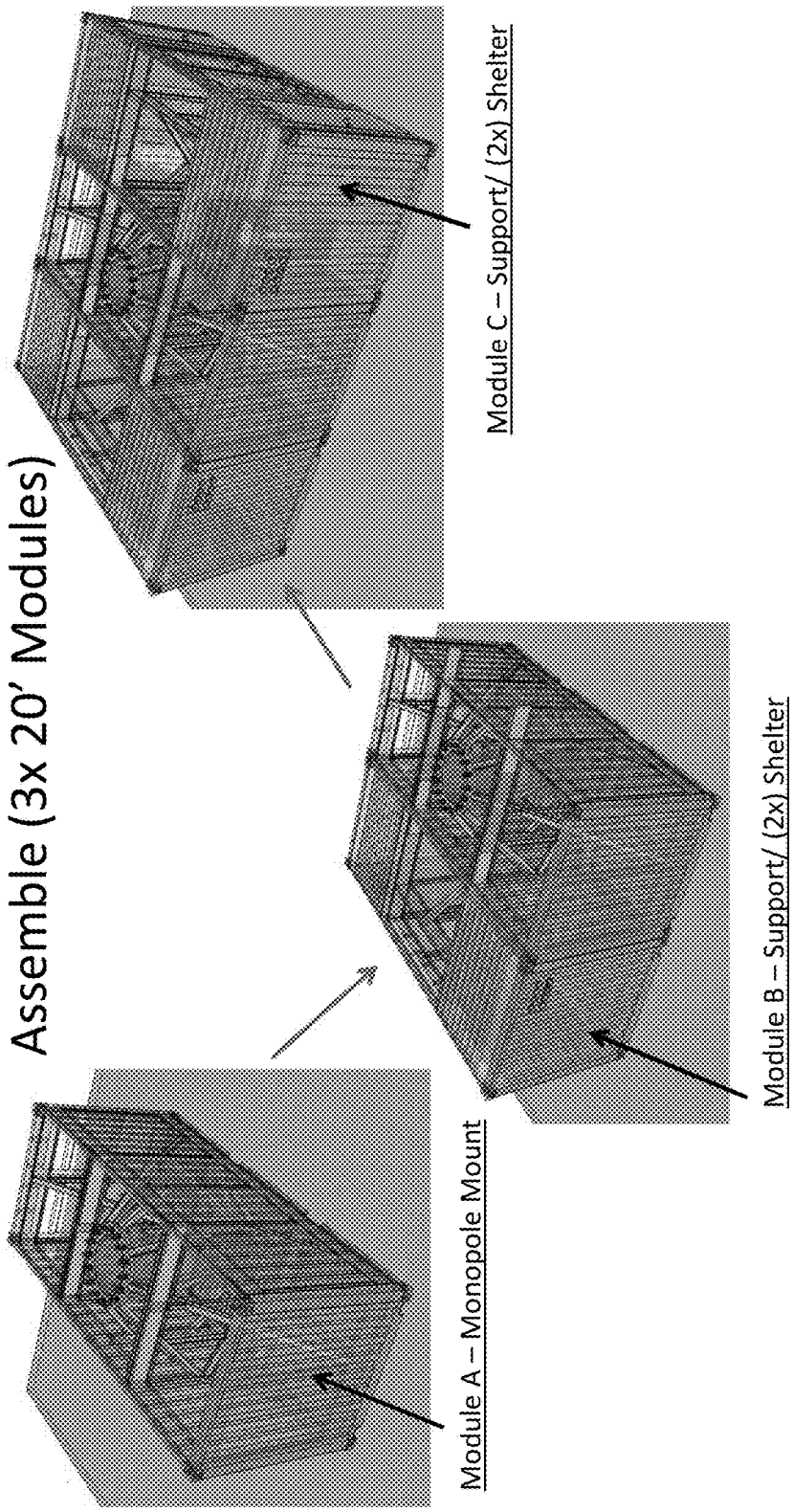

FIG. 54B
Monopole Ballast Foundation
Ballast Structure and Gravel/Rock
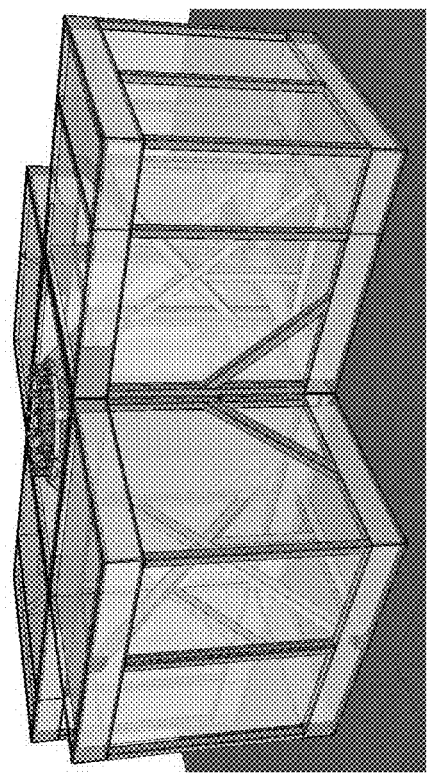
Ballast Structure with Gravel/Rock View
* 64 cubic yard estimated gravel/rock
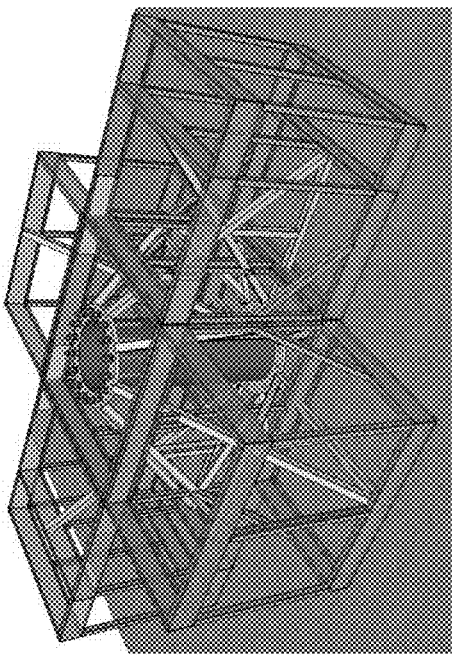
Ballast Structure View

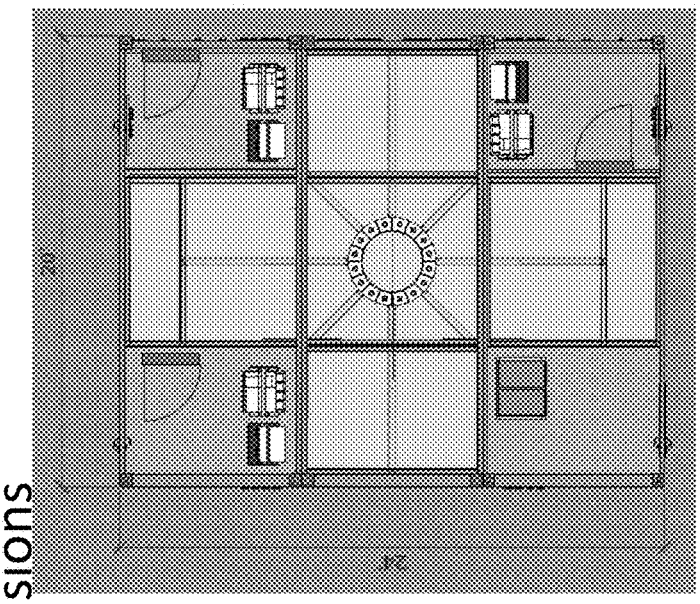
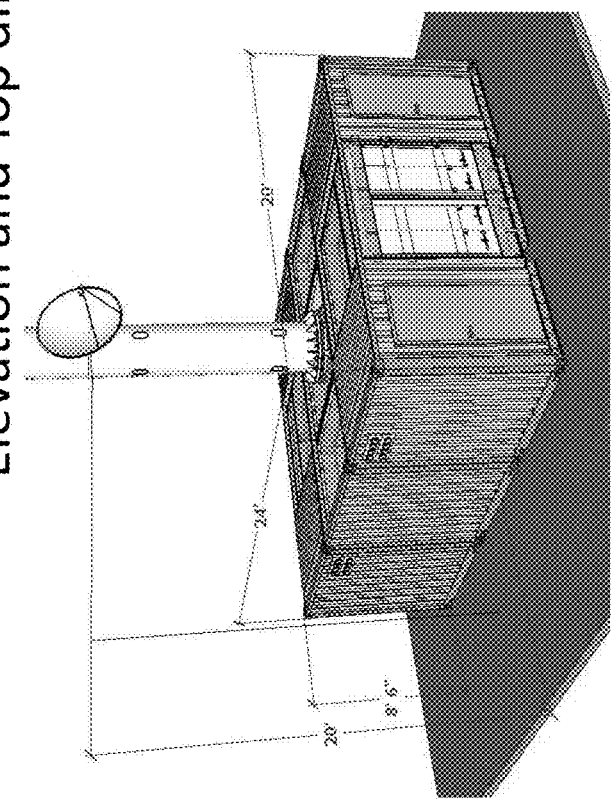
FIG. 54C Monopole Ballast Foundation Elevation and Top dimensions

Front Side – Shelter Entry
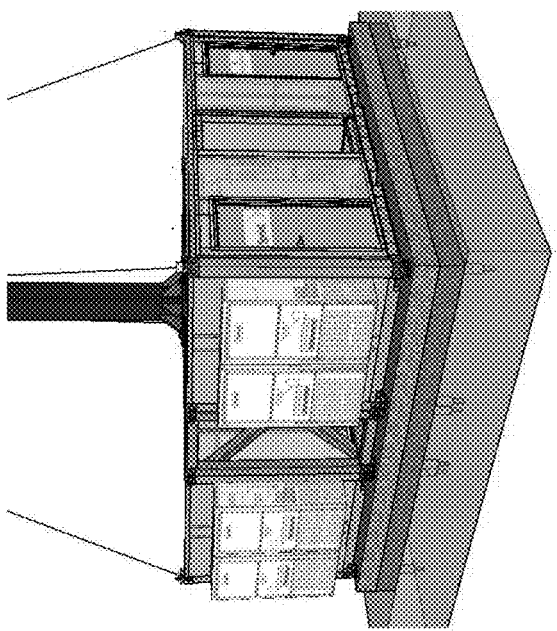
3 Carrier Configuration
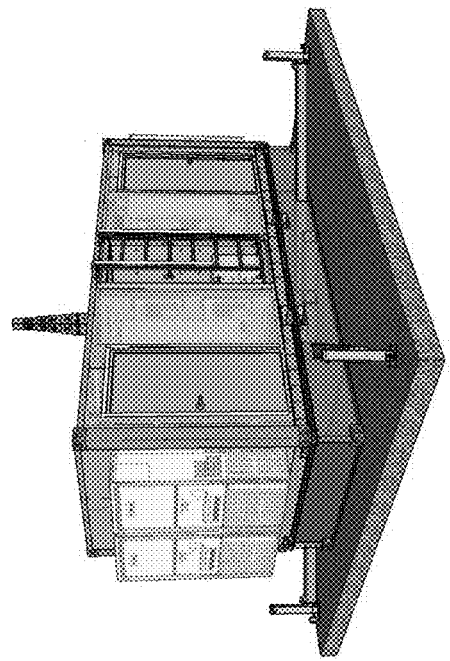
2 Carrier Configuration
FIG. 55A Back Side – Power & RF Access
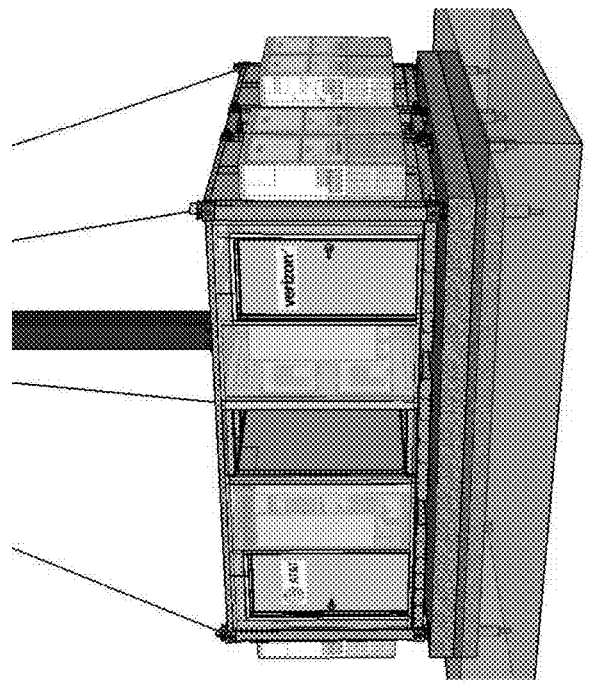
3 Carrier Configuration
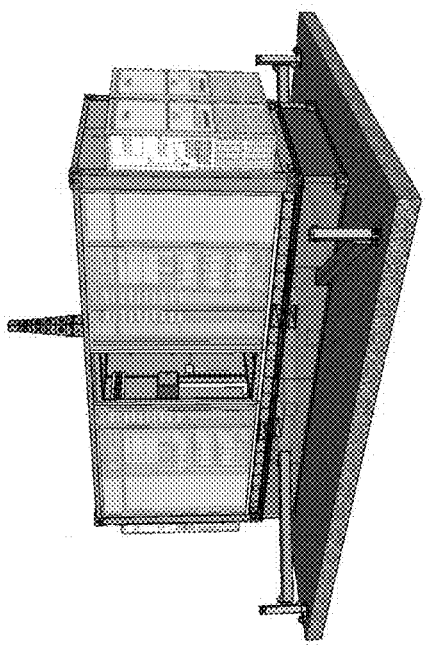
2 Carrier Configuration
FIG. 55B

Side View - HVAC
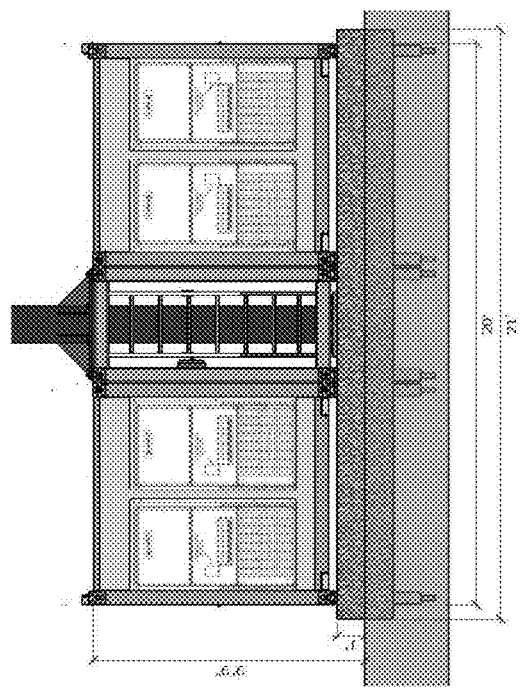
3 Carrier Configuration
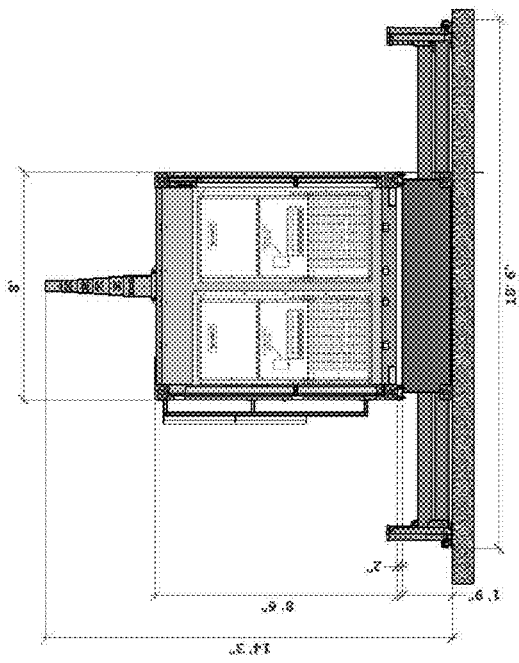
2 Carrier Configuration
FIG. 55C

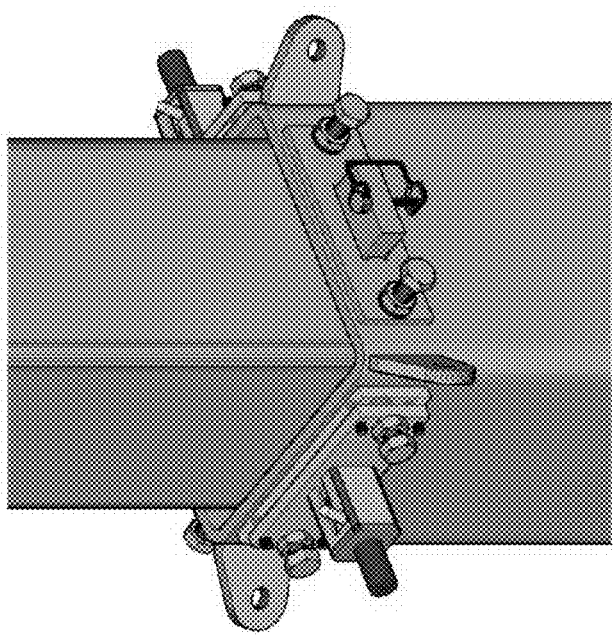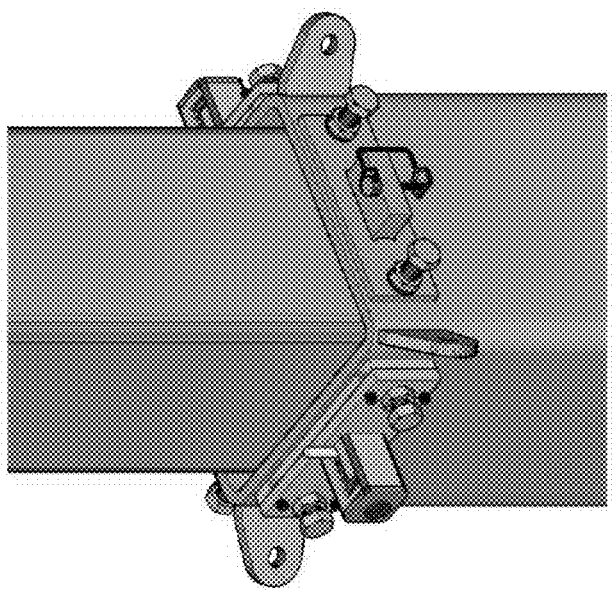
FIG. 56A

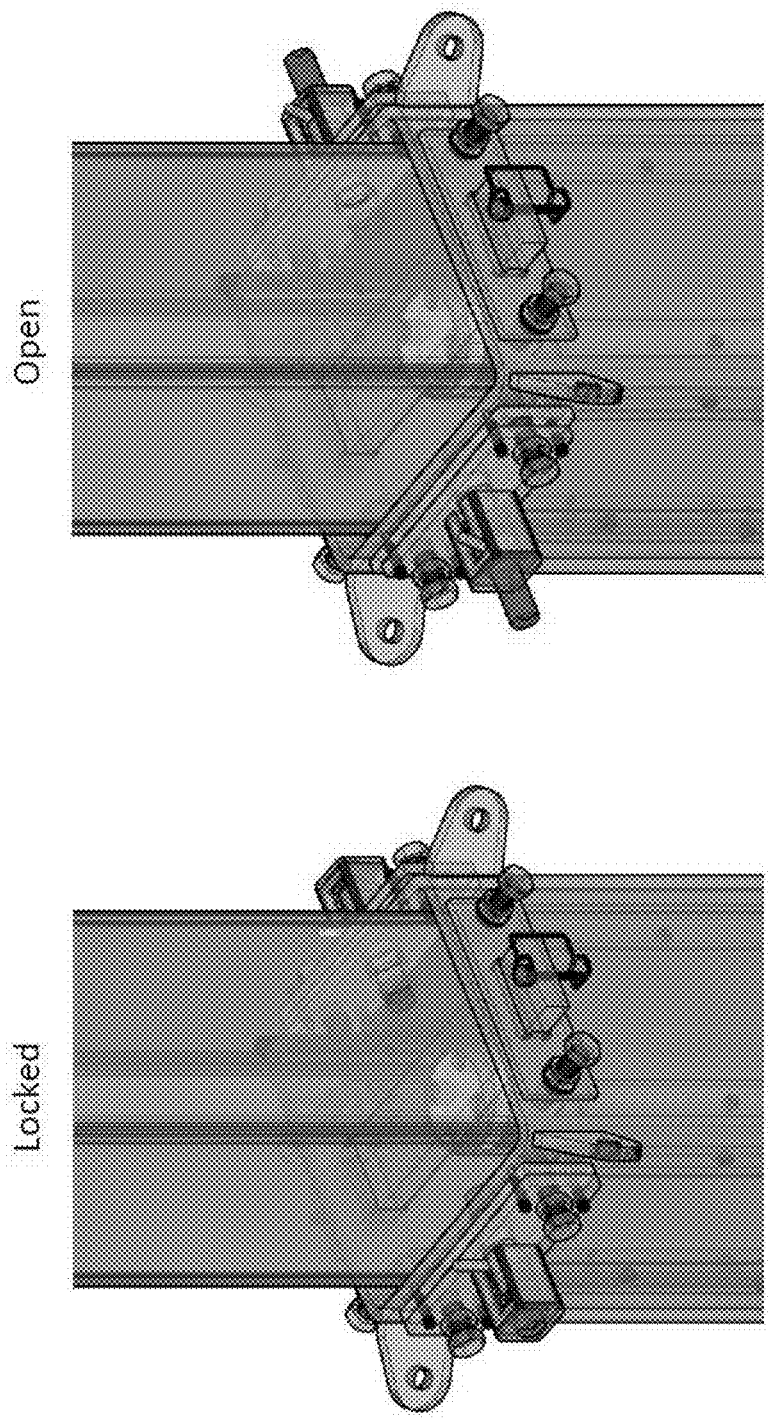
FIG. 56B View of: Twist lock/Pin lock/Gap Reducer Bolts/Guy Ears

Section View of: Twist lock/Pin lock/Gap Reducer Bolts/Guy Ears/Ram

Section View of: Twist lock/Pin lock/Gap Reducer Bolts/Guy Ears/Ram

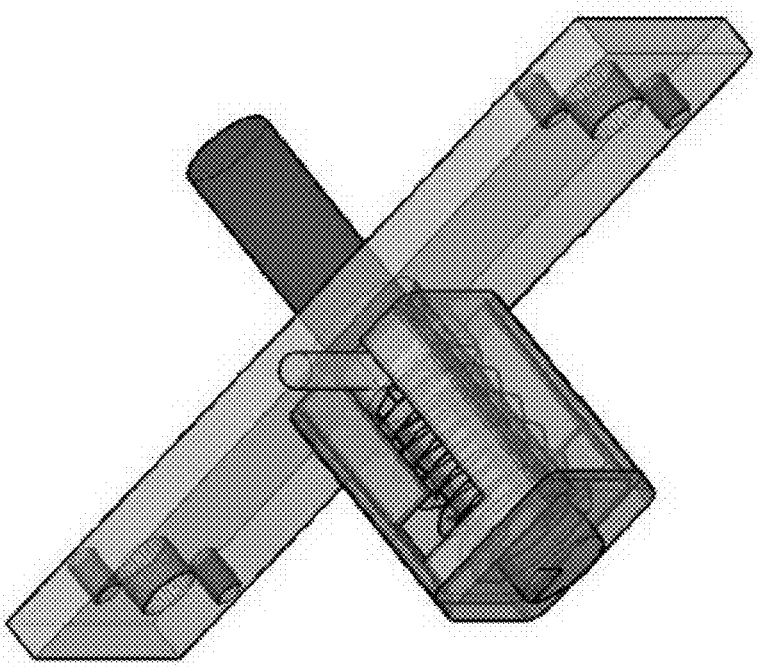
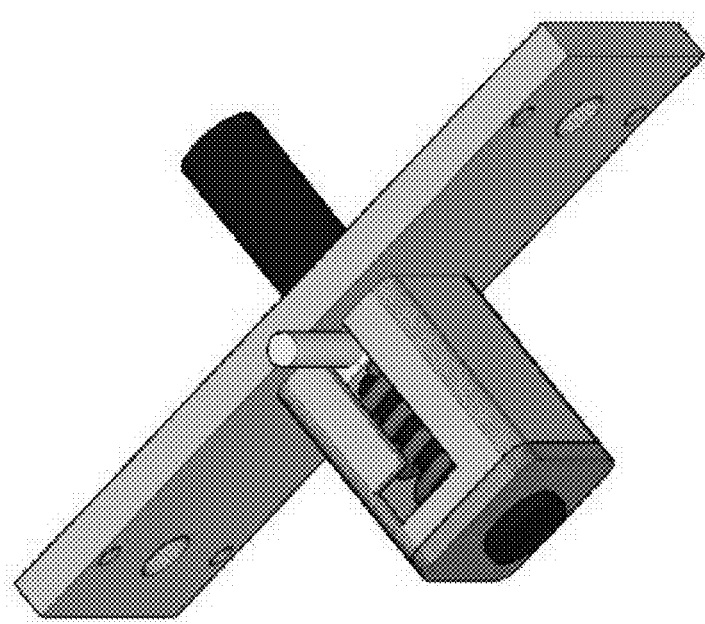
FIG. 56E

MOBILE CELLULAR TRANSMISSION SYSTEM

BACKGROUND

The present invention relates to cellular transmission sites.

In contrast to the largely stationary internet of the early 2000s, Americans today are increasingly connected to the world of digital information while "on the go" via smartphones and other mobile devices. Explore the patterns and trends that have shaped the mobile revolution below. The vast majority of Americans—95% —now own a cellphone of some kind.

To support such explosive growth in usage, telecommunication companies (telcos) need many cell towers. Cell tower costs vary widely, depending on what kinds of deals the constructor has with various vendors. Generally, constructing a tower costs around $200,000 or $250,000. About $150,000 of that is for "civil installation" which includes pouring concrete, the mast and its erection, backup generators, fencing, tiny air-conditioned shack, and security systems. The telecommunications guts (baseband processors, transceivers, power supplies, amplifiers, etc) will run about $20,000 to $50,000 for the equipment—and another $25,000 for installation ($75,000 for equipment and installation). There may also be about $5000 worth of costs to connect the tower to the core network, depending on its location and infrastructure. The bulk of the cost is for "civil installation" (standard building materials, construction, and installation costs). A major issue is the permit issuance, which can take 12-36 months to obtain.

Moreover, after construction, the cell towers are exposed to damage from natural disasters since they cannot not be moved to safety. Since the telcos are typically self-insured, the maintenance and support of the cell towers can be substantial.

SUMMARY

In a first aspect, a portable cellular site includes a modular shelter having pre-configured equipment to communicate with a telecommunication facility, wherein the shelter has the approximate dimensions of a standard International Organization for Standardization (ISO) freight container; a door to enter the shelter; a computer rack to receive computer equipment; a radio unit rack to receive wireless communication equipment; and air conditioning machine to cool the shelter interior.

Implementations of the aspect may include one or more of the following. Security bars can be used to protect equipment in the shelter. The computer rack is adjustable to handle different computer size. An air conditioning compartment is provided to house an air conditioner and security bars protect the air conditioner. An equipment compartment is provided, wherein the door is coupled to the equipment compartment, and wherein the equipment compartment is sealed from the environment. An antenna compartment houses the extendable mast. An actuator is used to elevate the antenna mast. A plurality of radio frequency entry openings to receive cables to an antenna. A ballast can be used to secure the shelter to the ground. The shelter can have first and second substantially parallel corner posts disposed at a first end of the shelter, the first and second corner posts having first and second ends; an upper frame support extending between the first ends of the first and second corner posts; a lower frame support extending between the second ends of the first and second corner posts, wherein the shelter has sufficient strength to withstand the forces of at least eight similar shelters stacked on top of the shelter. The shelter is configured to satisfy a stacking test requirements when at least eight similarly dimensioned shelter are stacked on top of the shelter. A plurality of corner posts are used, wherein each of the corner posts comprises first and second connection blocks disposed adjacent the first and second ends of the corner post. One of the corner posts can have an interior cavity configured to receive a jack configured to assist with leveling the shelter. The system can have a jack configured to move the shelter from a truck to a ground without requiring a crane; and a hinge connecting the jack and one of the corner posts, wherein the hinge is configured to allow the jack to pivot from a first position in which the jack is disposed substantially within an interior cavity of the one of the corner posts to a second position in which the jack is disposed outside of the one of the corner posts.

In another aspect, a ballast system includes a substantially rectangular base with approximate bottom dimensions of a standard International Organization for Standardization (ISO) freight container; base locking units at each corner of the base to be secured to a shelter with approximate dimensions of a standard International Organization for Standardization (ISO) freight container; and extendable arms extending from the base to the ground.

In yet another aspect, a cellular communication system includes a modular shelter having pre-configured equipment to communicate with a telecommunication facility, wherein the shelter in combination with one or more additional modular shelters in combination conforms to the approximate dimensions of a standard International Organization for Standardization (ISO) freight container; each shelter having a door to enter the shelter; a computer rack to receive computer equipment; a radio unit rack to receive wireless communication equipment; and air conditioning machine to cool the shelter interior.

In further aspect, a cellular communication system, comprising a first shelter having pre-configured equipment to communicate with a telecommunication facility, wherein the shelter in combination with one or more additional modular shelters in combination conforms to the approximate dimensions of a standard International Organization for Standardization (ISO) freight container, and a second shelter stacked above the first shelter coupled to the stair, wherein the shelter in combination with one or more additional modular shelters in combination conforms to the approximate dimensions of the ISO freight container.

In another aspect, a cellular communication system includes a first shelter having pre-configured equipment to communicate with a telecommunication facility, wherein the shelter in combination with one or more additional modular shelters in combination conforms to the approximate dimensions of a standard International Organization for Standardization (ISO) freight container, and second, third and fourth shelters coupled at one end to an end near the antenna mast, wherein the antenna mast is secured to the first, second, third and fourth shelters, wherein each shelter conforms to the approximate dimensions of the ISO freight container.

In yet another aspect, a cellular communication system includes a first shelter having pre-configured equipment to communicate with a telecommunication facility, wherein the shelter in combination with one or more additional modular shelters in combination conforms to the approximate dimensions of a standard International Organization for Standardization (ISO) freight container; and one or more additional shelters positioned in parallel or spaced apart from the first shelter coupled to the stair, wherein the shelter in combination with one or more additional modular shelters in combination conforms to the approximate dimensions of the ISO freight container.

In a further aspect, a transport system includes a trailer with a transport bed adapted to receive a shelter having substantially rectangular base with approximate bottom dimensions of a standard International Organization for Standardization (ISO) freight container; first and second wheeled transport assembly positioned on the trailer, wherein each transport assembly is adapted to connect to each end of the shelter to move the shelter on or off the trailer; and base locking units at each corner of the bed to be secured to a shelter.

Advantage of the preferred embodiments may include one or more of the following. The system is portable and mobile, cost effective, and can be moved to avoid natural disaster or as capacity is needed. The deployable, expandable telco shelter may be transported along with other standard ISO shipping containers by cargo aircraft, military aircraft, rail, truck and container ship. For example, two such telco shelters can be accommodated in a military C-130 aircraft. The telco shelters may be stacked one on top of the other to a height of nine for shipping on the deck of a container ship or for storage. These telco shelters are built to structural standards for shipping containers and to comply with ISO 1496/1 test requirements.

BRIEF DESCRIPTION OF THE DRAWINGS

The accompanying drawings are not intended to be drawn to scale. In the drawings, each identical or nearly identical component that is illustrated in various figures is represented by a like descriptor. For purposes of clarity, not every component may be labeled in every drawing.

The advantages and features of this invention will be more clearly appreciated from the following detailed description, when taken in conjunction with the accompanying drawings, in which:

FIG. 12 shows an exemplary view of the HVAC side view of FIG. 11 with closed and extended outriggers.

FIG. 53A shows an exemplary power generator as a modular add-on option.

FIG. 53B shows an exemplary pod lift stand as a modular add-on option.

FIG. 53C shows an exemplary lift bucket as a modular add-on option.

FIG. 53D shows an exemplary pod walkway as a modular add-on option.

FIG. 53E shows an exemplary pod foundation option.

FIG. 53F shows an exemplary radio expansion unit as a modular add-on option.

FIG. 53G shows an exemplary power plant or backup battery module as a modular add-on option.

FIGS. 54A-54C show exemplary monopole antenna ballast foundation using 3 8×20 containers.

FIGS. 55A-55D show exemplary ballast configurations supporting a plurality of modular pods sharing a common antenna module between the pods.

FIGS. 56A-56E show exemplary mast securing system that reduces risk of mast collapsing based on securing pin failure.

DETAILED DESCRIPTION

Figure 1A:
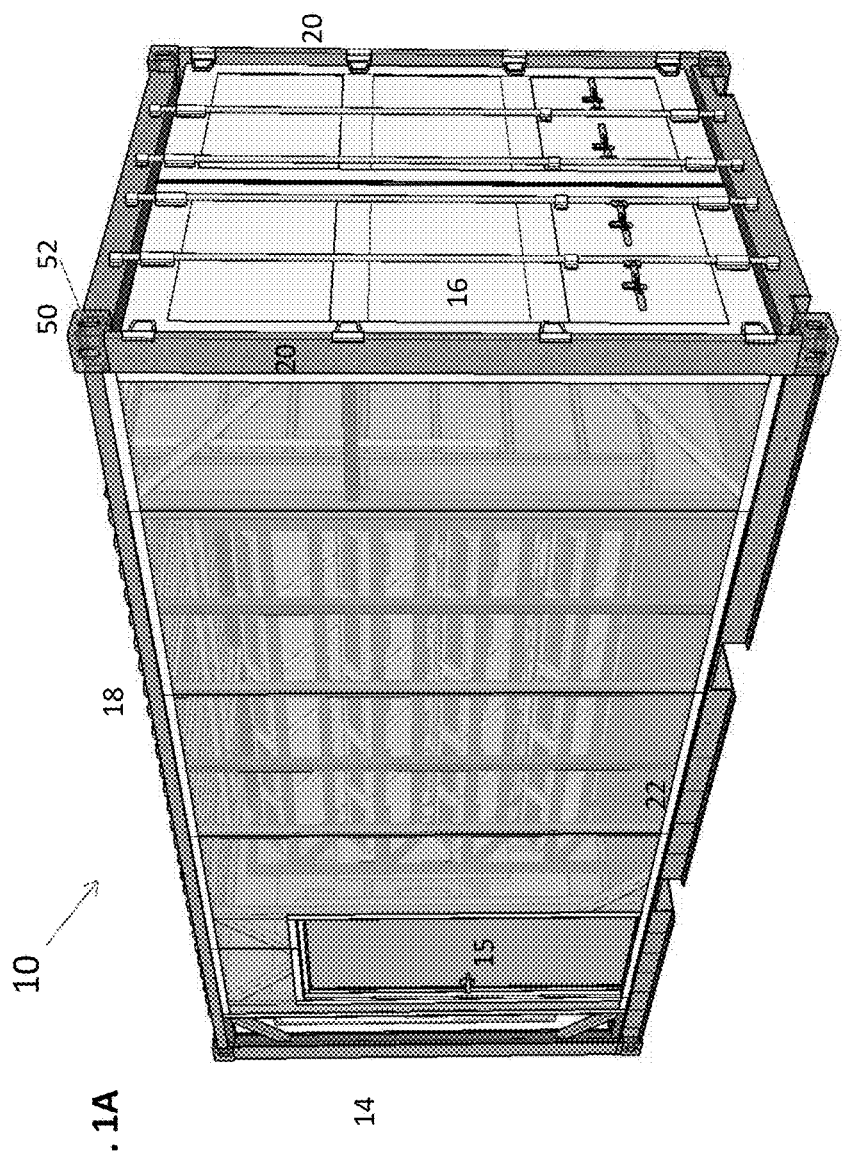
FIGS. 1A-1B show exemplary side views of a modular mobile cellular site(pod).
Figure 1B:
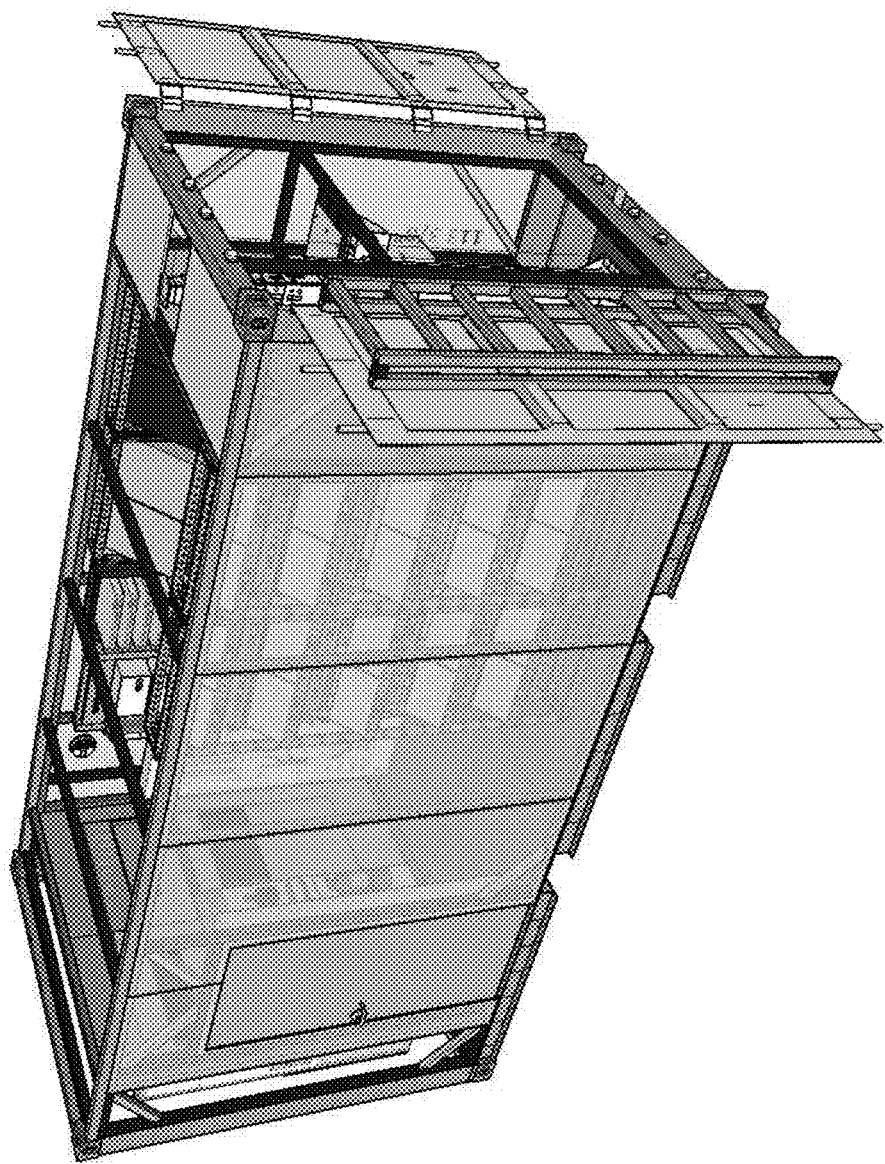

One embodiment of telco shelter 10 of this invention will now be described with respect to FIGS. 1-8. Turning now to FIG. 1, telco shelter 10 includes a main section 12 which has a first end 14, a second end 16, a door 15, a roof 18, a floor panel having a floor surface 22 and four corner posts 20. As shown in FIGS. 13-25 below, telco shelter 10 may further include expandable modules. As further shown in FIGS. 44-52 below, telco shelter 10 may link with other shelters for increased space, support or strength. There are four corner posts 20 which are the main support elements of telco shelter 10. Corner posts 20 may be made of heavy gauge, welded steel. Gusset plates may be provided at the top and bottom ends of posts 20 to provide greater strength and rigidity. Each corner post typically has a connection block 50 attached such as by welding to its top and bottom ends. Each block 50 typically has holes 52 formed in the top and bottom surfaces thereof to allow a standard container connector to be inserted therein. Connectors may be used to clamp telco shelters 10 together vertically. Holes formed on the sides of blocks 50 may be used for interfacing with a crane, forklift or other like mechanism for movement of telco shelter 10 from one place to another.

The telco shelter 10 may have the configuration of a standard ISO container, which is typically twenty feet long, eight feet wide, and eight or nine feet high. As shown in FIG. 1, telco shelter 10 may be stacked on top of other telco shelters 10, or ISO containers with which it is compatible. In this manner, a telco shelter 10 or multiple telco shelters 10 can be shipped by means of cargo aircraft, military aircraft, rail, truck or container ship to a desired location. In one example, two such telco shelters 10 may be accommodated in a C-130 aircraft for deployment. Moreover, the telco shelters 10 may be stacked in a storage facility along with ISO containers. In one embodiment, telco shelters 10 are configured so as to be able to be stacked nine high. Telco shelters 10*a-i* preferably are built to satisfy ISO 1496/1 test requirements.

Corner posts are provided at each corner of the telco shelter. These posts are load-bearing, and are reinforced to permit stacking of the telco shelter. The corner posts may be provided with jacks that may pivot outwardly from the post. Typically the jacks are provided with feet, such as sand feet, which assist in stabilizing the telco shelter. The jacks in the posts level the telco shelter. These jacks may be either manually operated, or, if access to power is provided, there is a self-leveling system which automatically levels the telco shelter. Each of the expanded modules of the telco shelter are also provided with stabilizers having feet which permit leveling of those portions of the telco shelter.

The pod is a deployable, expandable, telco shelter which may be expanded from a base condition in which it has the size and shape of a standard ISO container to a condition in which it contains all equipment ready for deployment as a moveable cell tower. The telco shelter can be stacked nine units high for shipping or storage. The telco shelter, when deployed, may be used for increasing capacity for local events, for adding capacity to freeway, hospital, laboratory space, disaster recovery, temporary housing, meeting or office space, or other like purposes.

Figure 2:
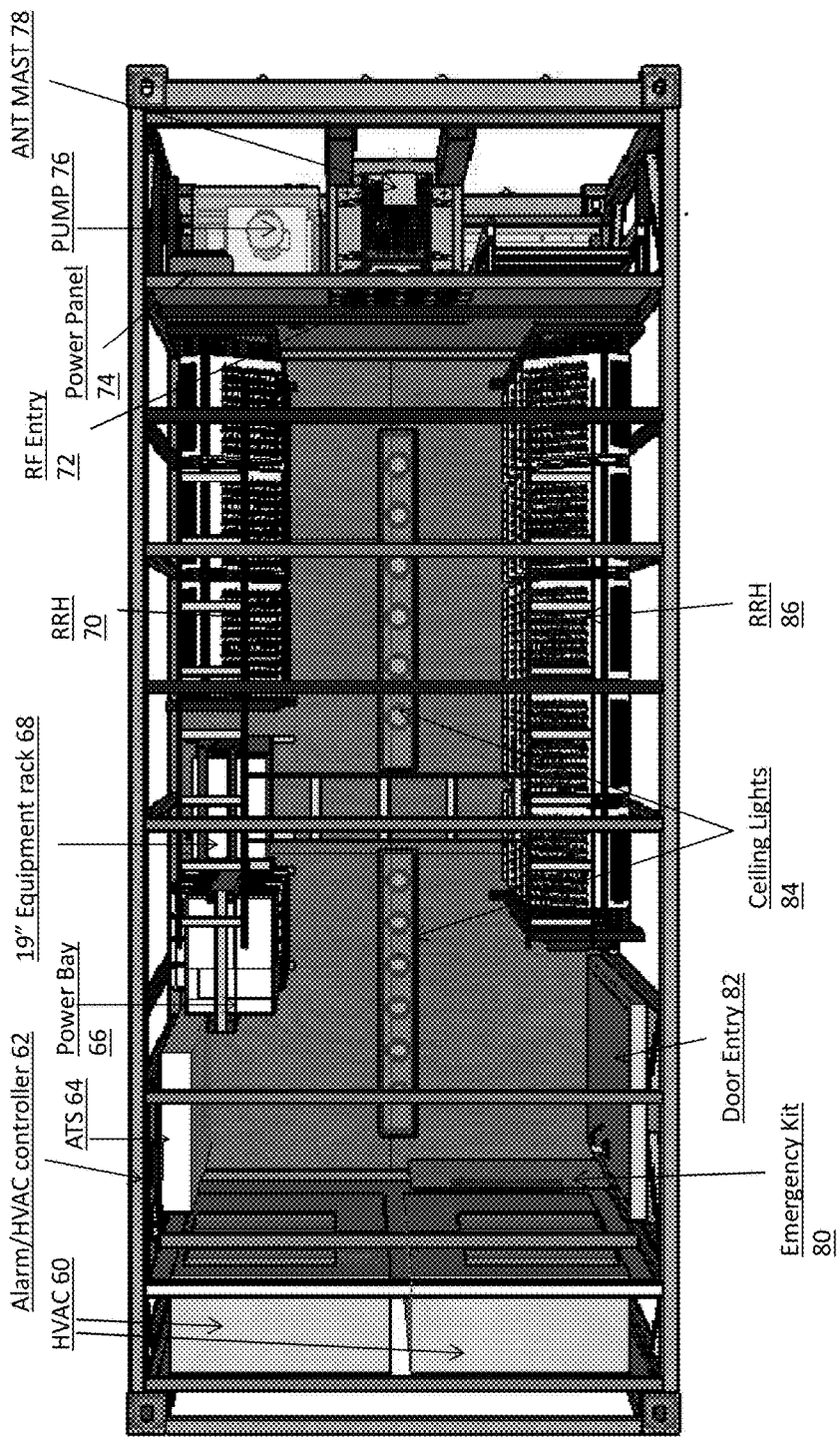
FIG. 2 shows an exemplary top view of the pod of FIGS. 1A and 1B.

FIG. 2 shows the components inside the pod of FIG. 1. The pod has air conditioning unit (HVAC) 60 to cool internal temperature. This can be controlled by an HVAC controller 62. A door entry 82 is provided to allow operator access for maintenance, and next to the door is an emergency kit 80. Across from the door entry 82 is an ATS 64 and power bay 66. Equipment rack 68 is provided, and can handle the standard 19-inch racks, commonly for servers or networking devices. A plurality of remote radio head (RRH) 70 and 86, also called a remote radio unit (RRU) is provided for communication in wireless networks. The RRH is a remote radio transceiver that connects to an operator radio control panel via electrical or wireless interface. In wireless system technologies such as GSM, CDMA, UMTS, LTE the radio equipment is remote to the BTS/NodeB/eNodeB. The equipment is used to extend the coverage of a BTS/NodeB/eNodeB in challenging environments such as rural areas or tunnels. They are generally connected to the BTS/NodeB/eNodeB via a fiber optic cable using Common Public Radio Interface protocols. RRHs have become one of the most important subsystems of today's new distributed base stations. The RRH contains the base station's RF circuitry plus analog-to-digital/digital-to-analog converters and up/down converters. RRHs also have operation and management processing capabilities and a standardized optical interface to connect to the rest of the base station. Remote radio heads make MIMO operation easier; they increase a base station's efficiency and facilitate easier physical location for gap coverage problems. RRHs typically use the latest RF component technology including Gallium nitride (GaN) RF power devices and envelope tracking technology within the RRH RF power amplifier (RFPA). Fourth-generation (4G) and beyond infrastructure deployments will include the implementation of Fiber to the Antenna (FTTA) architecture. FTTA architecture has enabled lower power requirements, distributed antenna sites, and a reduced base station footprint than conventional tower sites. The use of FTTA will promote the separation of power and signal components from the base station and their relocation to the top of the tower mast in a Remote Radio Head (RRH). According to the Telcordia industry standard that establishes generic requirements for Fiber to the Antenna (FTTA) protection GR-3177, the RRH shifts the entire high-frequency and power electronic segments from the base station to a location adjacent to the antenna. The RRH will be served by optical fiber and DC power for the optical-to-electronic conversion at the RRH. RRHs optionally has Surge Protective Devices (SPDs) to protect the system from lightning strikes and induced power surges. There is also a change in electrical overstress exposure due to the relocation of the equipment from the base station to the top of the mast. The RRHs can be installed in a low-profile arrangement along a rooftop, or can involve a much higher tower arrangement.

Figure 4:
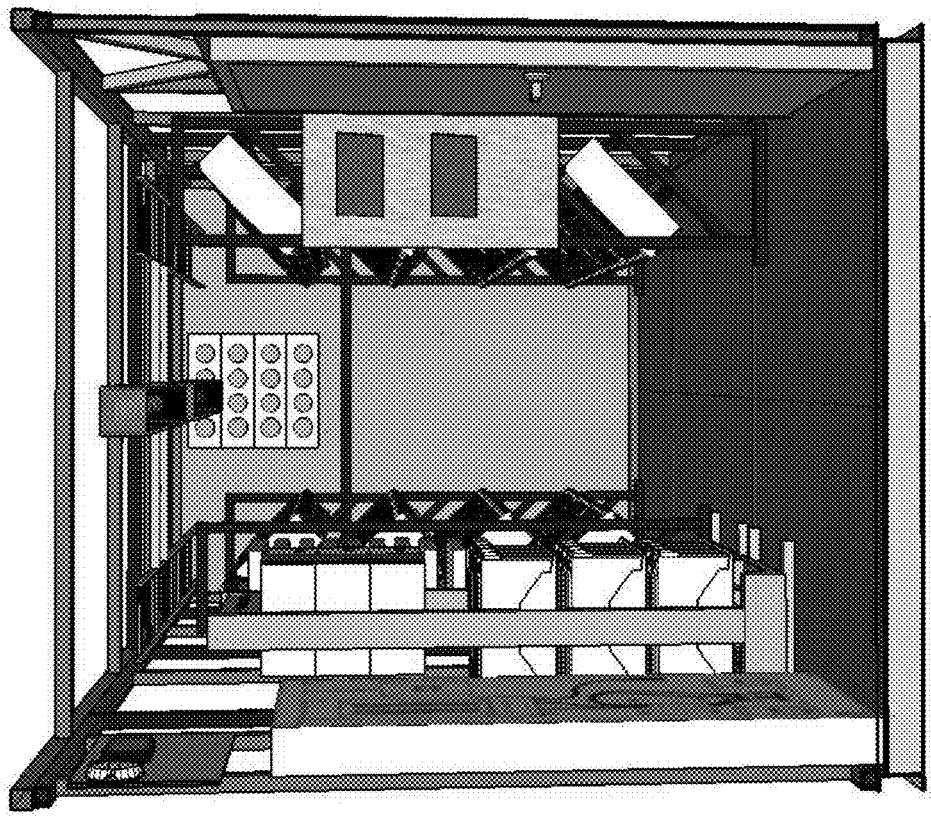
FIG. 4 shows an exemplary interior view of the pod of FIGS. 1A and 1B.
Figure 5:
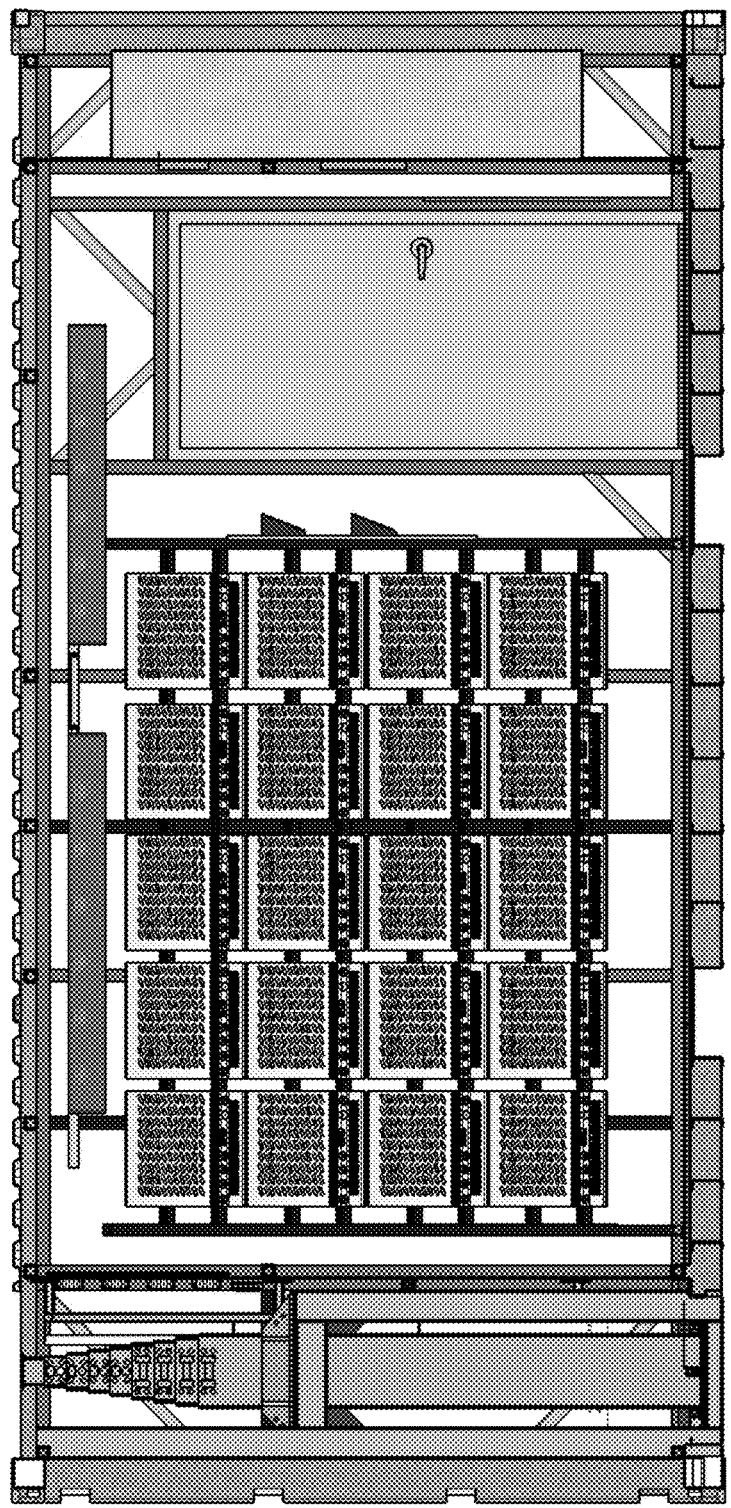
FIGS. 5-6 show exemplary front and back sectional view of the pod of FIGS. 1A and 1B.
Figure 6:
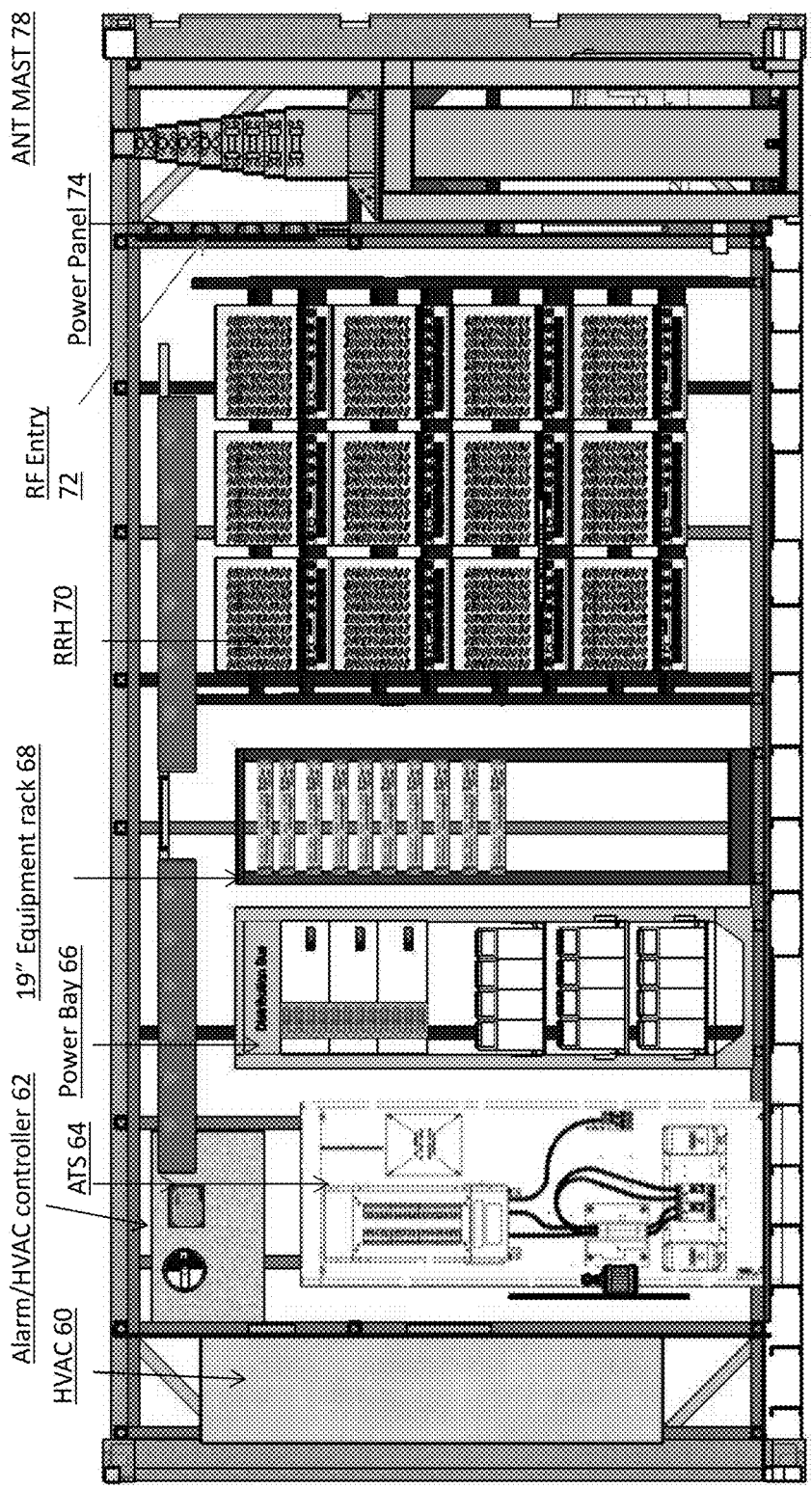
Figure 7:
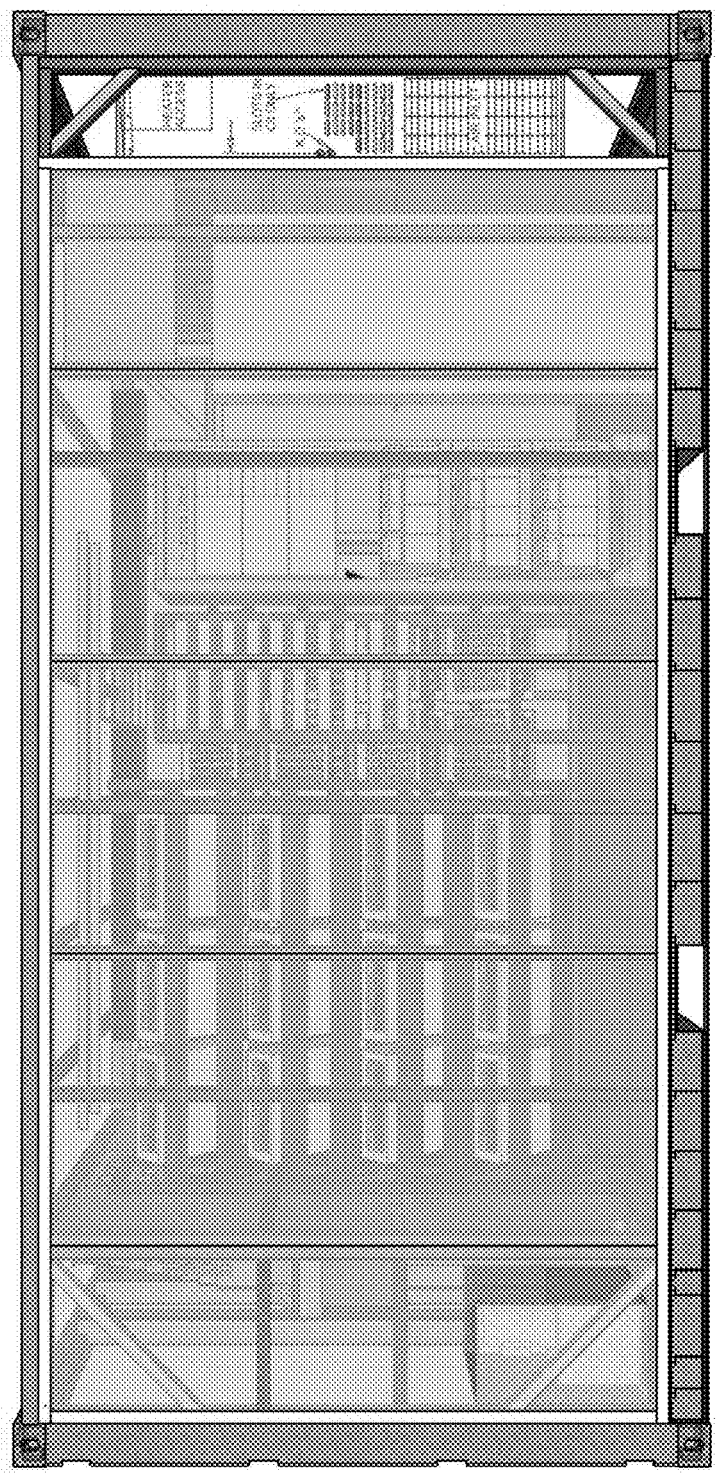
FIGS. 7-8 show exemplary front and back view of the pod of FIGS. 1A and 1B.
Figure 8:
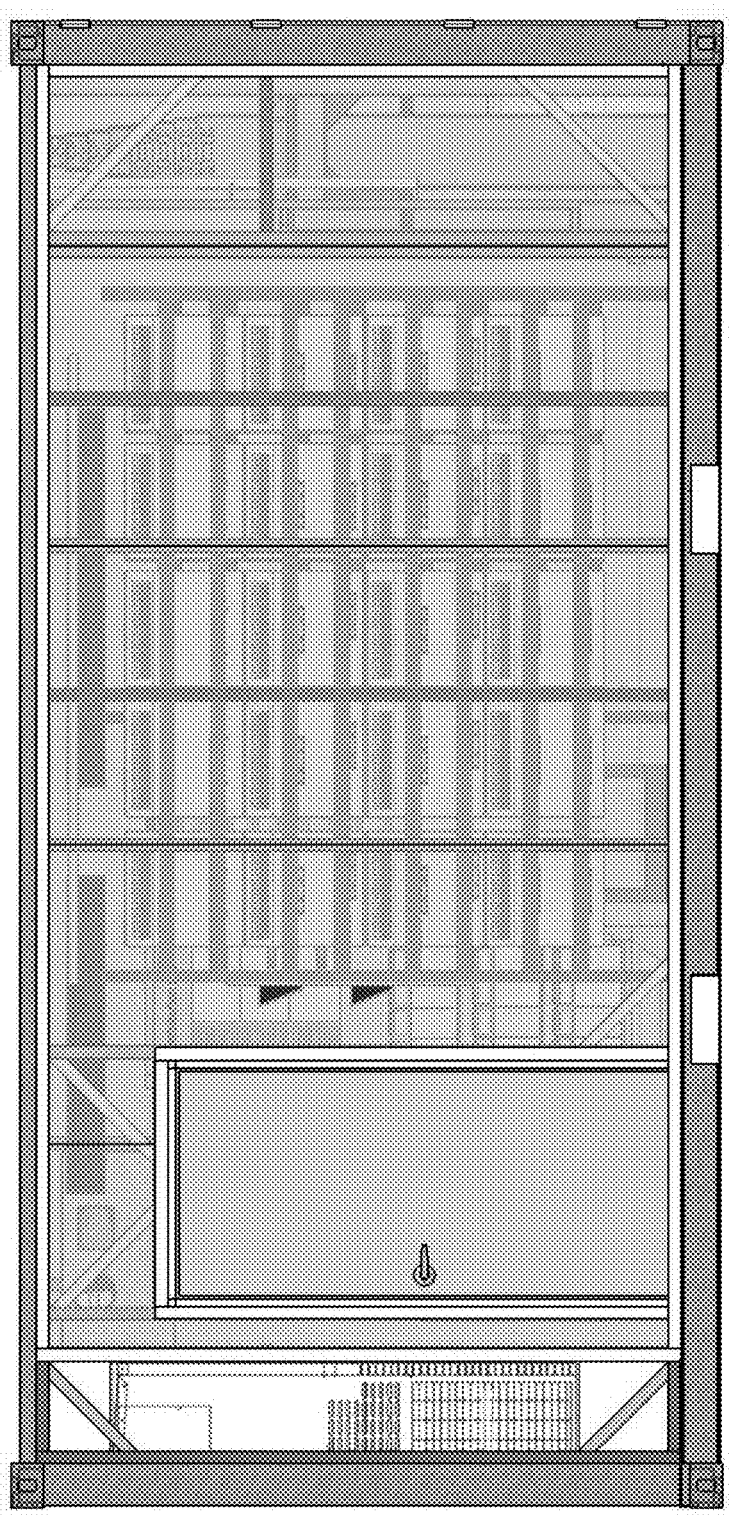

The RRH 70 and 86 have cables that are routed through the RF entry points 72 and connected to an antenna with a mast 78. The antenna mast 78 supports the mounting of antenna. The antenna may be used for reception, transmission or both reception and transmission of an electromagnetic signal. The mast may be limited in height because of obstructions in the environment. Obstructions may include vegetation, vine canopies, tree canopies, bridges, traffic signals, buildings or otherwise. The limitation in height of the antenna may limit the maximum range of effective communications between the vehicle and a communications device located remotely apart from the vehicle. For example, electromagnetic radiation that is in the microwave frequency range may be limited to propagation in line-of-sight paths or may be severely attenuated by ground clutter where antenna height is insufficient for a requisite level of clearance. Accordingly, the mast 78 is used to extend the height for maximizing the available antenna height of an antenna mast mounted on a vehicle to improve the range and reliability of communications. FIG. 4 shows an exemplary interior view of the pod of FIG. 1. FIGS. 5-6 show exemplary front and back sectional view of the pod of FIG. 1, while FIGS. 7-8 show exemplary front and back view of the pod of FIG. 1.

Figure 3:
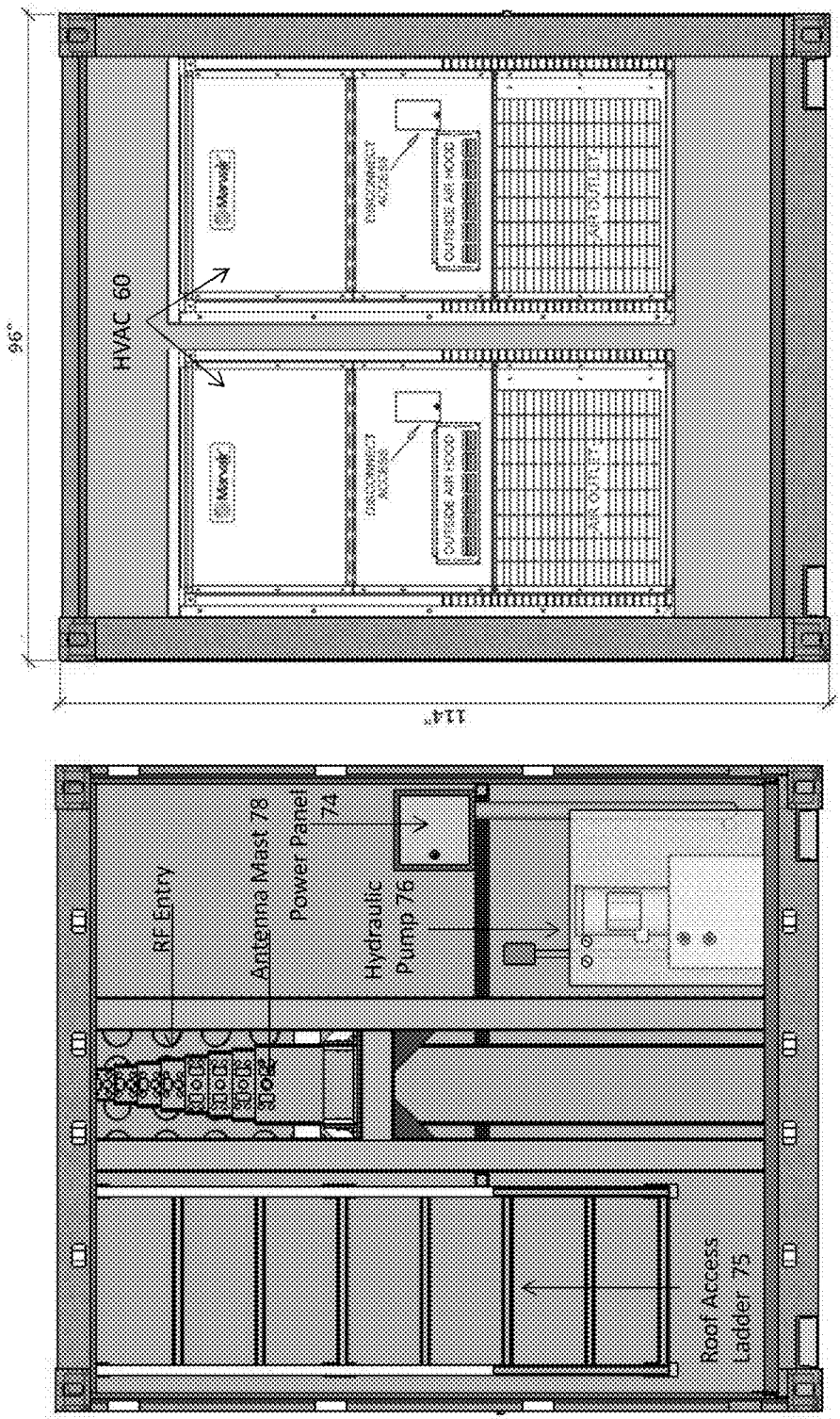
FIG. 3 shows an exemplary mast side and HVAC side view of the pod of FIGS. 1A and 1B.

FIG. 3 shows an exemplary mast side and HVAC side view of the pod of FIG. 1. The mast 78 is moved up or down using a pneumatic pump 76 and controlled by a controller. To support raising and lowering of the antenna mast 78, a retractable tensioner can be used for receiving or releasing the transmission line. In one configuration, the retractable tensioner comprises a reel or spool upon which the transmission line is wound to a great extent when the antenna mast is fully lowered and to a lesser extent (or not at all) when the antenna mast is fully raised. The spool may be spring-loaded to retract the transmission line and a releasable ratchet mechanism (e.g., a generally circular gear with teeth, the gear mounted coaxially to the spool, where the teeth engage a movable pawl) may prevent the spool from moving when the tower is elevated above its lowest height. A signal evaluator measures or determines a signal quality level associated with the received electromagnetic signal. The signal evaluator is arranged to compare the measured signal quality level to a threshold minimum signal quality level. The user or a technician may establish the threshold minimum signal quality based on one or more of the following: (1) target reliability (e.g., 99.9% reliability) or target availability of communications (e.g. reception, transmission or both) for the antenna and associated communications equipment, (2) a maximum bit-error rate for digitally modulated signals, (3) a minimum signal-to-noise ratio, and (4) a minimum signal strength. The threshold minimum signal quality may vary with the environment or location of the vehicle and may vary over time, such that time-averaged readings of the measured signal are used for signal quality determinations. In one embodiment, the signal quality comprises the measured signal-to-noise ratio of the received signal and the minimum signal quality level comprises a minimum signal-to-noise ratio defined by a user or technician. In another embodiment, the signal quality comprises signal strength of the received signal, and the minimum signal quality level comprises a minimum signal strength defined by a user or technician.

Further, a power panel 74 receives power into the pod. Power may be provided by line to a connector from a source, such as a peripheral mechanical module to power communications panel. Heating, ventilation and air conditioning may be provided through supply and return ducts which may connect to adapter plates. Communication lines (not shown) may connect with connectors. Clean and waste water lines, respectively, may be connected to adapter plate which is interchangeable with other adapter plates. Power from panel 74 may be supplied to sub panels to supply power to outlet strips (not shown) and lights 84.

A leveling bubble may also be provided for manual leveling of the telco shelter 10. Preferably, however, the telco shelter is self-leveling. A self-leveling control panel 168 allows the telco shelter to level itself through the use of built-in sensors and software. A typical self leveling unit employs an inclinometer and electric motors and gear reducers to operate jacks described below in a known manner to level telco shelter 10.

To enhance placement without requiring a crane, in one embodiment, each post 20 contains a jack. The jack is normally in a stowed or retracted position, and extends in a deployed condition to support the pod when the truck is moved. The jack is then retracted to bring the pod to the ground in a controlled manner and the jack can be removed afterward. Jack typically includes a ram for leveling of telco shelter 10. Typically, each jack is disposed within an interior cavity of post 20 in the retracted position. A cover plate may be disposed on the front of housing. In one embodiment, cover plate may have integral cross bolts that may lock the cover plate and jack in a stowed position. A bracket may be attached to the front of cover plate and may be used to manually pull the jack out of the post 20 and swing it into its deployed condition. There may also be a manual access knob that permits access to a socket for a hand crank that can be used to manually crank down the ram of jack, for leveling of telco shelter 10 in the absence of any power. Alternatively, or in addition, ram may be driven by an electromechanical motor. Electrical power and sensor wires may be attached at connectors at the top end of housing. The bottom end of ram may be filled with a stabilizing foot.

Containers suitable for transportation by truck, ship, or air must generally comply with the standards and regulations for ship freight set forth by ISO and CSC. Furthermore, containers that are transported by helicopter must be able to support the dynamic load imposed by the lifting of the containers, which is typically about three times the static load. Heretofore, such containers generally have a metal framework, i.e., a post-and-beam construction, with composition board (usually steel or aluminum sheathed) or other composite material panels attached to the framework by bolts, rivets, welding, and the like. Such containers, however, are inherently heavy. For example, a standard 20-feet long container constructed to meet ISO size requirements (typically 8 feet wide by 8 feet high) weighs on the order of 4,000 to 5,000 pounds. As a result, the maximum cargo or payload that can be transported in such a container is generally limited to two to three times the tare weight, or empty weight, of the container. Furthermore, the side, roof, and floor panels of the metal-framed container typically do not support any structural loads or provide any structural resistance to externally applied forces. The metal framework of these containers must therefore have sufficient mass and structural strength to support both the cargo load and any externally applied forces. More recently, instead of metal framework, some transportable containers that have been constructed to meet ISO size requirements have been formed of composite material panels. These containers may not be able to handle hurricane level wind. To address this, a base ballast can be used.

Figure 9:
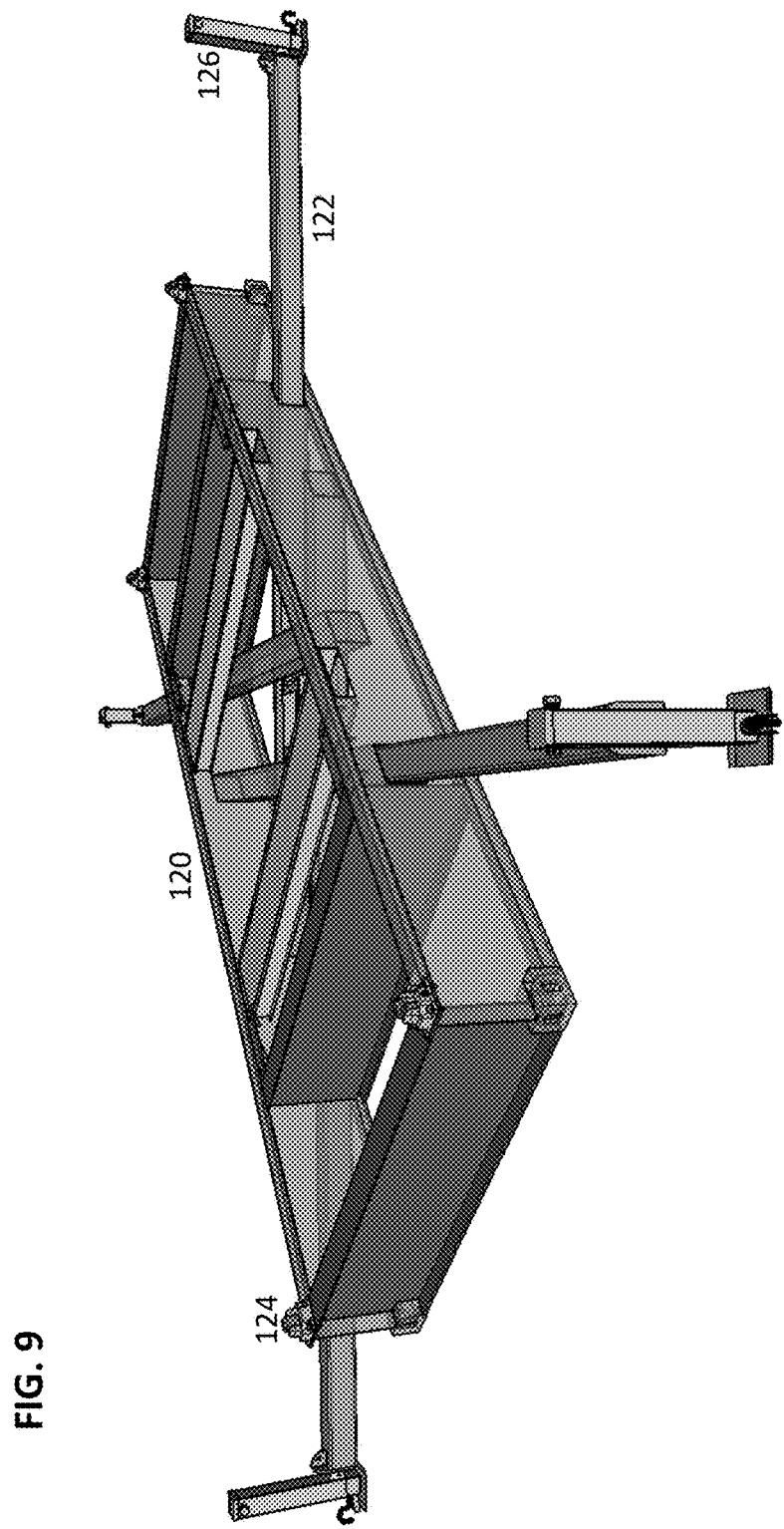
FIG. 9 shows an exemplary perspective view of a base ballast for the pod of FIGS. 1A and 1B.

FIG. 9 shows an exemplary perspective view of a base ballast for the pod of FIG. 1. The base ballast can be used to anchor the pod to the ground and can sustain hurricane level wind. The ballast can hold material that is used to provide stability to a pod. Material in the ballast can be positioned to affect the pod handling by changing its load distribution or center of gravity, for example.

Figure 10:
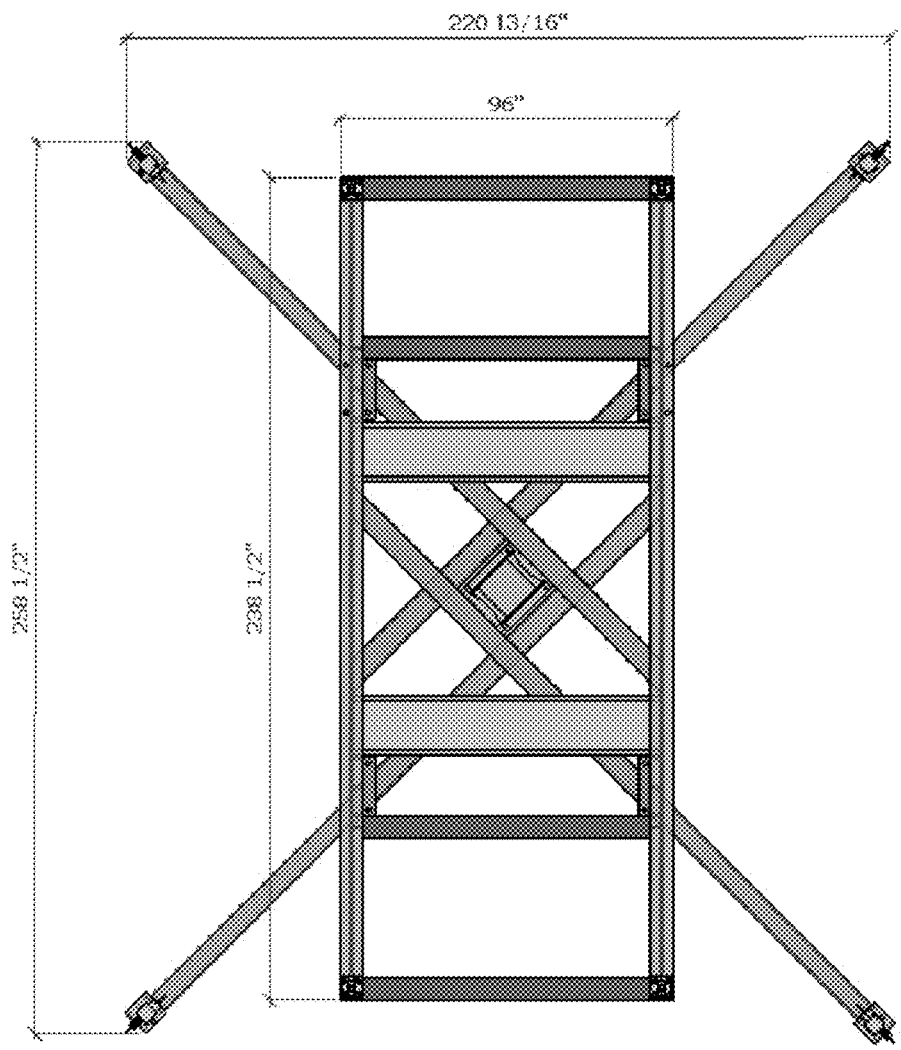
FIG. 10 shows an exemplary top view of the base ballast of FIG. 9.
Figure 11:
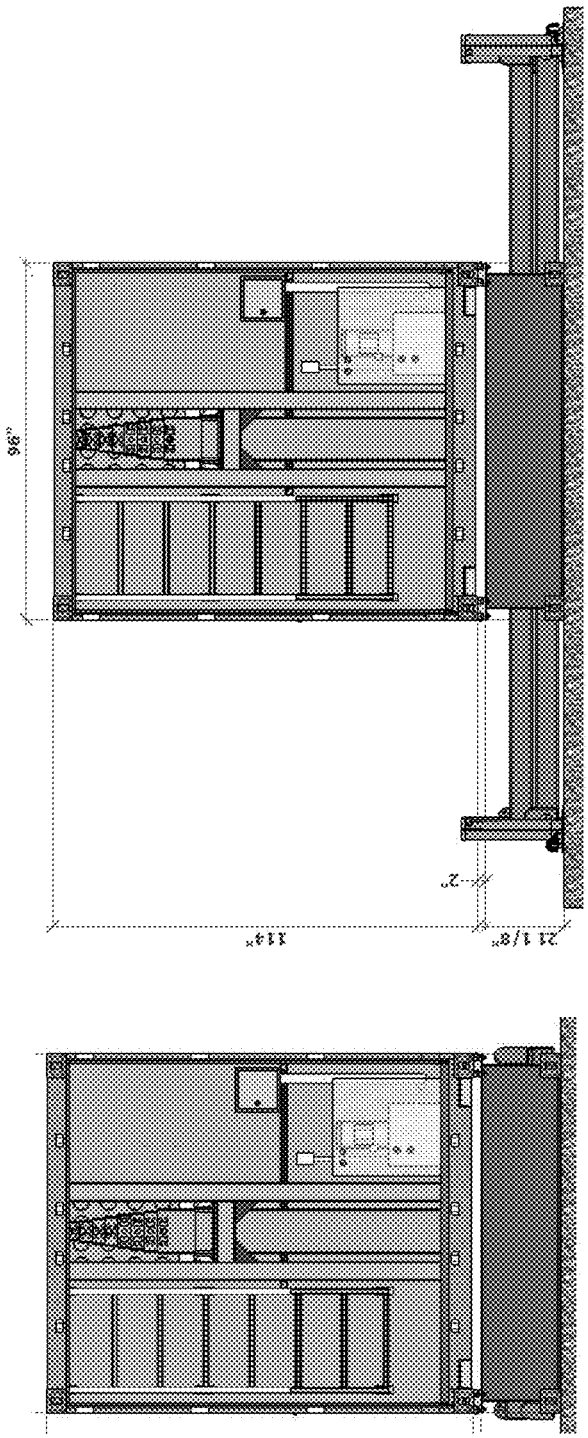
FIG. 11 shows an exemplary mast side and HVAC side view of the ballast of FIG. 9.
Figure 13:
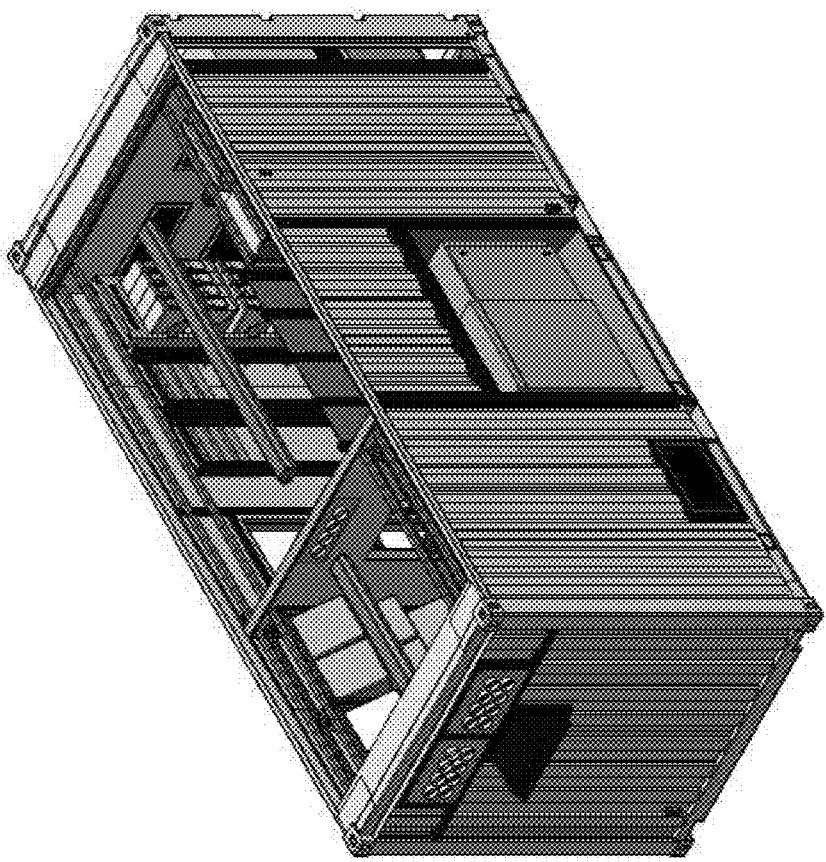
FIGS. 13-23 show an exemplary views of a split room embodiment of a pod.
Figure 14:
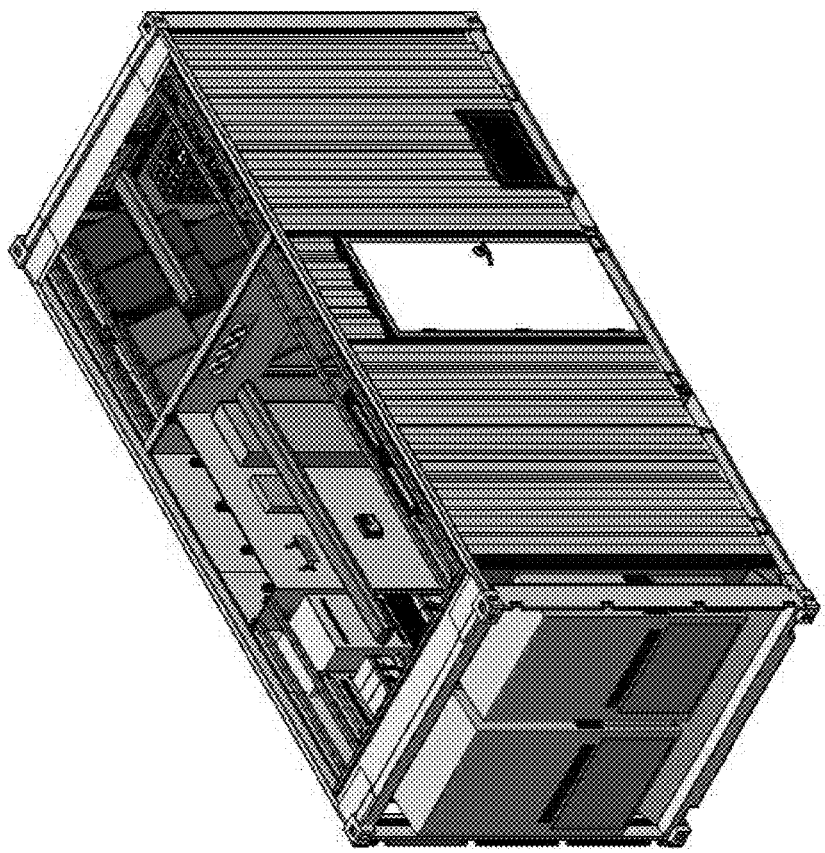
Figure 15:
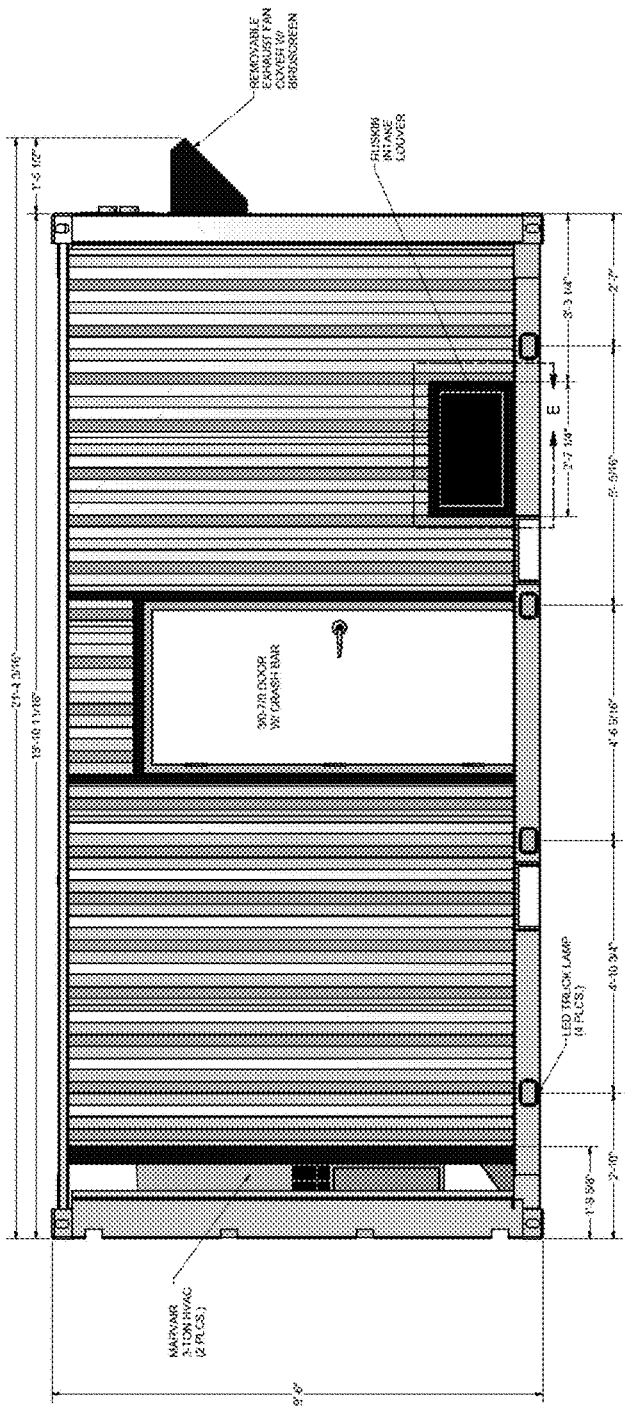
Figure 16:
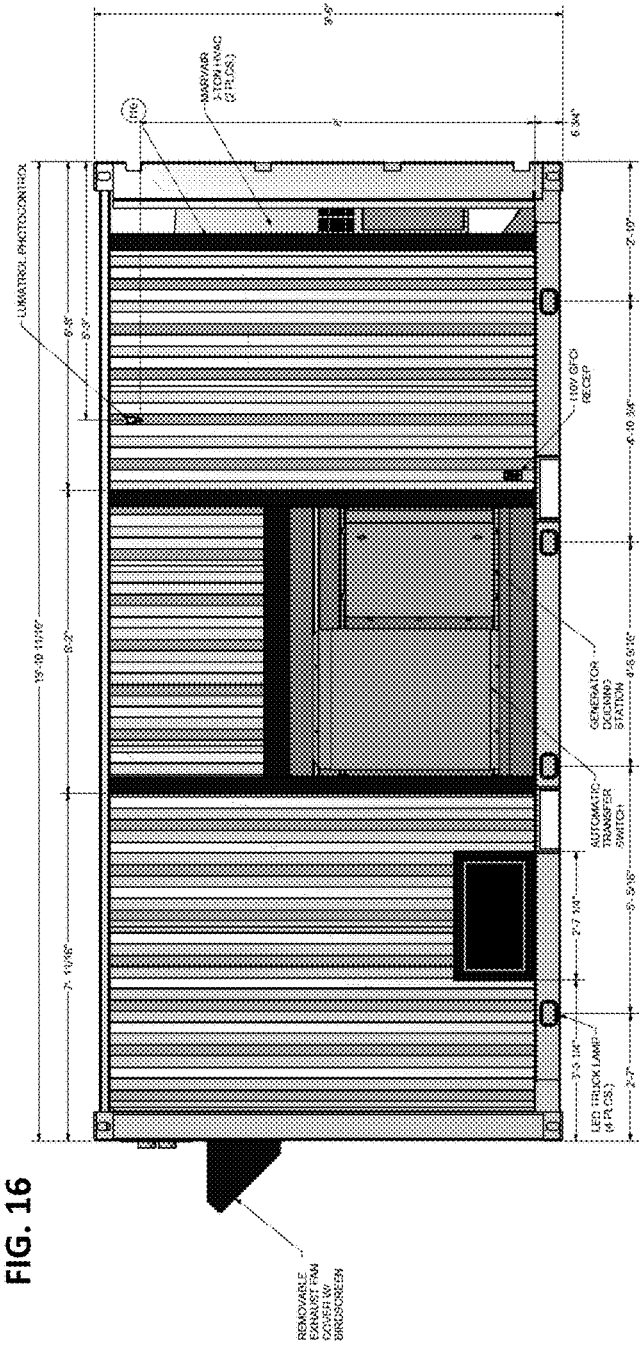
Figure 17:
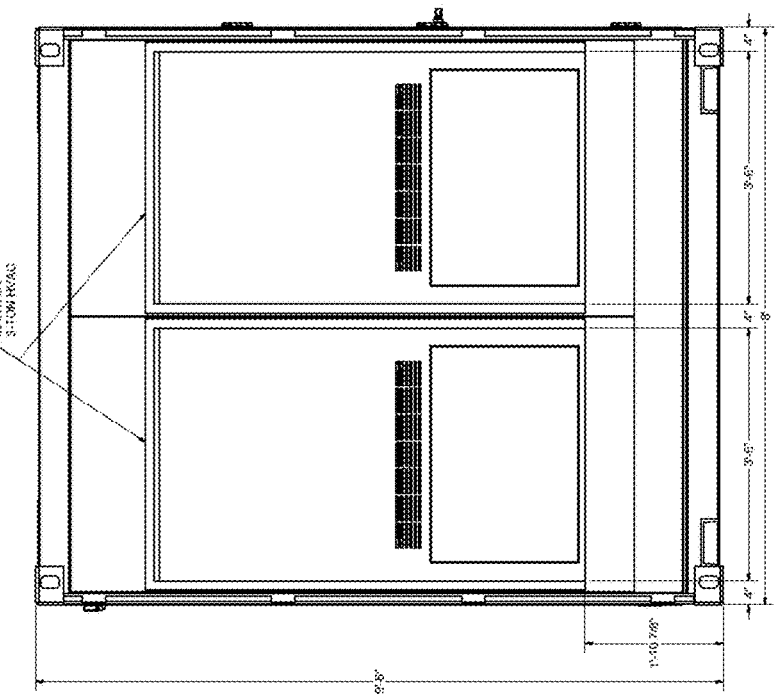
Figure 18:
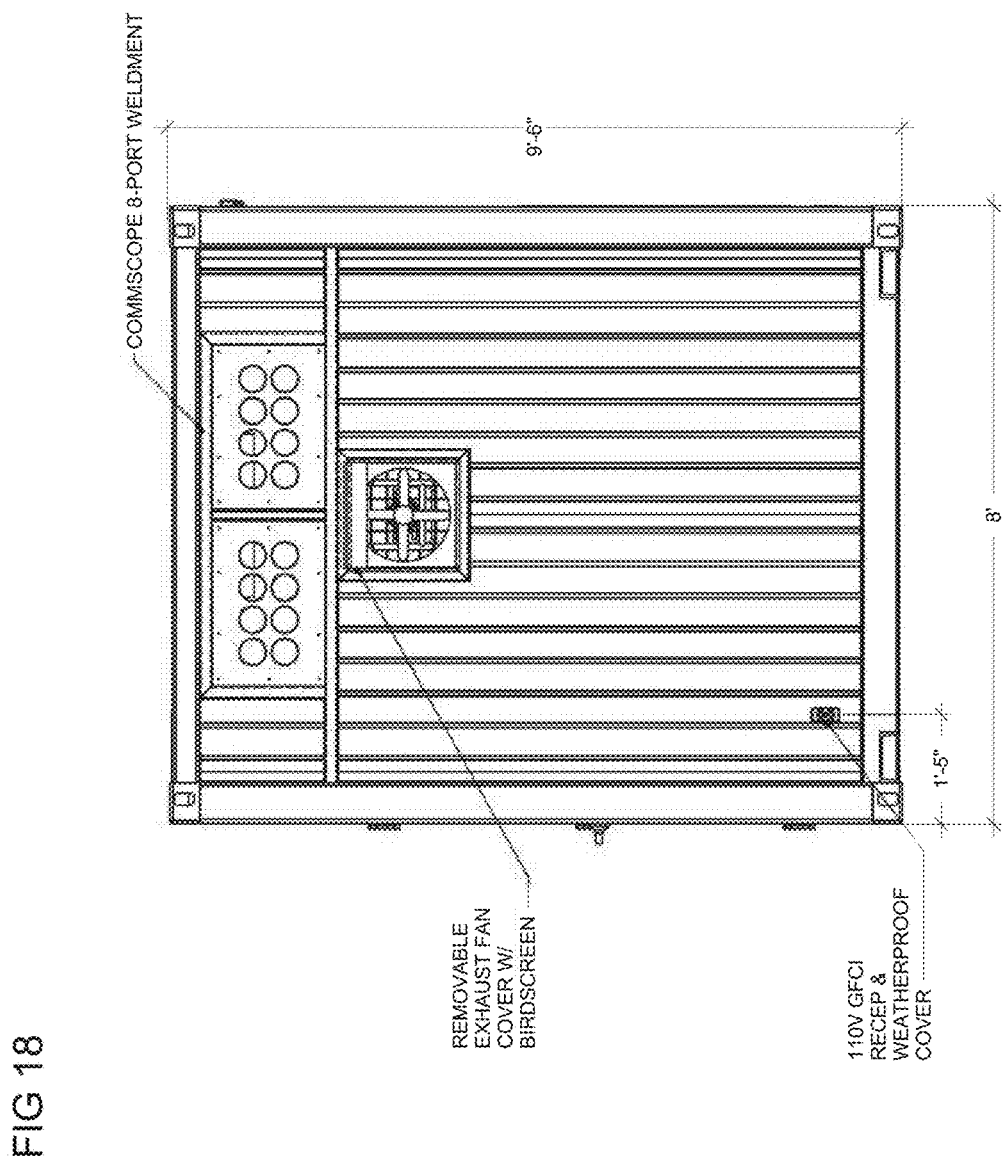

The base ballast includes a substantially rectangular frame 120 with outriggers 122 sliding in and out of the bottom of the base ballast frame 120. Each outrigger 122 has extended arms 126 that can provide additional securing cables to the pod. At the top of each corner of the frame 120 is a male connector 124 that securely attaches the frame 120 to the pod of FIG. 1. For additional weight, sand, cement, rock, or other objects can be embedded inside the frame 120 to hold the pod to the ground. FIG. 10 shows an exemplary top view of the base ballast of FIG. 9. FIG. 11 shows an exemplary mast side and HVAC side view of the ballast of FIG. 9. FIG. 12 shows an exemplary view of the HVAC side view of FIG. 11 with closed and extended outriggers 122. The outriggers 122 slide in and out of support bars in the frame 120. The frame 120 is further supported by cross bars.

Figure 19:
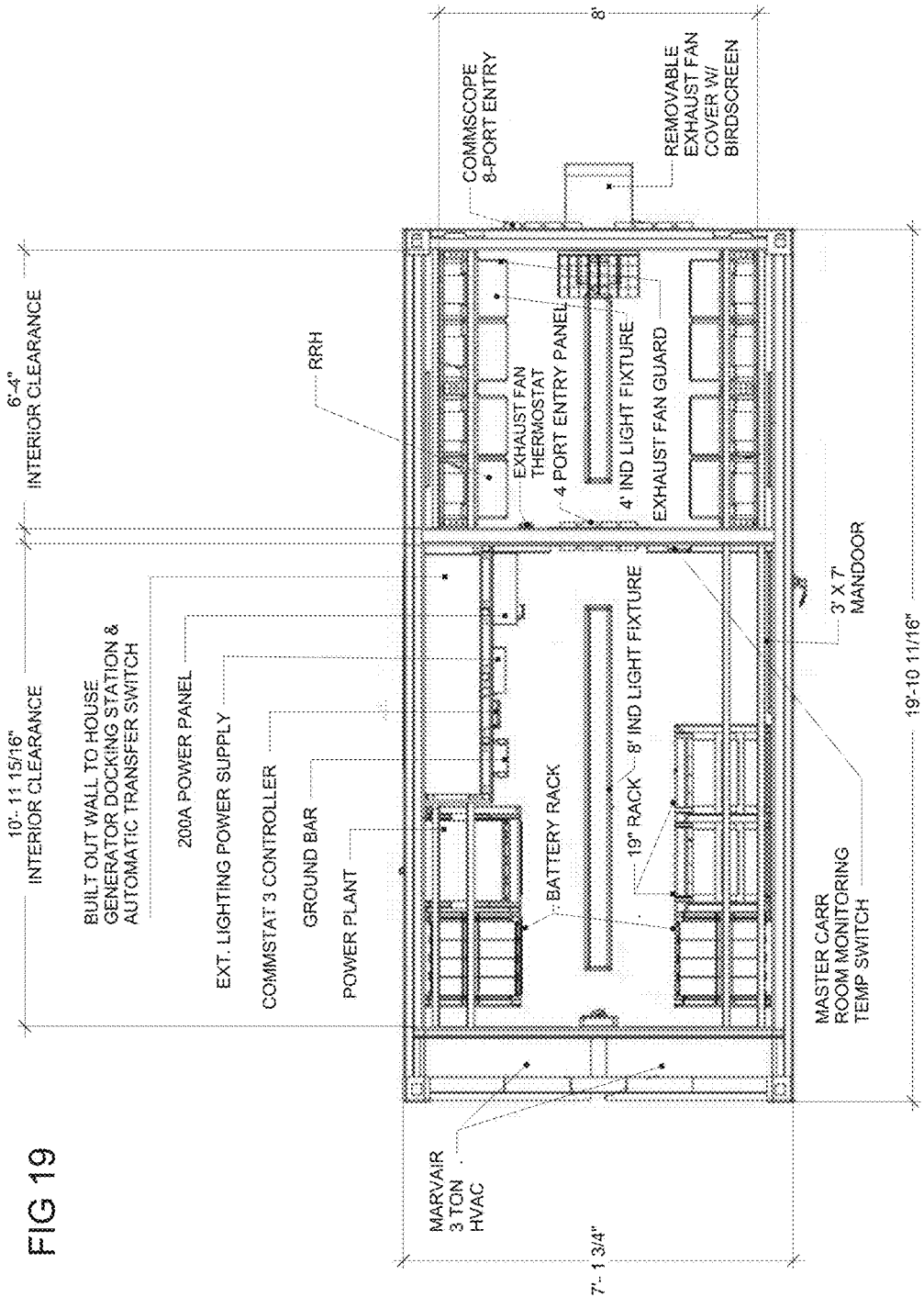
Figure 20:
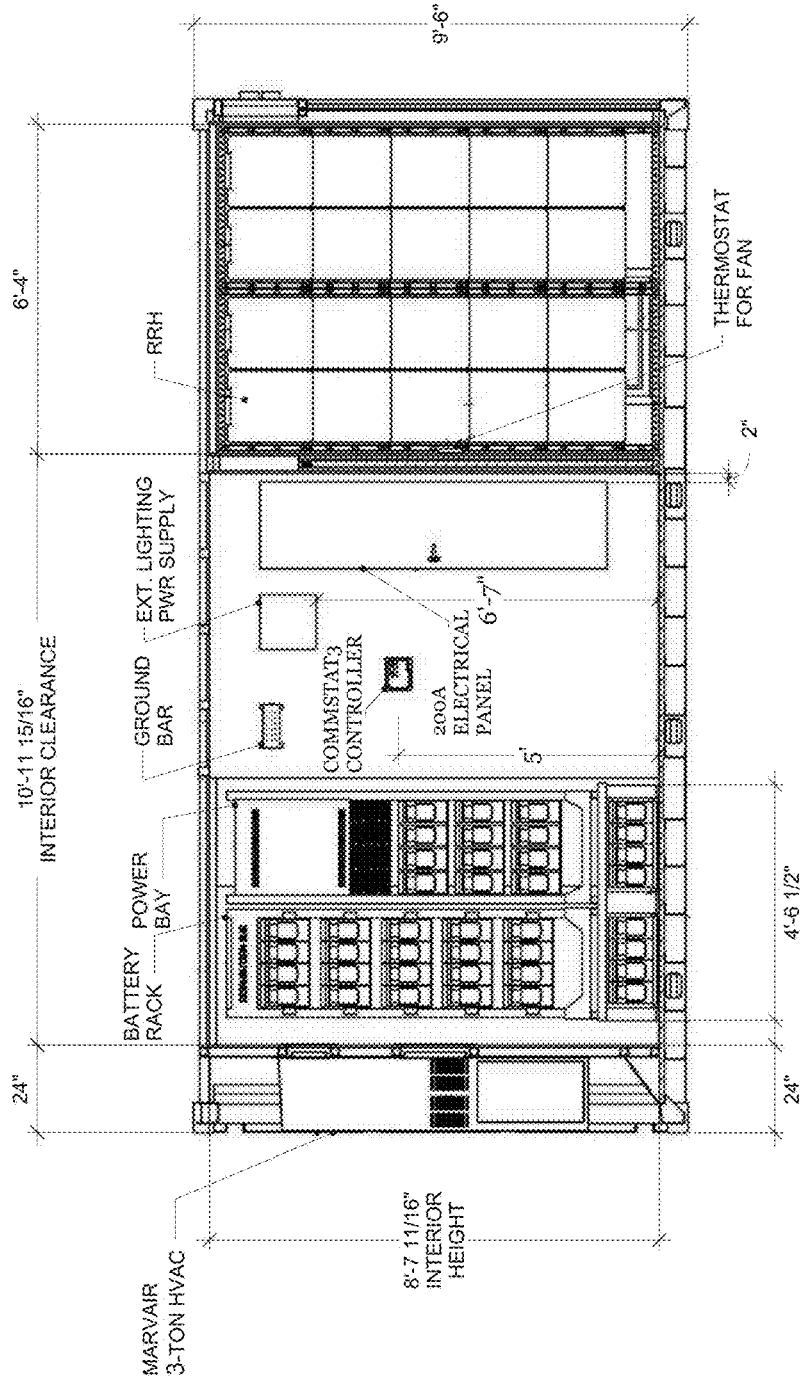
Figure 21:
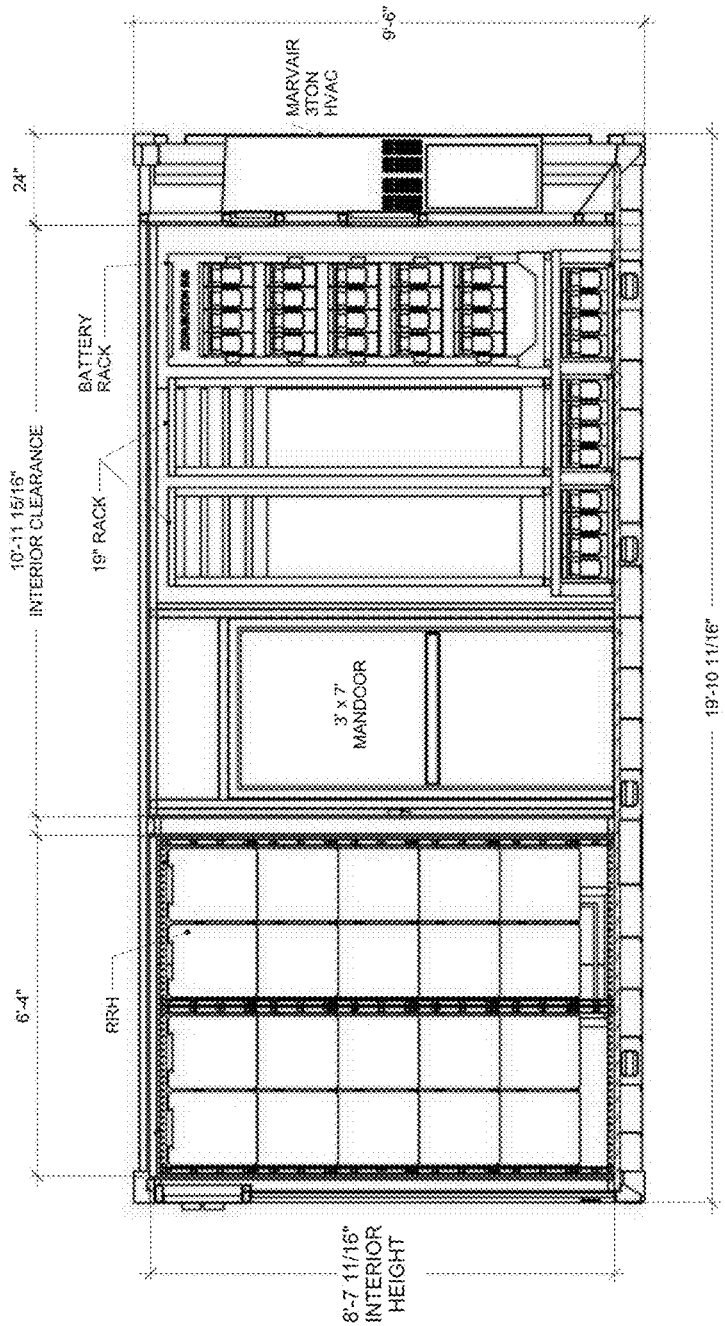
Figure 22:
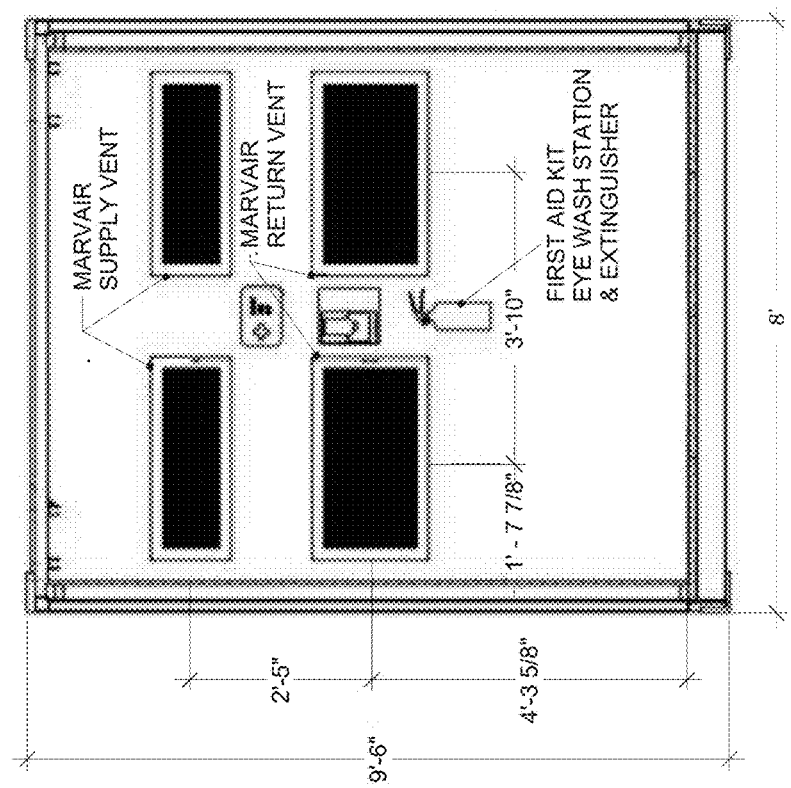
Figure 23:
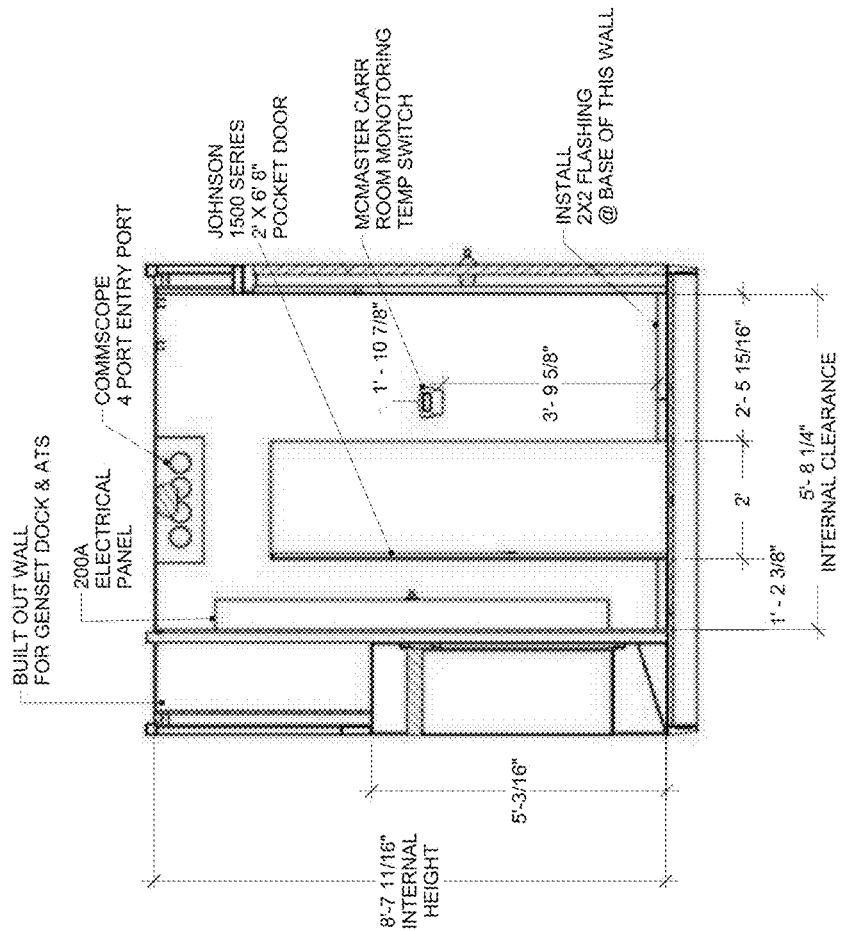
Figure 24:
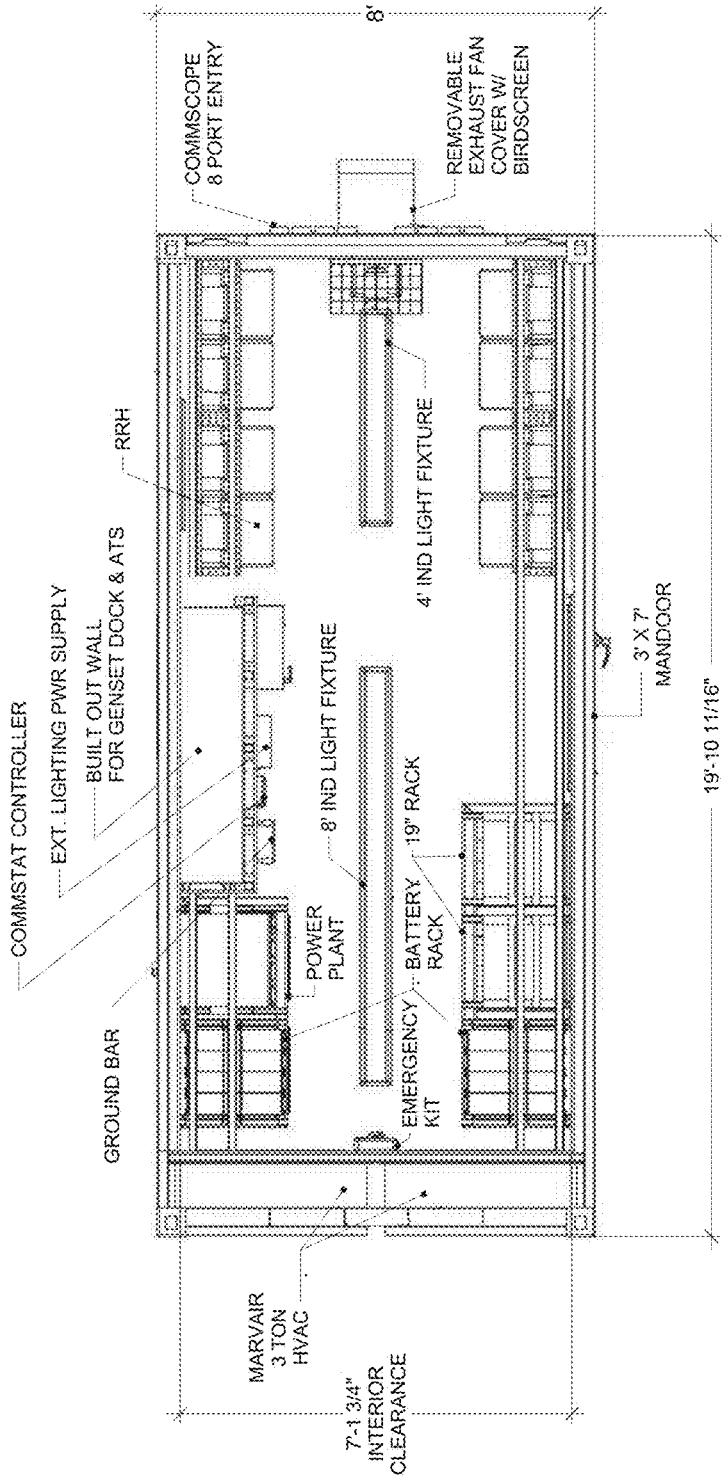
FIGS. 24-25 show exemplary views of a single room embodiment.
Figure 25:
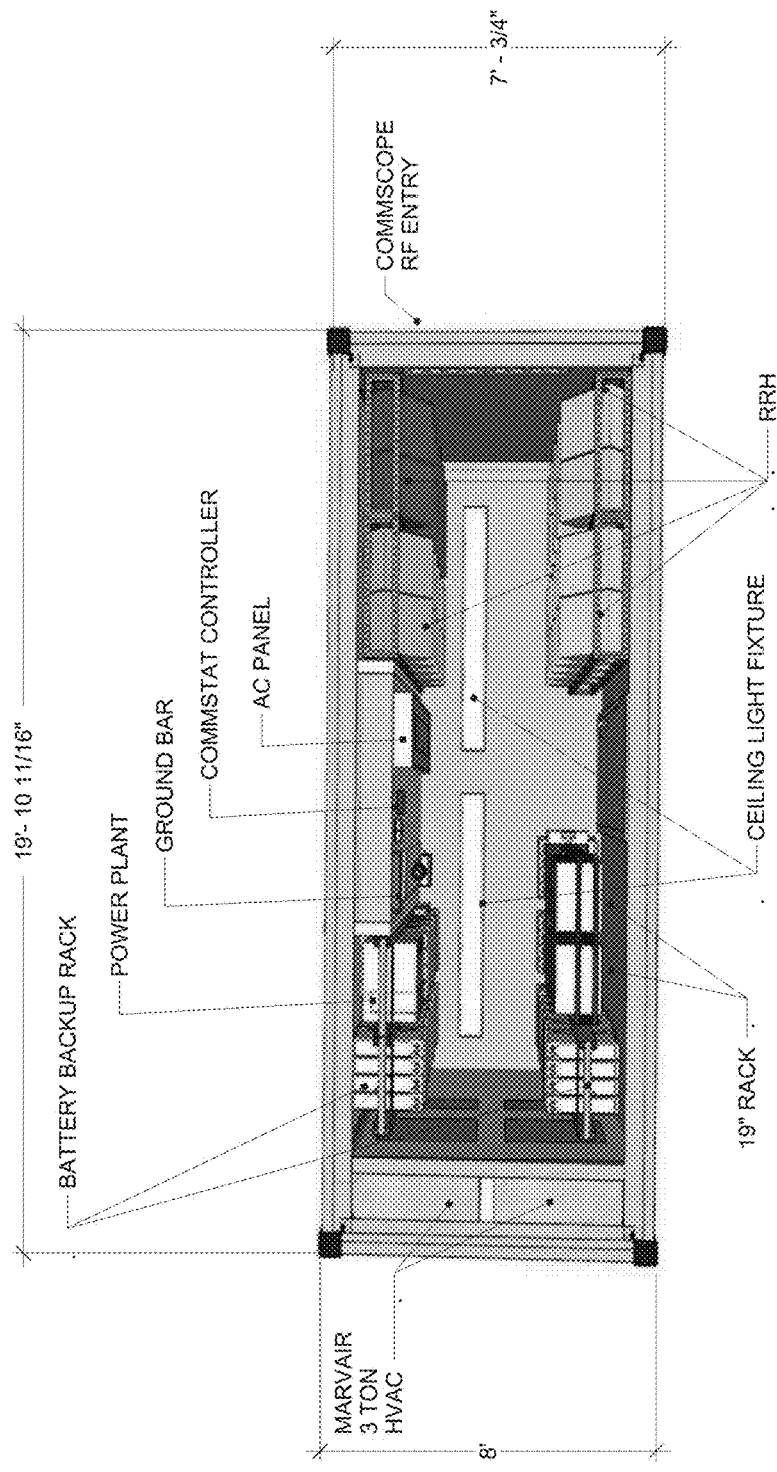
Figure 26:
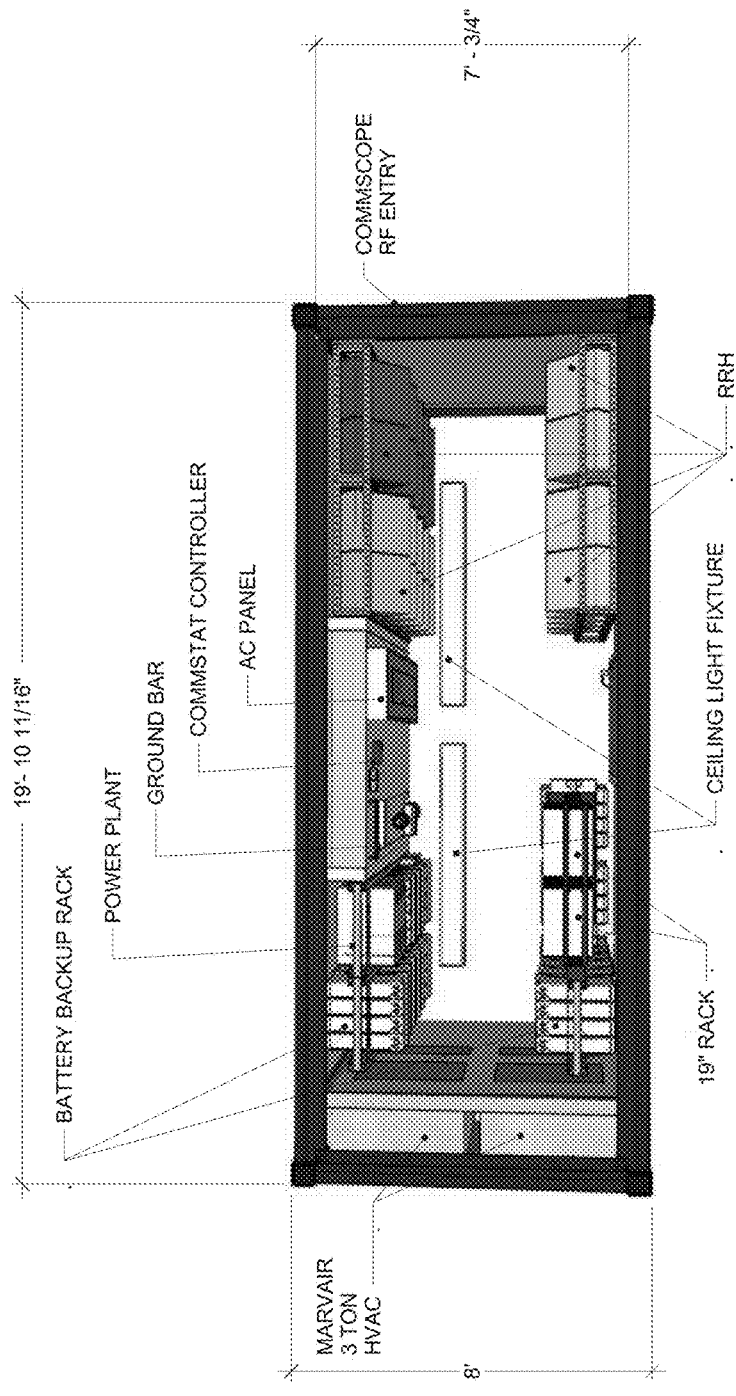
FIGS. 26-29 show an exemplary green camouflaged pod for placement near nature.

Next, the modular aspects of the pod in accordance with the preferred embodiment are detailed. FIGS. 13-23 show an exemplary views of a split room embodiment of a pod. A pocket door (or a small door) is provided to allow access into the split room. While small, as shown in FIG. 19-20, the split room can contain all amenities of the pod of FIG. 1. For larger requirements, FIGS. 24-25 show exemplary views of a single room embodiment. FIG. 25 shows that the single room embodiment can also have the same equipment as in the pod of FIG. 1.

Figure 27:
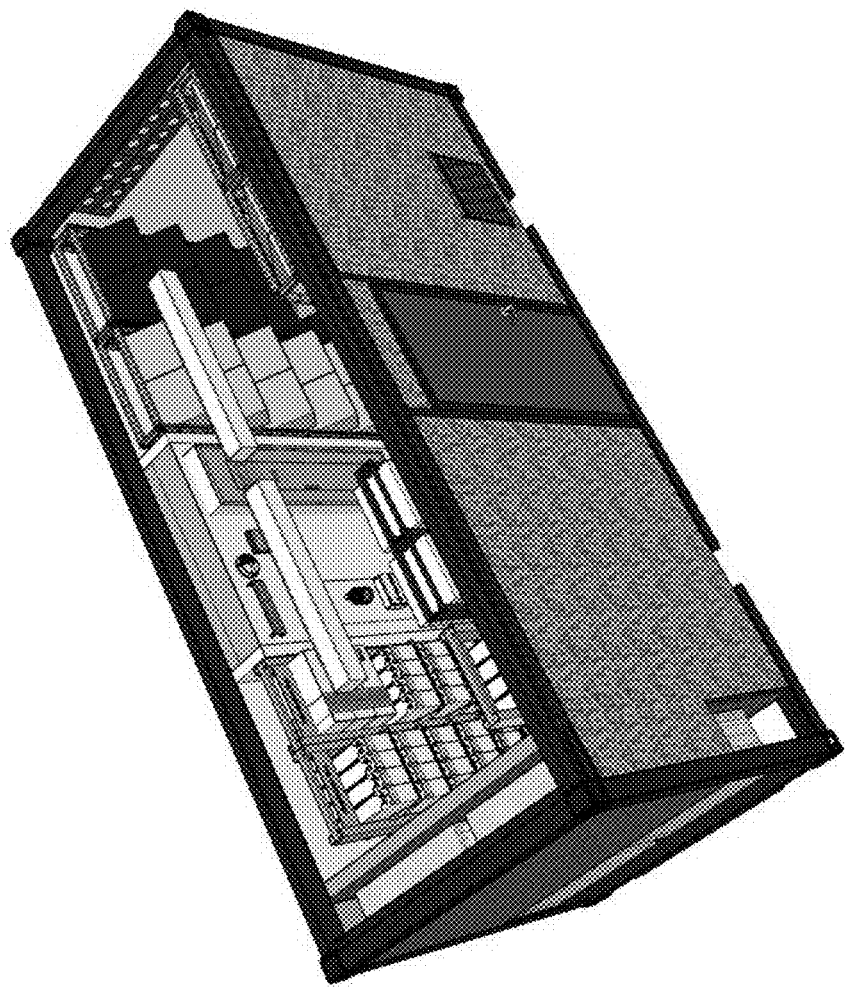
Figure 28:
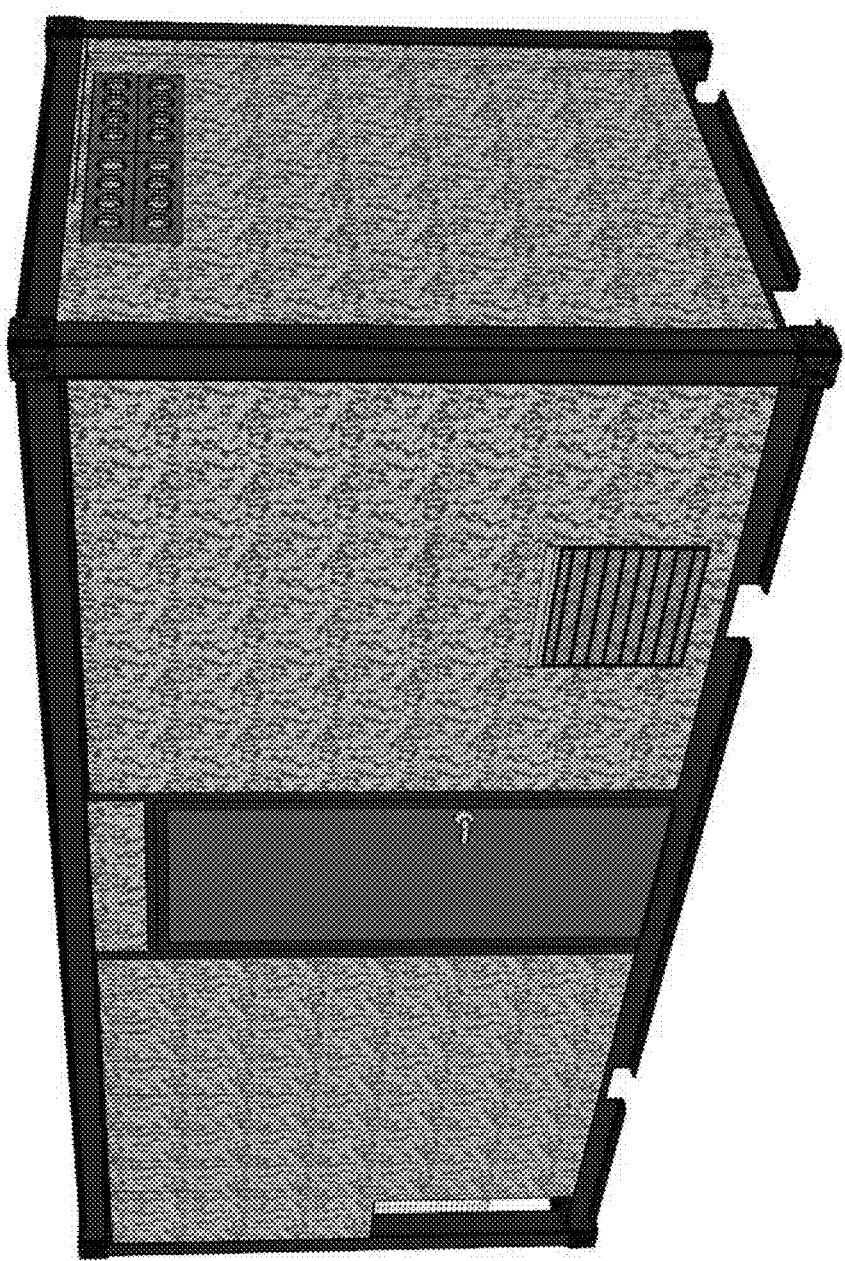
Figure 29:
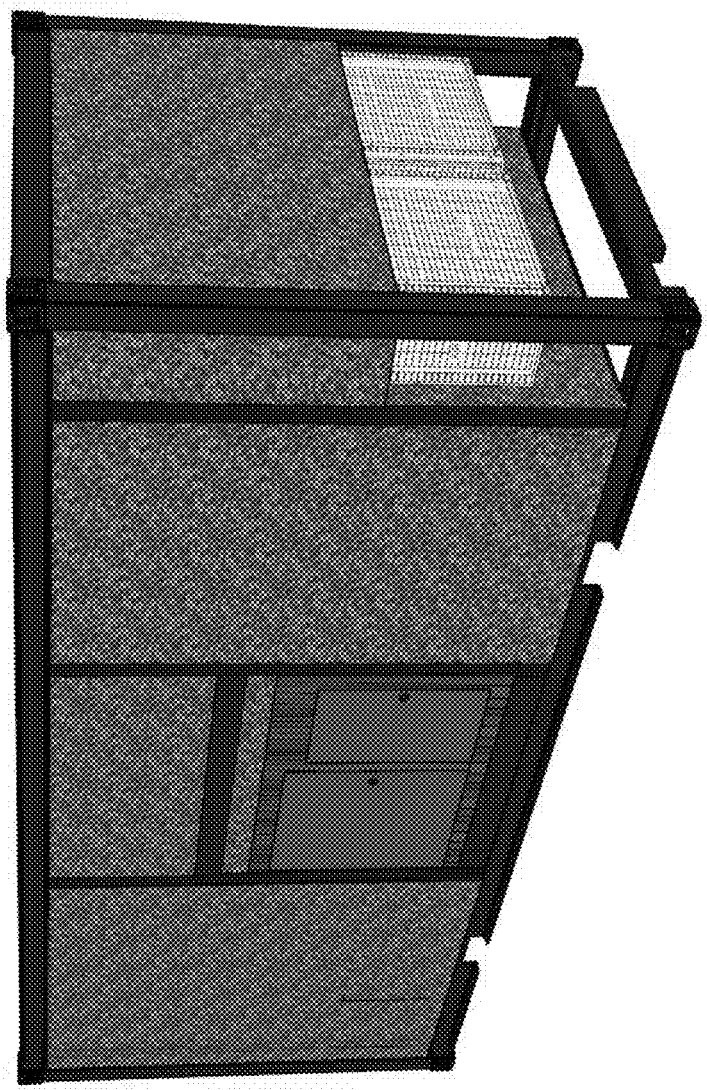
Figure 30:
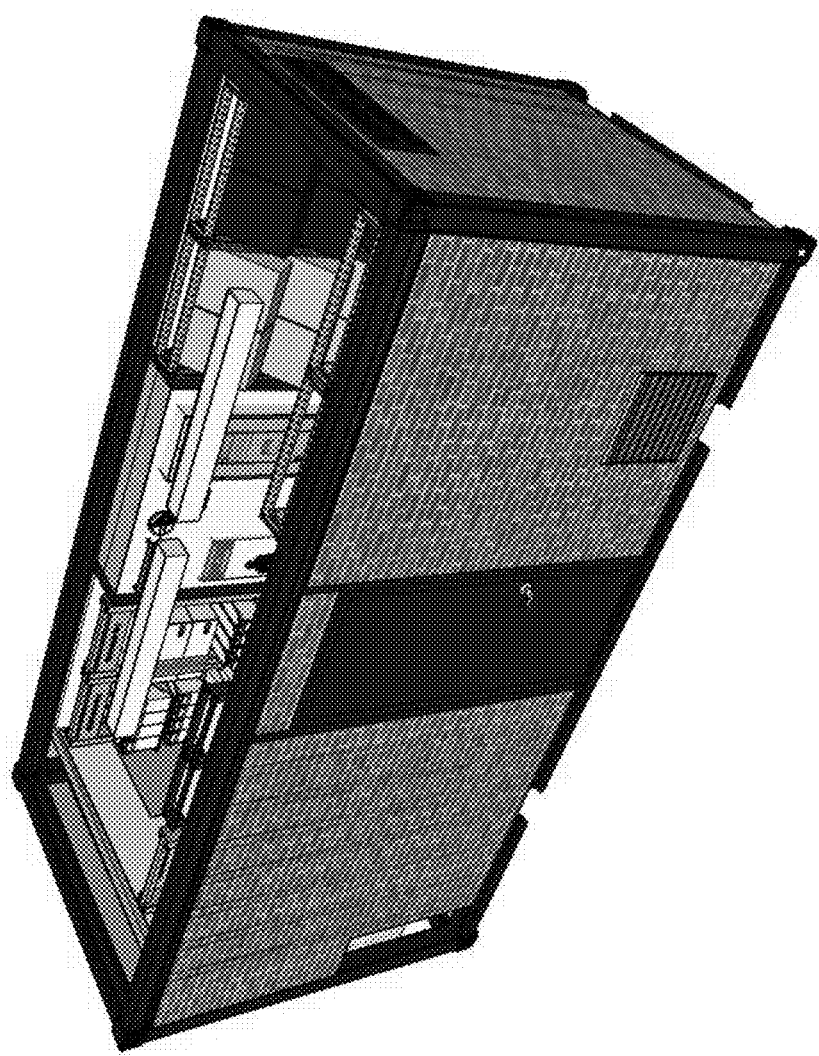
FIGS. 30-36 show an exemplary brick camouflaged pod for placement near homes or brick buildings.
Figure 31:
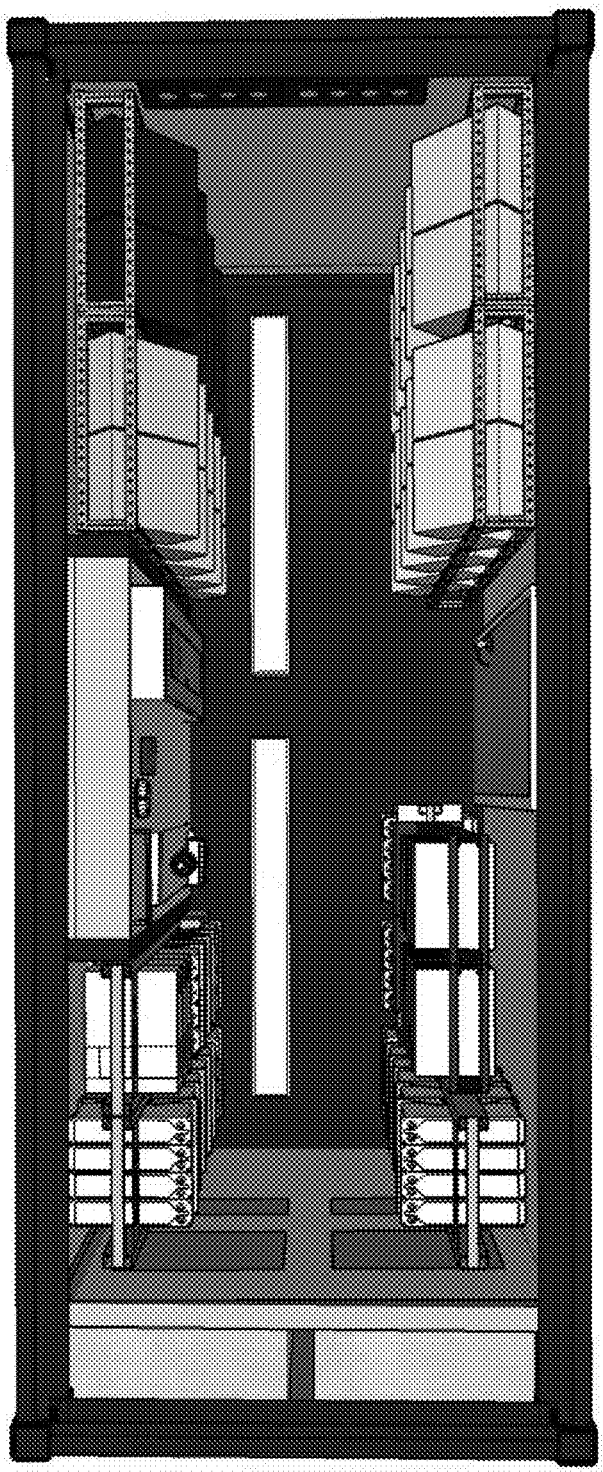
Figure 32:
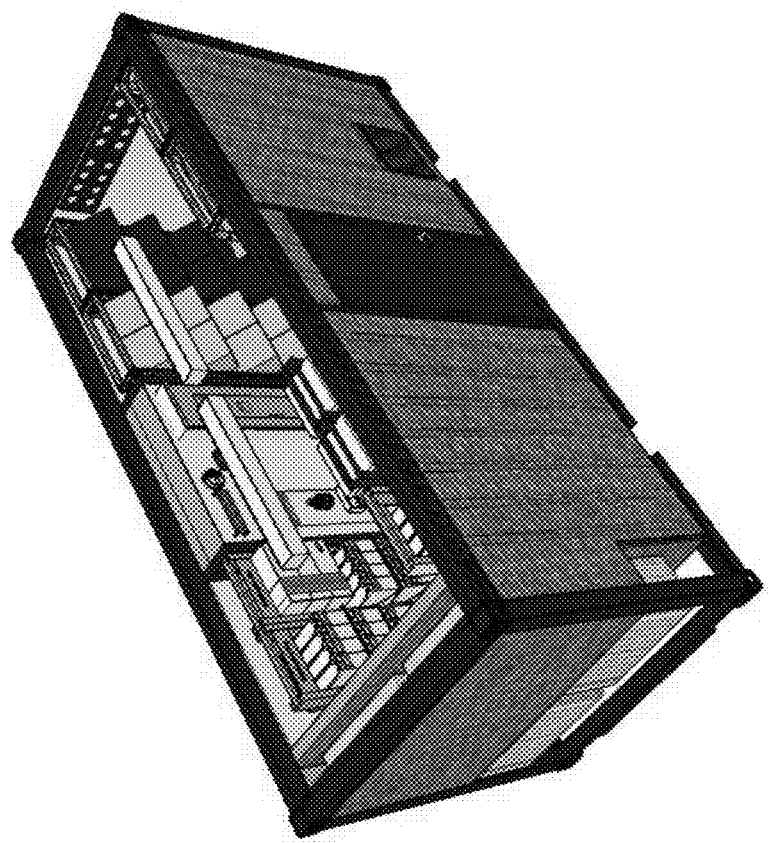
Figure 33:
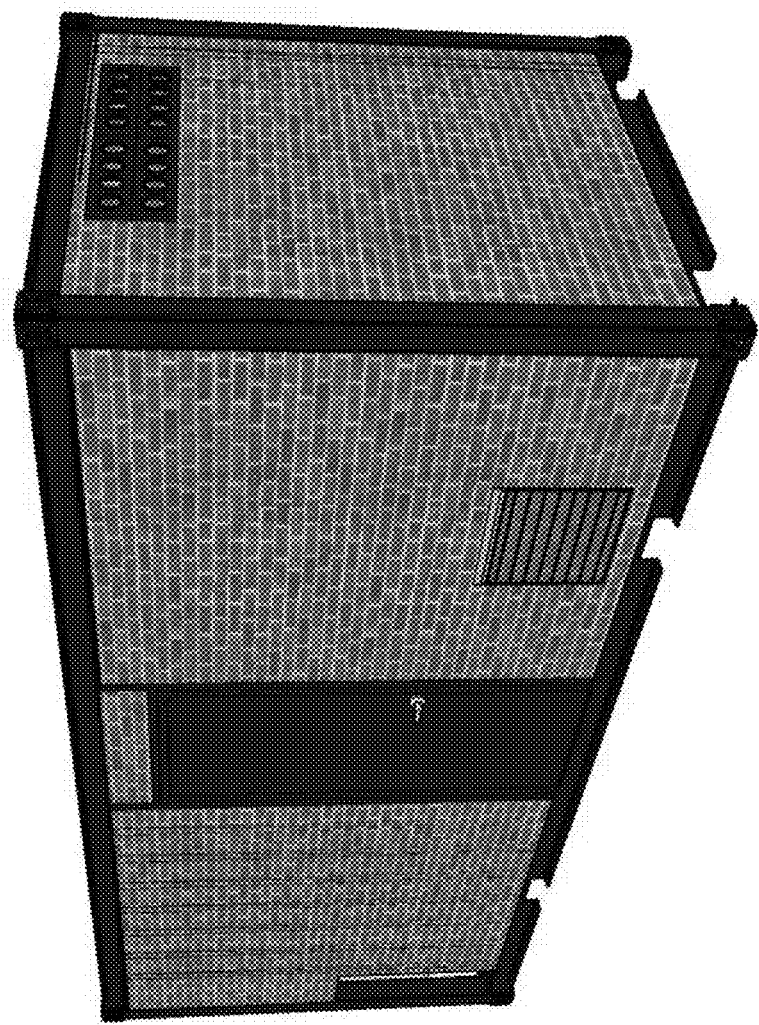
Figure 34:
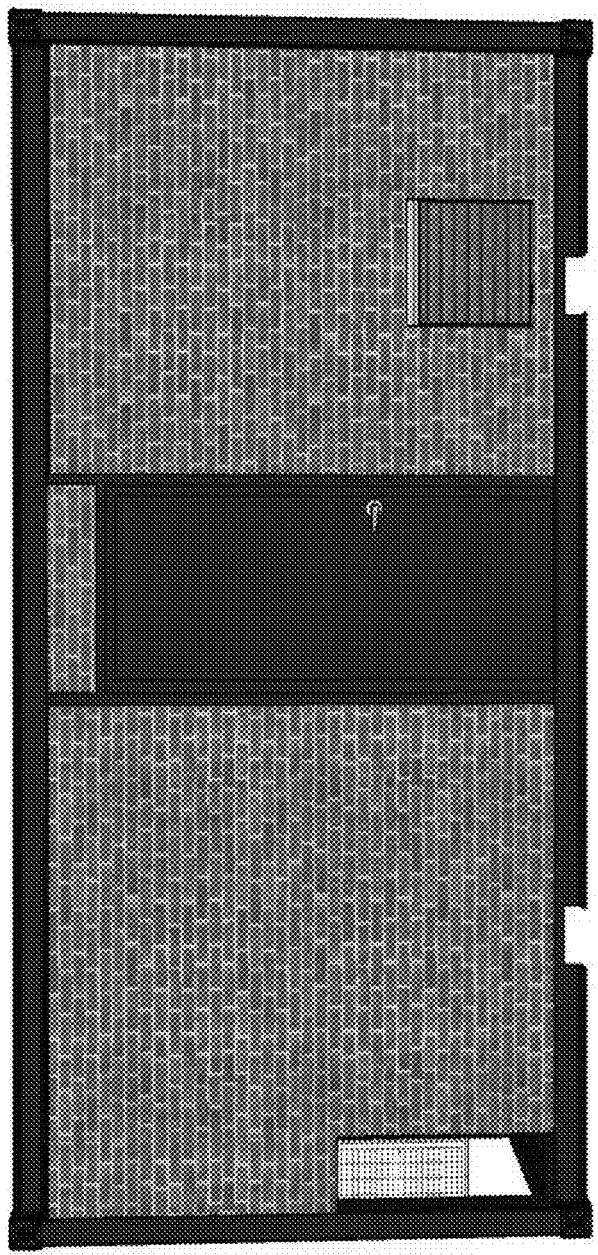
Figure 35:
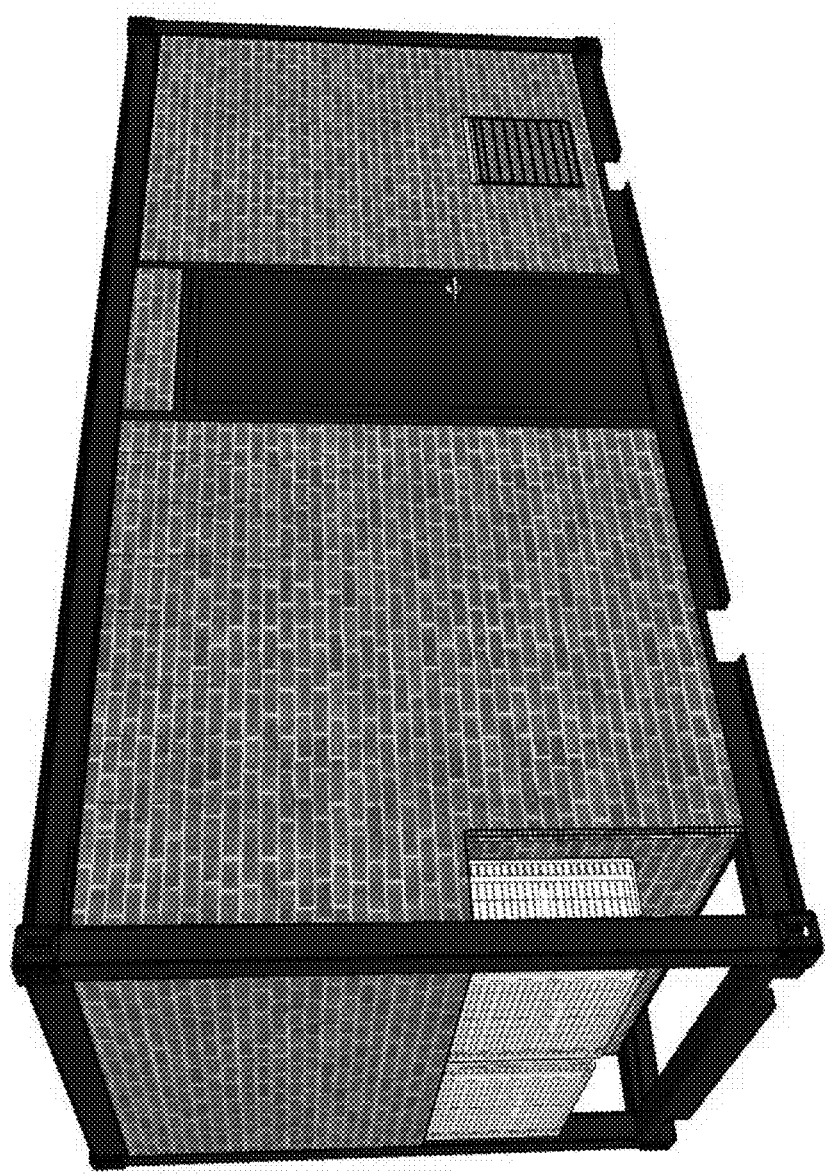
Figure 36:
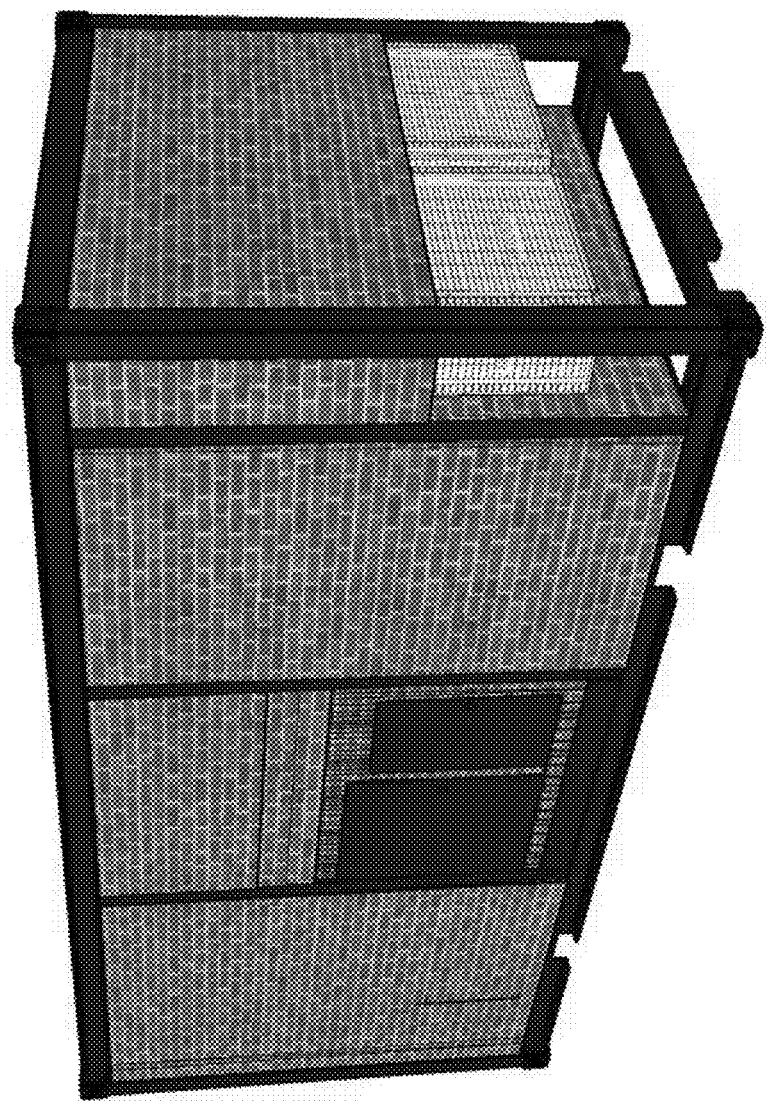
Figure 37:
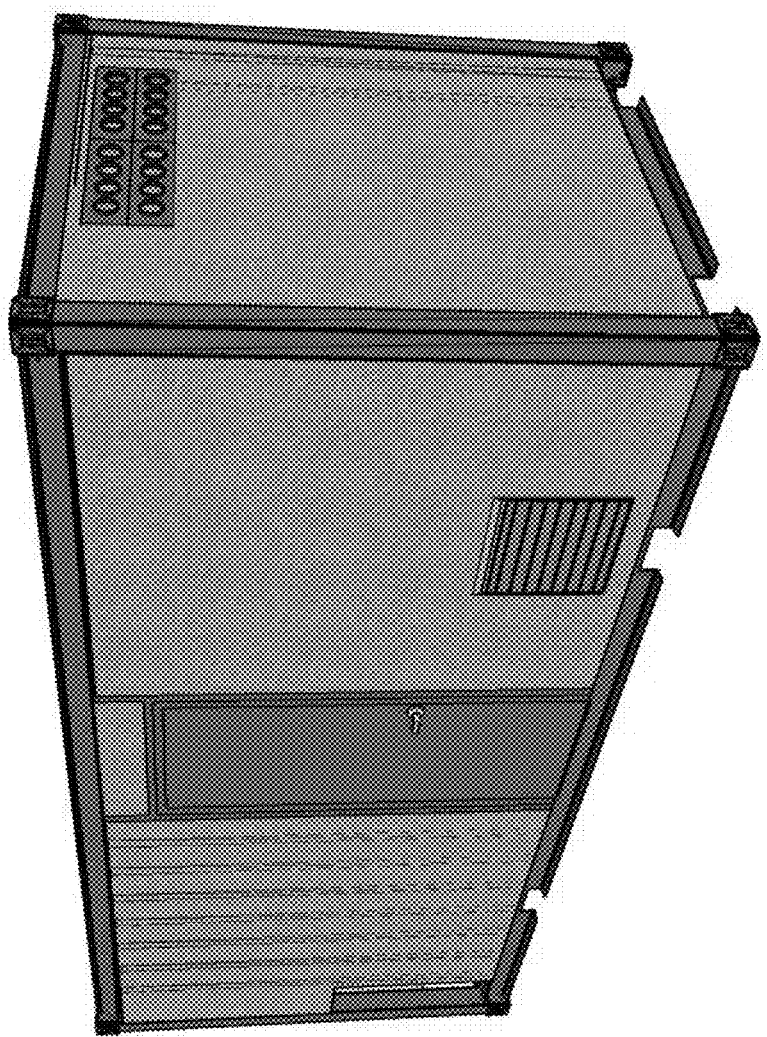
FIGS. 37-42 show an exemplary sand camouflaged pod for placement near sandy locations.
Figure 38:
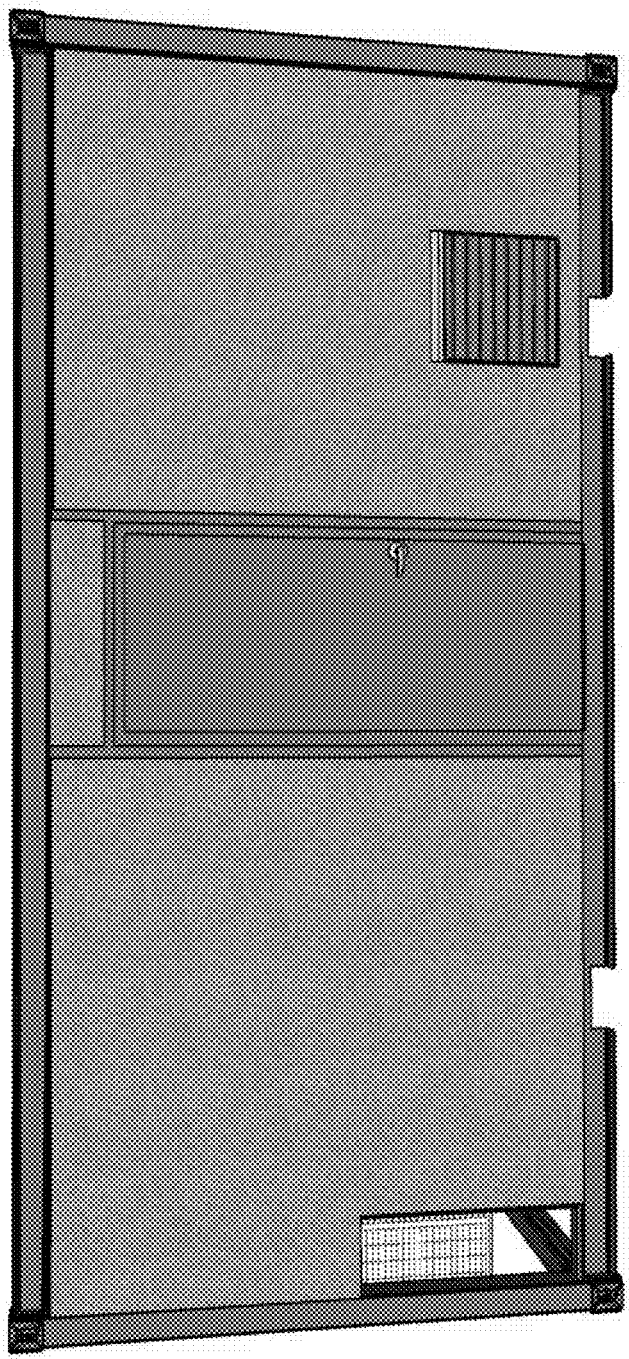
Figure 39:
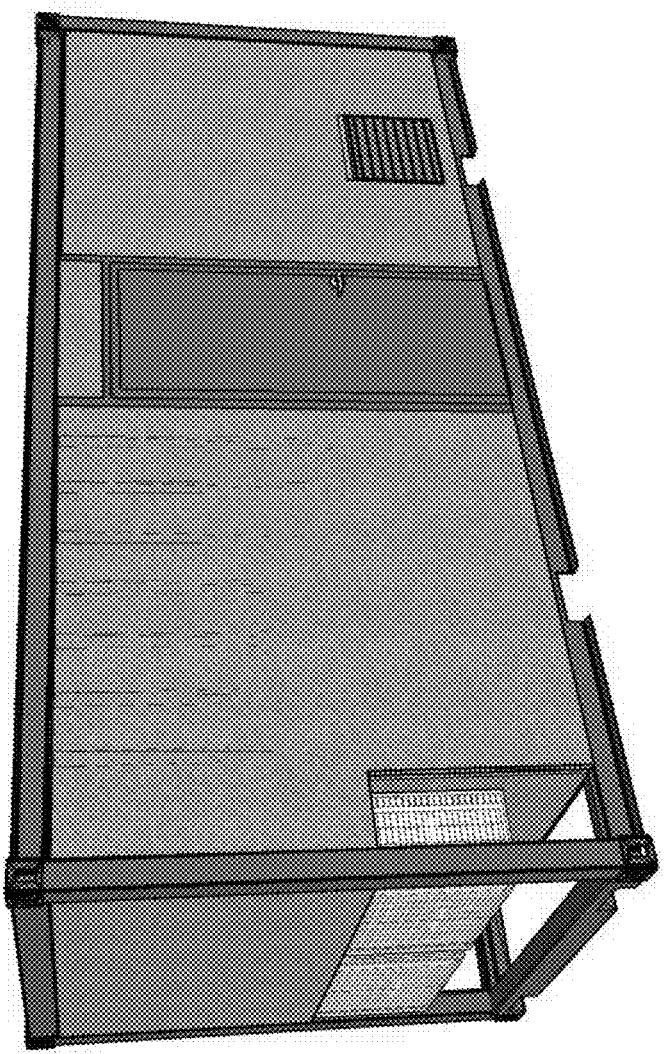
Figure 40:
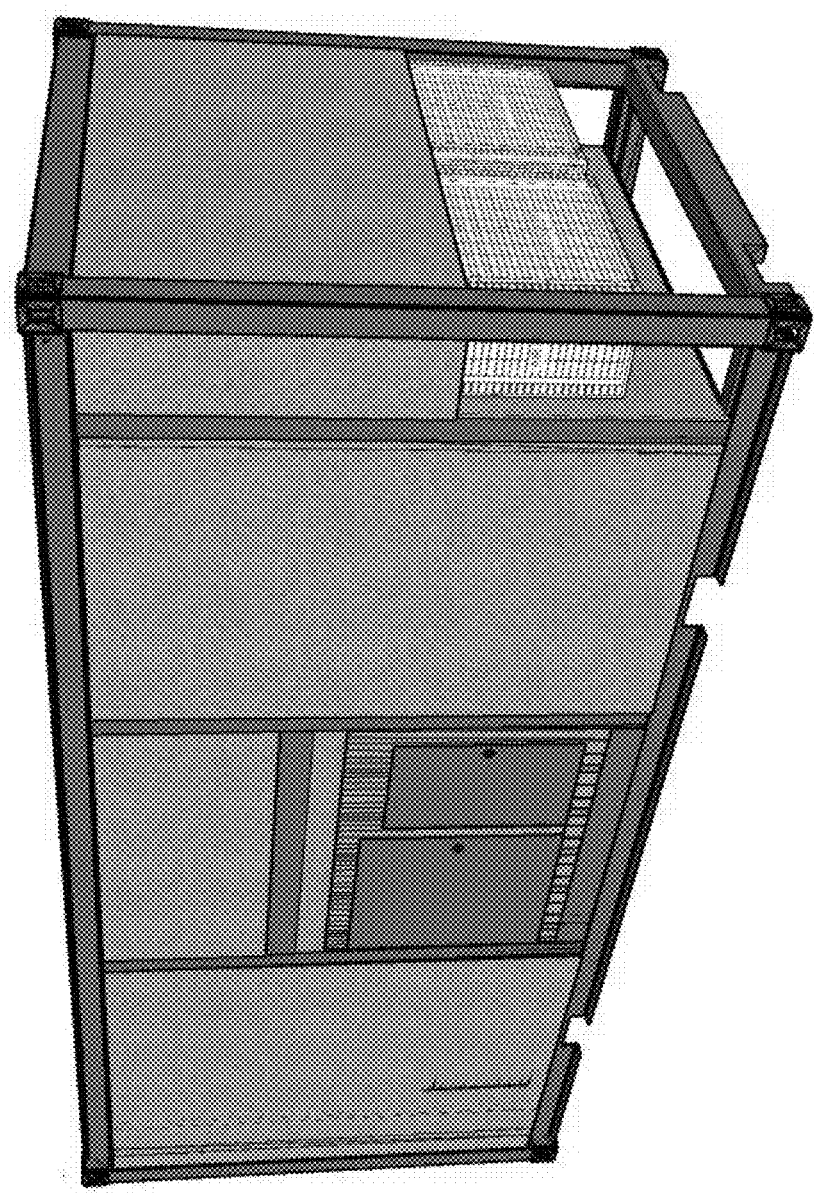
Figure 41:
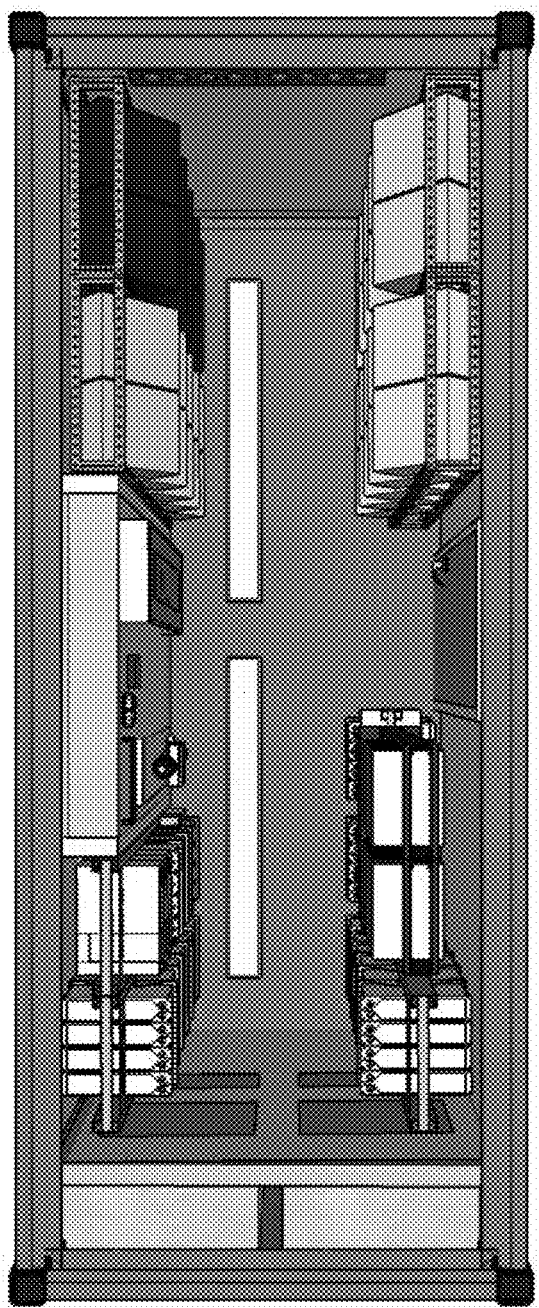
Figure 42:
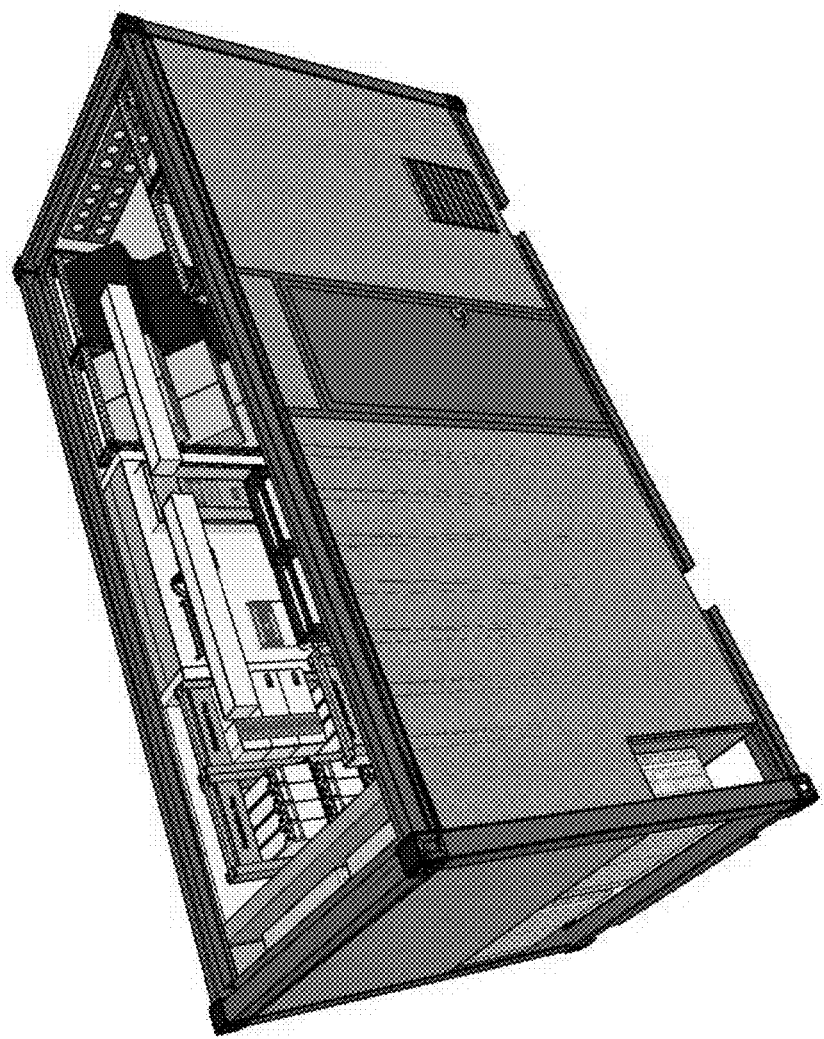

As cell towers have run into esthetic objections from residents, various embodiments of the pods can be camouflage to better blend into the environment. For example, FIGS. 27-29 show an exemplary green camouflaged pod for placement near nature. FIGS. 30-36 show an exemplary brick camouflaged pod for placement near homes or brick buildings. FIGS. 37-42 show an exemplary sand camouflaged pod for placement near sandy locations.

Figure 43:
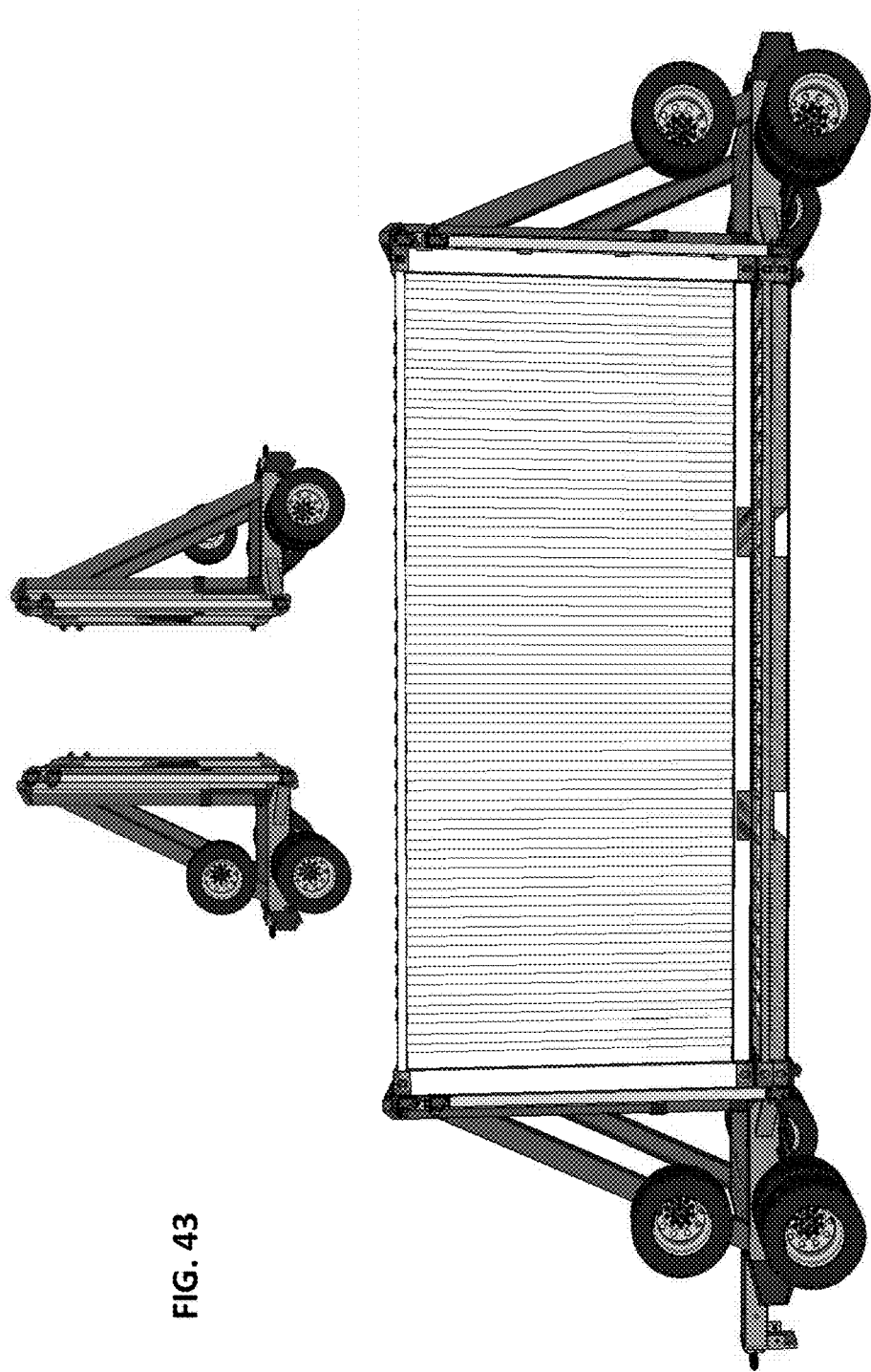
FIG. 43 shows an exemplary transportation system for the pod.

FIG. 43 shows an exemplary transportation system for the pod. The system includes a trailer with a transport bed adapted to receive a shelter having substantially rectangular base with approximate bottom dimensions of a standard International Organization for Standardization (ISO) freight container. The system also has first and second wheeled transport assembly positioned on the trailer, wherein each transport assembly is adapted to connect to each end of the shelter to move the shelter on or off the trailer. Base locking units at each corner of the bed to be secured to a shelter.

Figure 44:
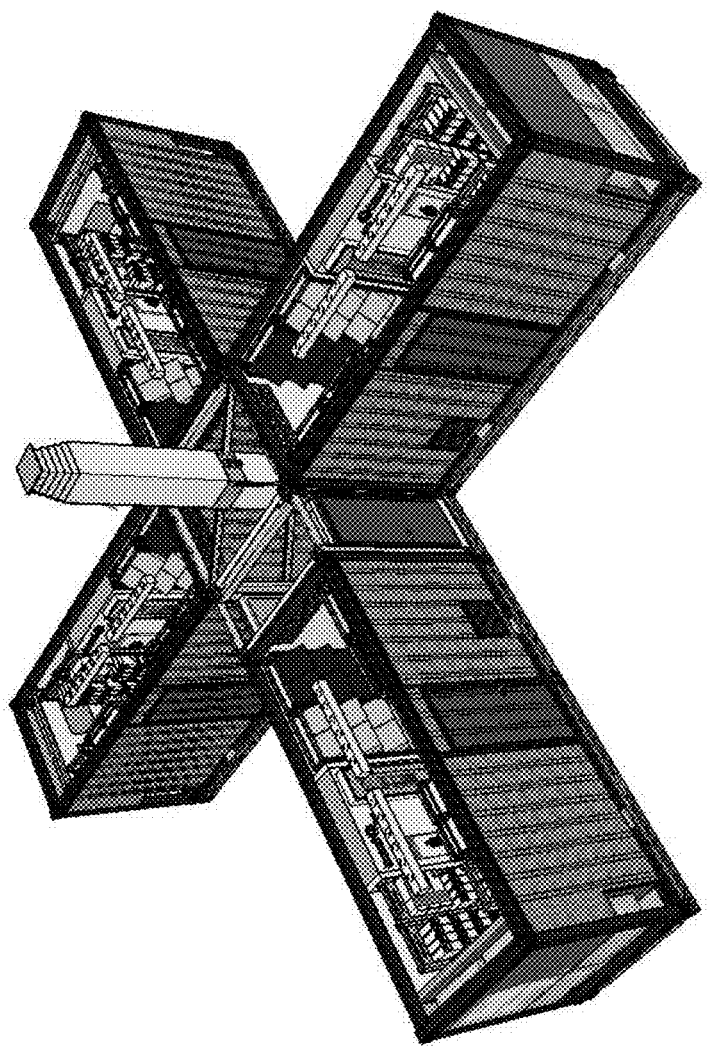
FIGS. 44-45 show an exemplary co-location X-configuration of four pods.
Figure 45:
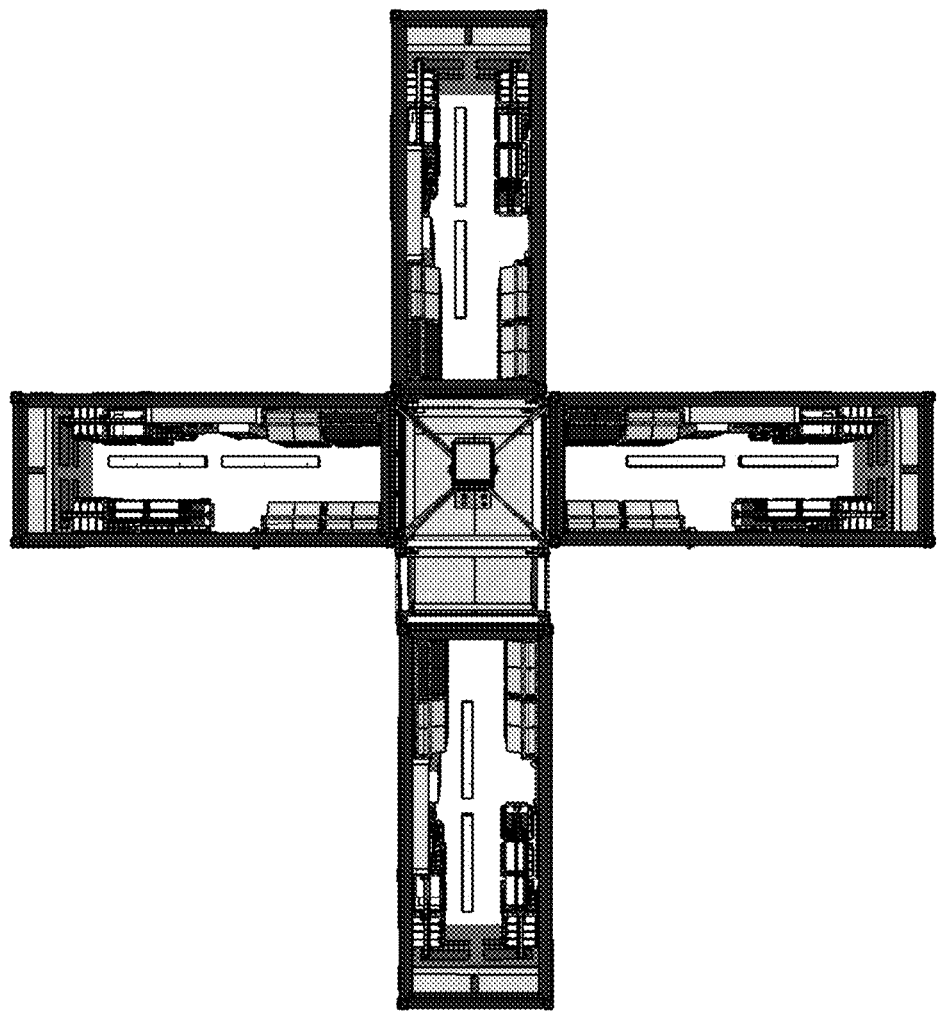
Figure 46:
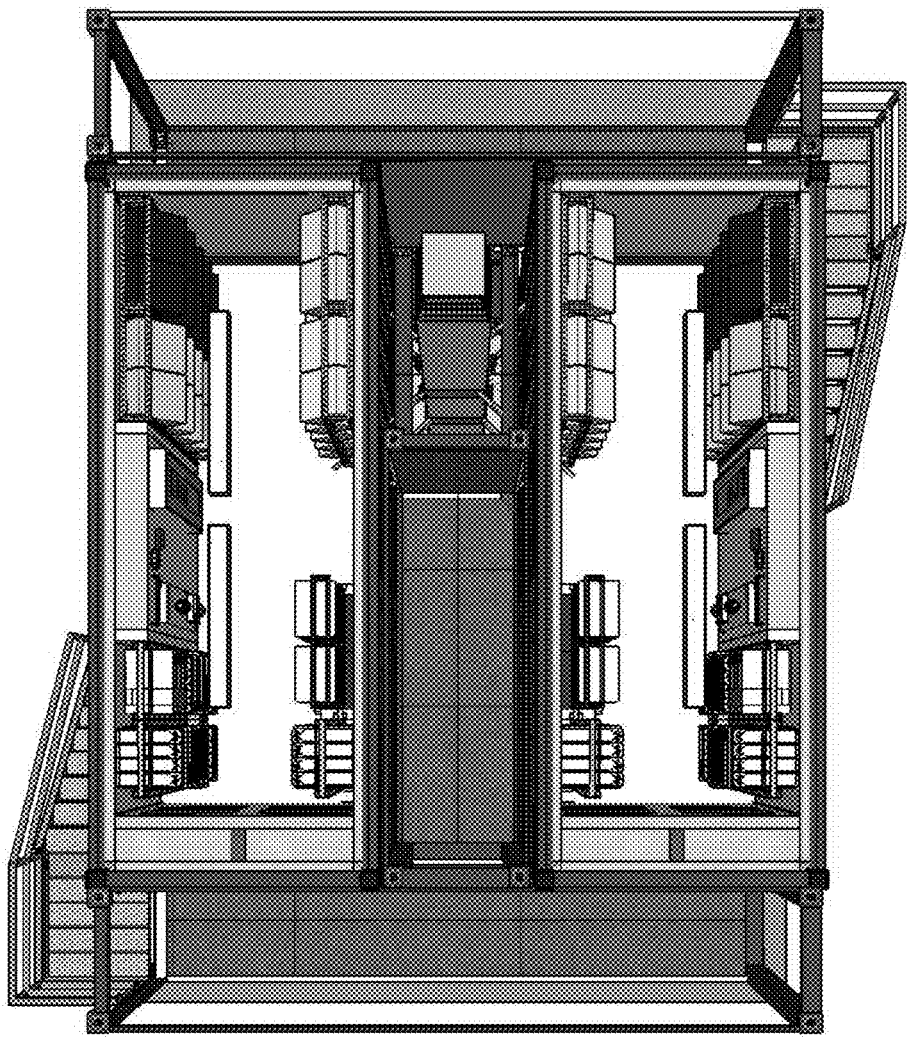
FIGS. 46-48 show an exemplary co-location stack-configuration of four pods.
Figure 47:
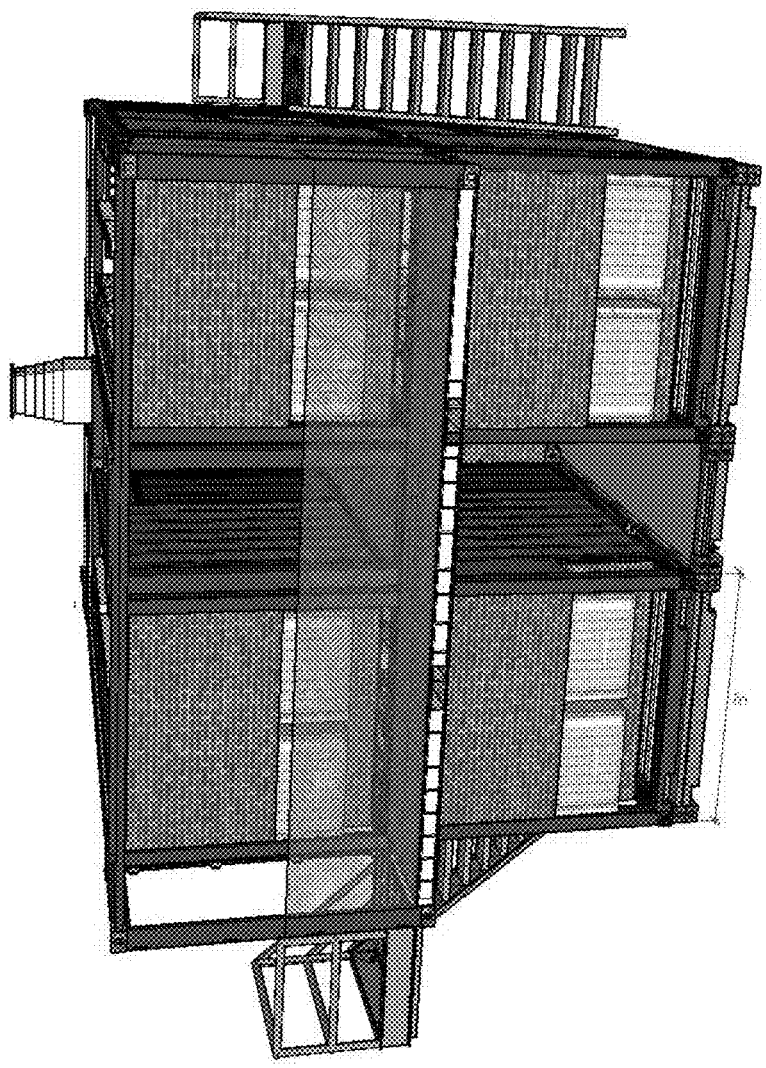
Figure 48:
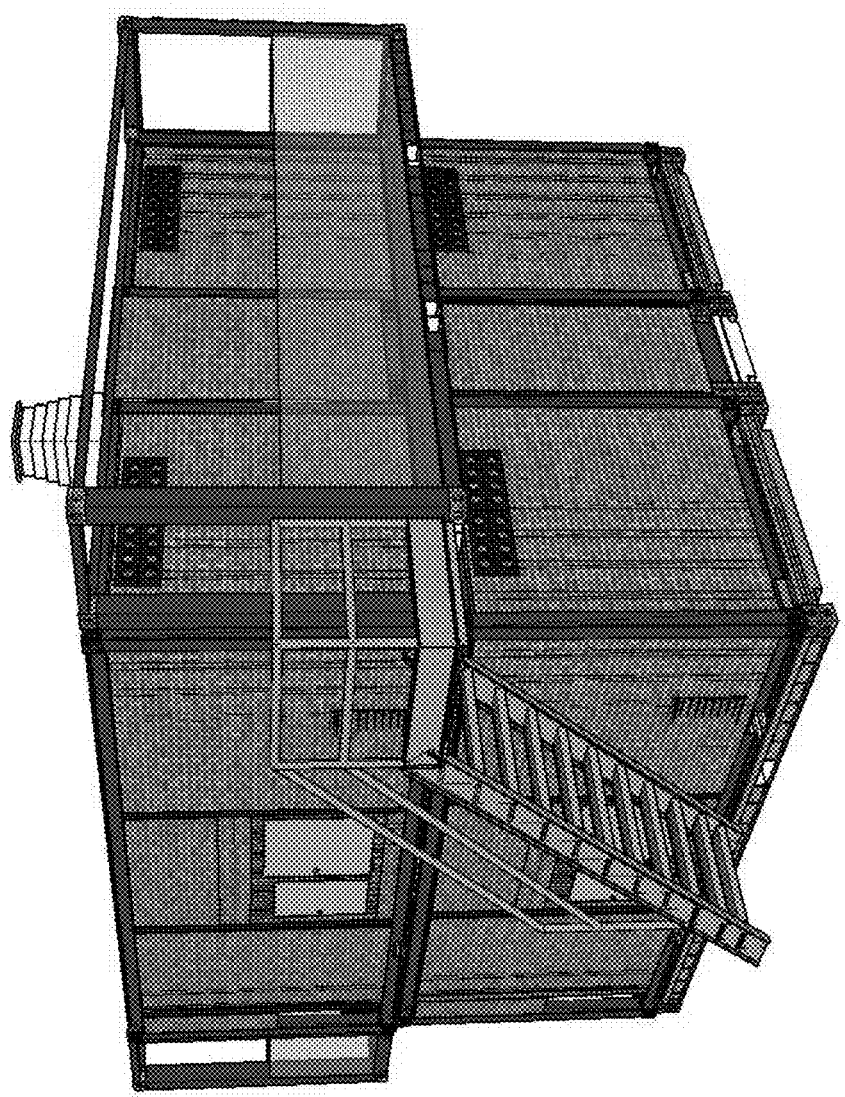
Figure 49:
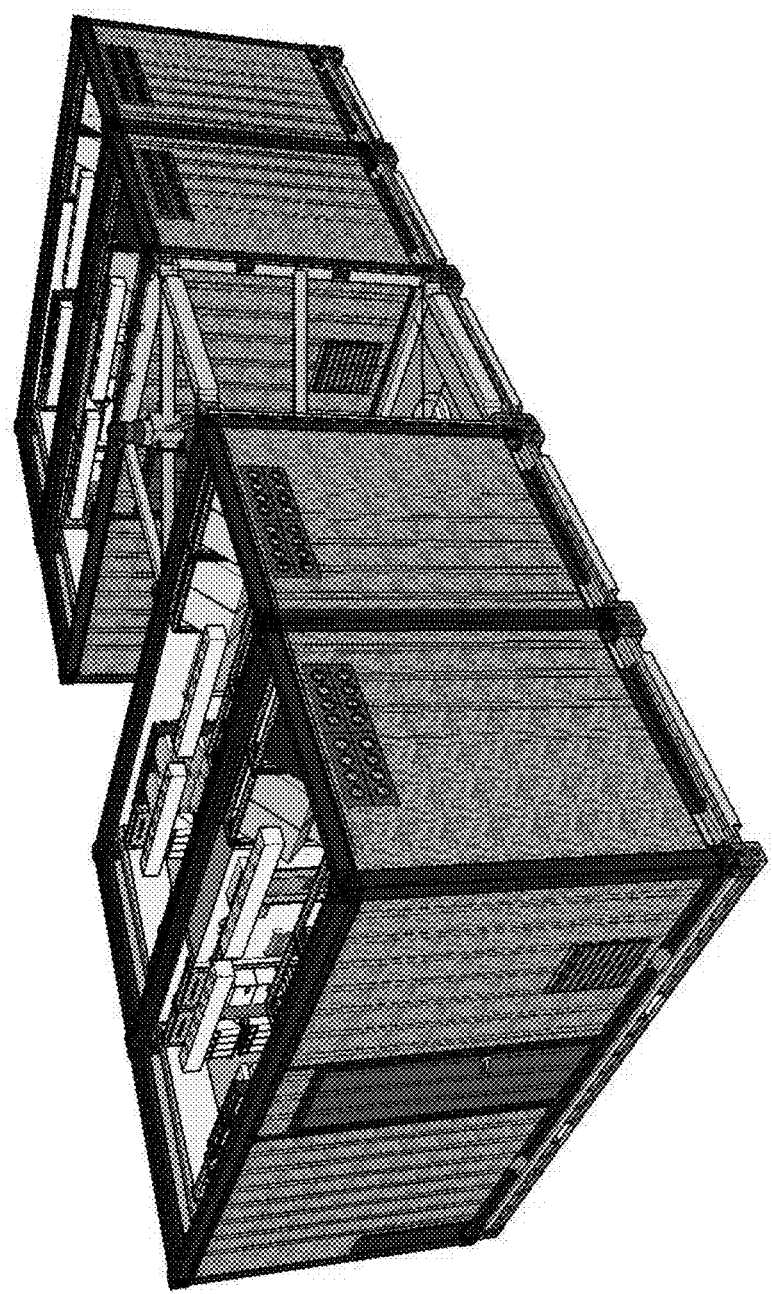
FIGS. 49-52 show an exemplary co-location inline configuration of four pods.
Figure 50:
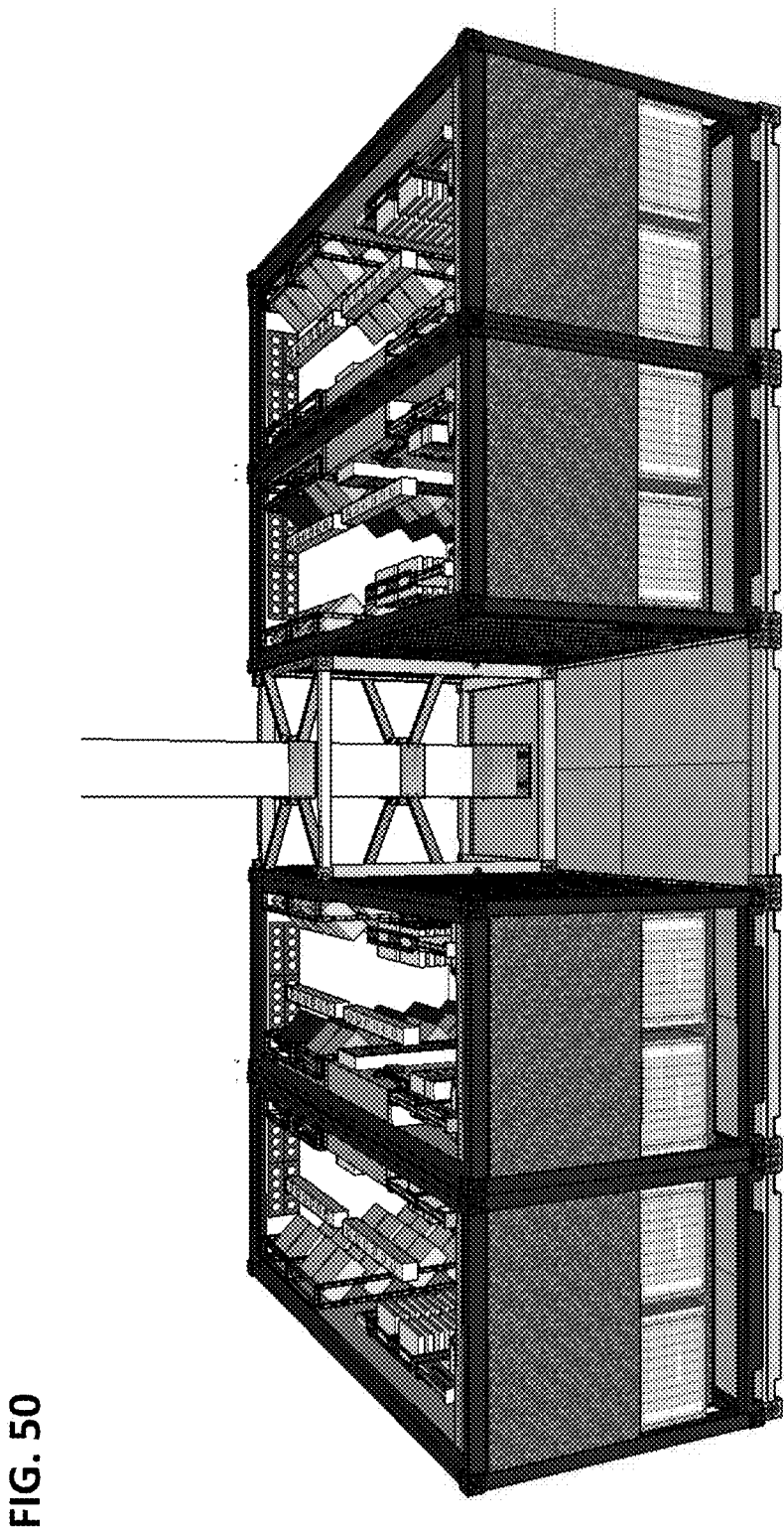
Figure 51:
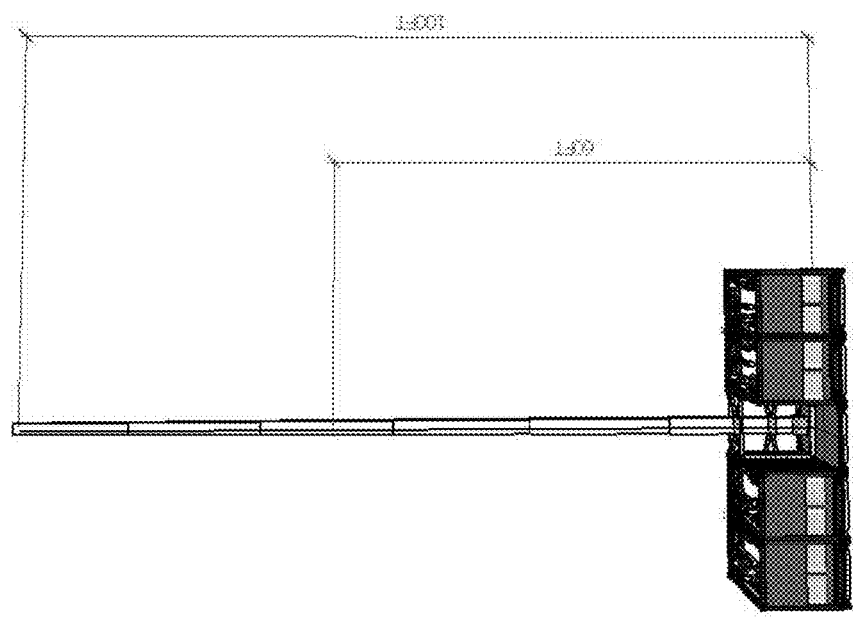
Figure 52:
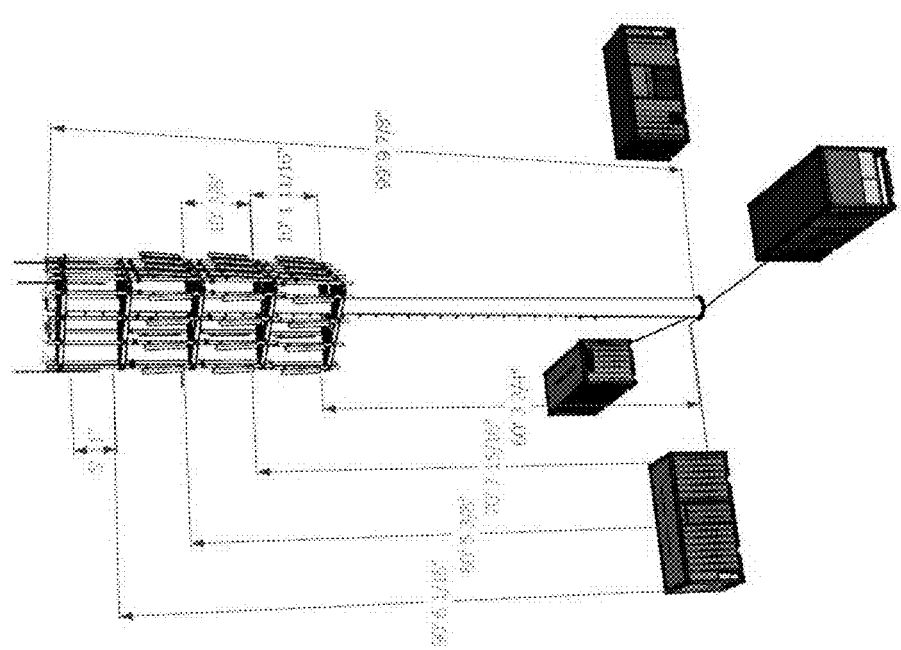

FIGS. 44-45 show an exemplary co-location X-configuration of four pods. In this configuration, the cellular communication system includes a first shelter having pre-configured equipment to communicate with a telecommunication facility, wherein the shelter in combination with one or more additional modular shelters in combination conforms to the approximate dimensions of a standard International Organization for Standardization (ISO) freight container. Additionally, second, third and fourth shelters are connected at one end to an end near the antenna mast, wherein the antenna mast is secured to the first, second, third and fourth shelters, wherein each shelter conforms to the approximate dimensions of the ISO freight container. Each shelter can include:

a door to enter the shelter;
a computer rack to receive computer equipment;
a radio unit rack to receive wireless communication equipment;
an extendable antenna mast; and
air conditioning machine to cool the shelter interior;

FIGS. 46-48 show an exemplary co-location stack-configuration of four pods. In this configuration, a first shelter has pre-configured equipment to communicate with a telecommunication facility, wherein the shelter in combination with one or more additional modular shelters in combination conforms to the approximate dimensions of a standard International Organization for Standardization (ISO) freight container. A second shelter can then be stacked above the first shelter coupled to the stair, wherein the shelter in combination with one or more additional modular shelters in combination conforms to the approximate dimensions of the ISO freight container. A stair coupled to a side of the shelter, and the shelter can also have balcony for various needs.

FIGS. 49-52 show an exemplary co-location inline configuration of four pods. This configuration has a first shelter having pre-configured equipment to communicate with a telecommunication facility, wherein the shelter in combination with one or more additional modular shelters in combination conforms to the approximate dimensions of a standard International Organization for Standardization (ISO) freight container and one or more additional shelters positioned in parallel or spaced apart from the first shelter coupled to the stair, wherein the shelter in combination with one or more additional modular shelters in combination conforms to the approximate dimensions of the ISO freight container.

Figure 53A:
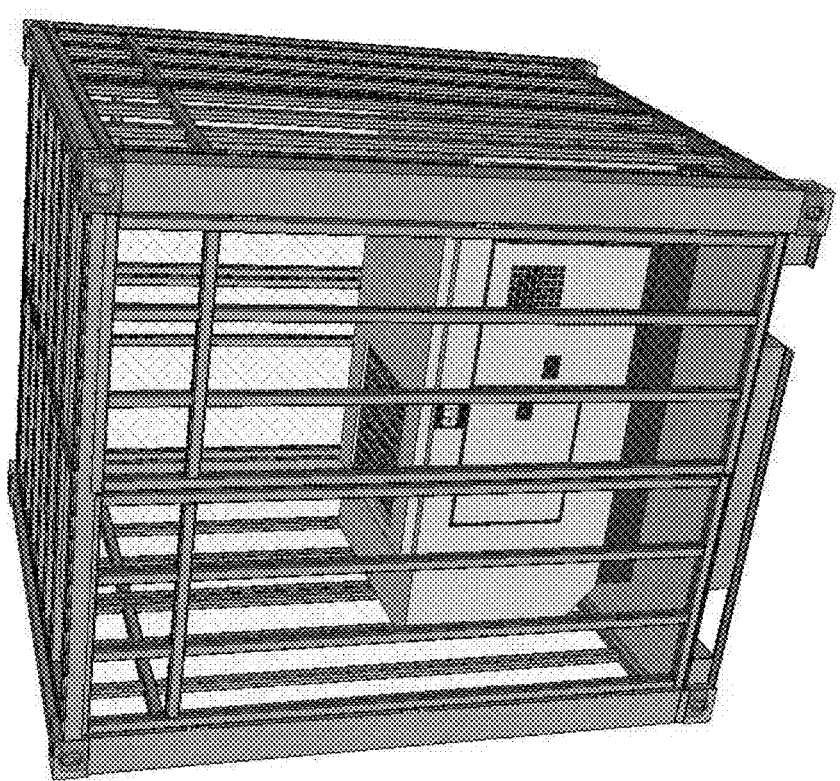
FIG. 53A-53G show exemplary modular units that can be added to the pod similar to a LEGO block.
Figure 53B:
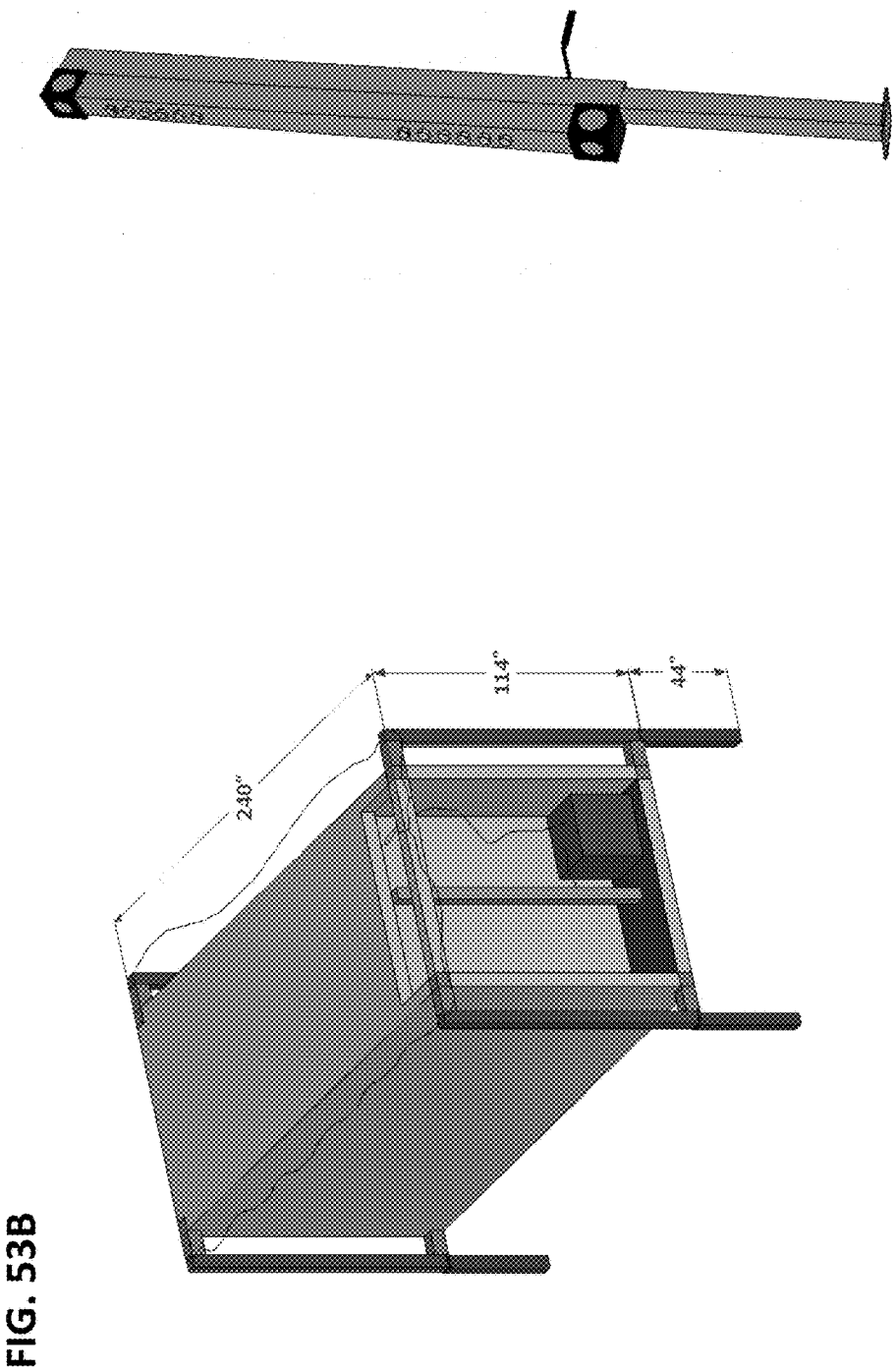
Figure 53C:
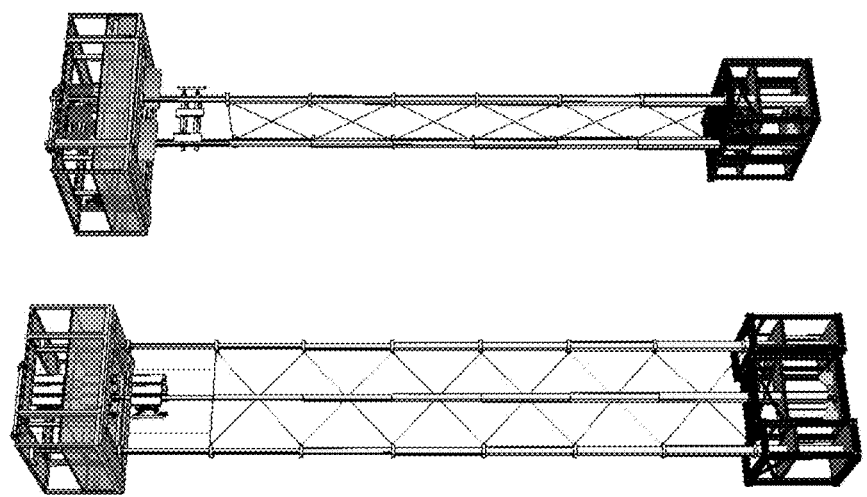
Figure 53D:
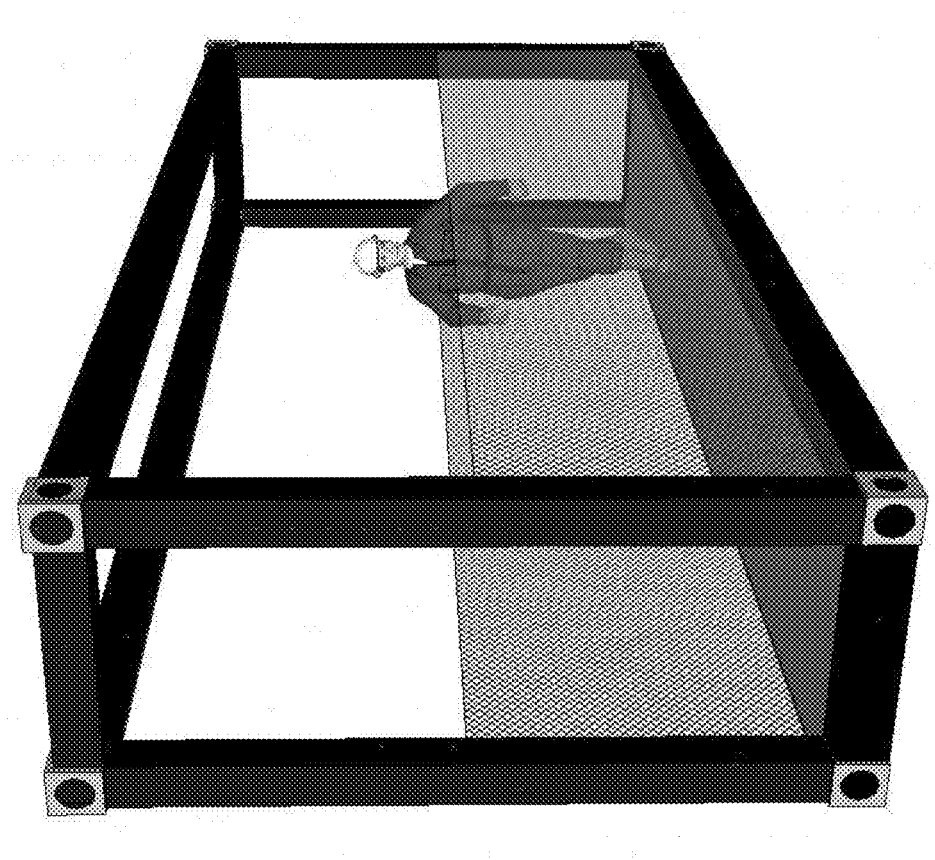
Figure 53E:
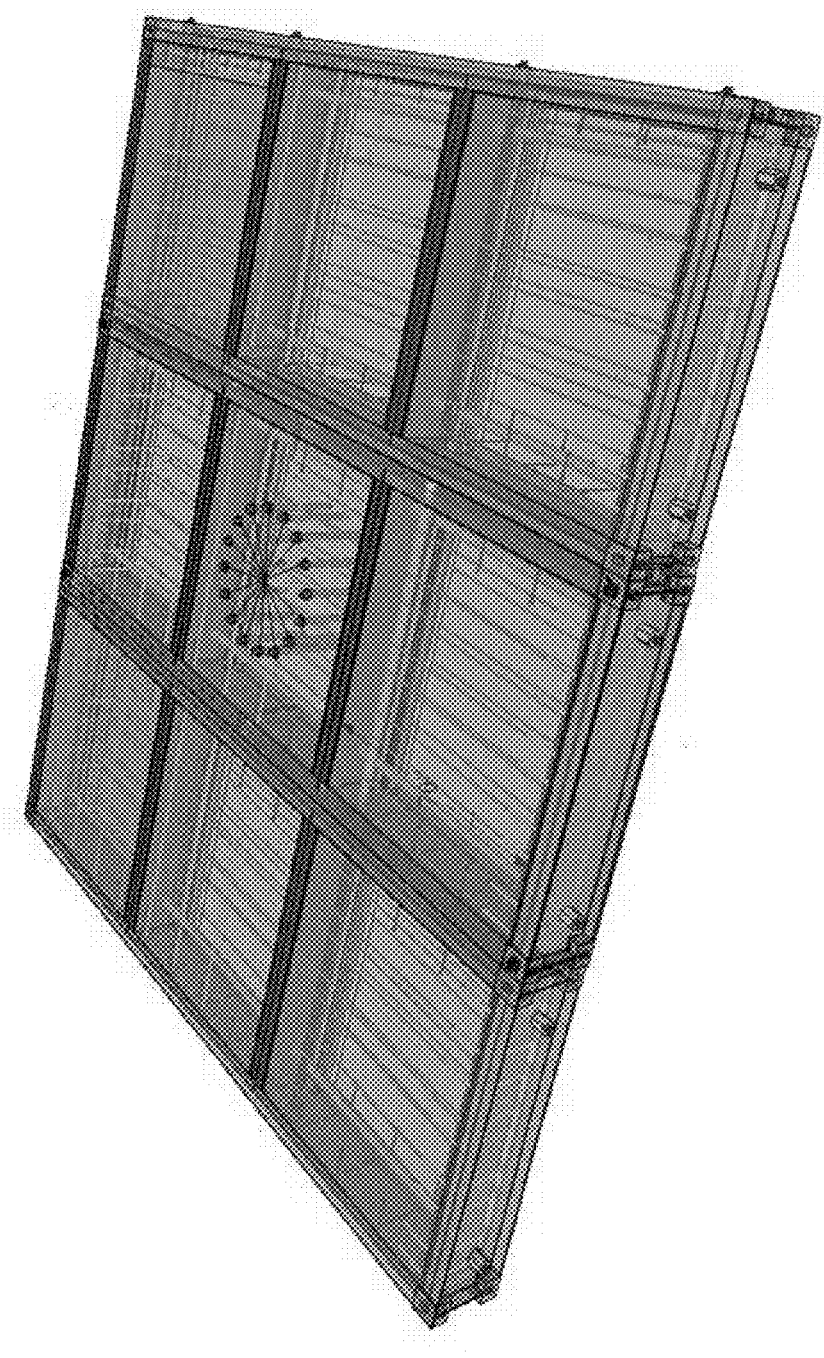
Figure 53F:
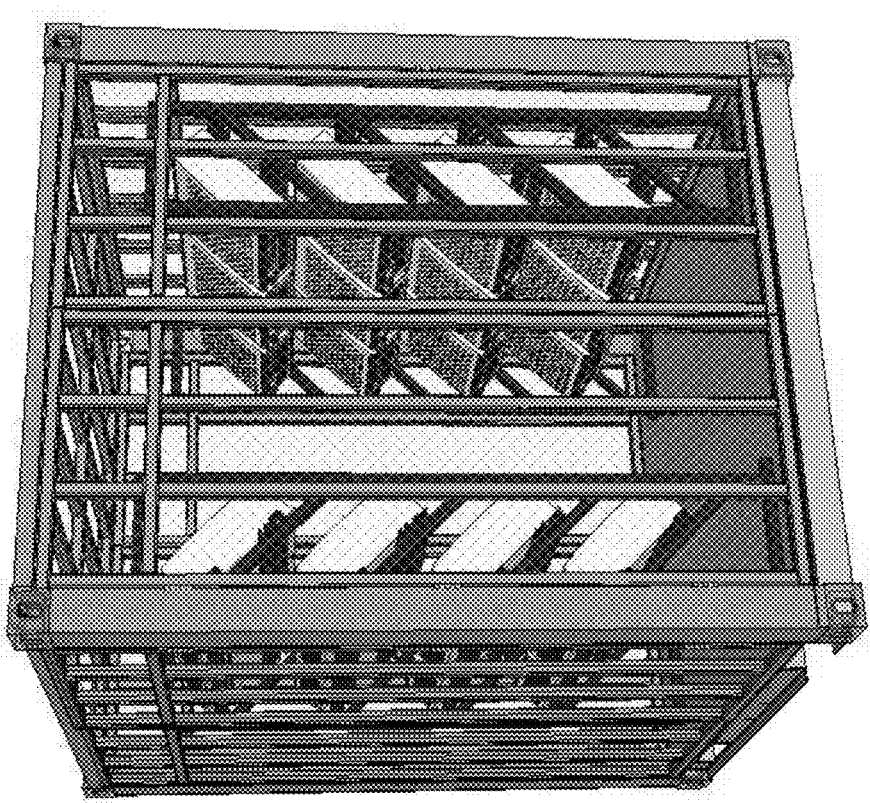
Figure 53G:
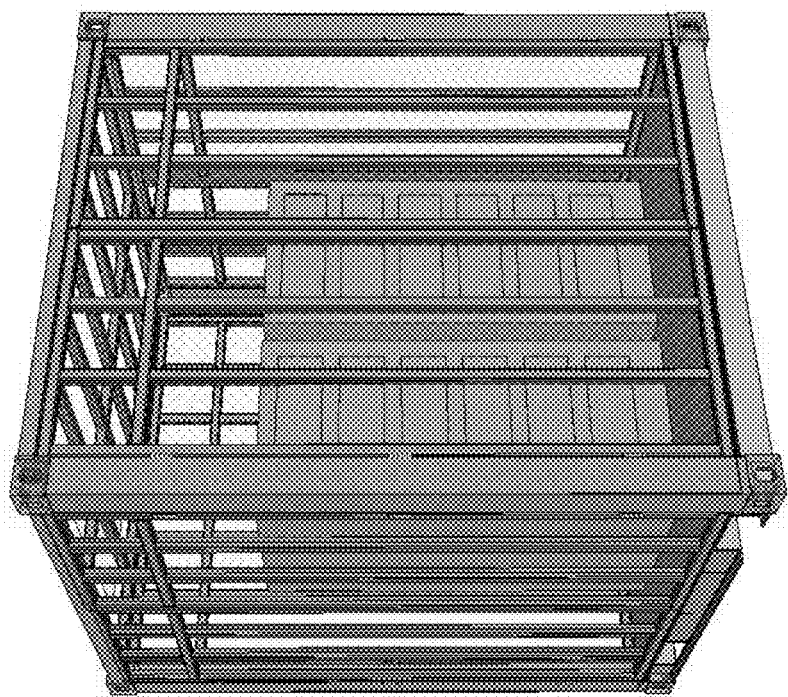
Figure 55D:
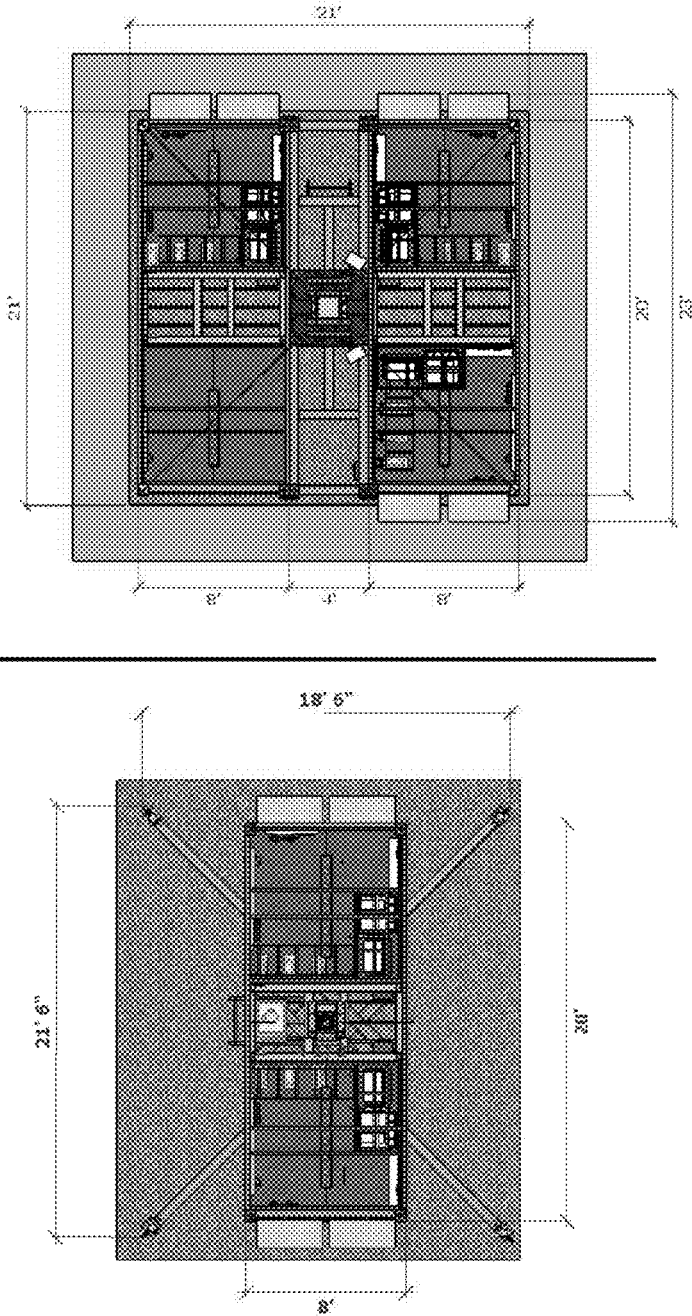
Figure 56C:
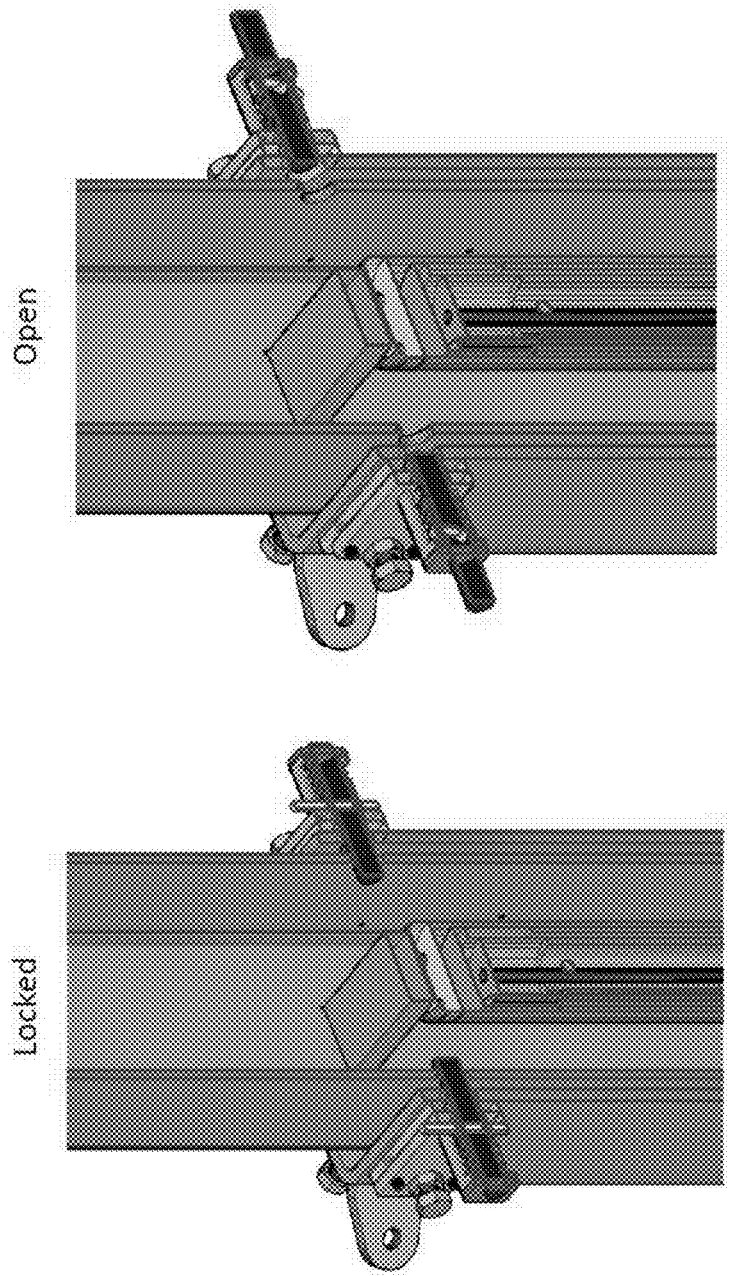
Figure 56D:
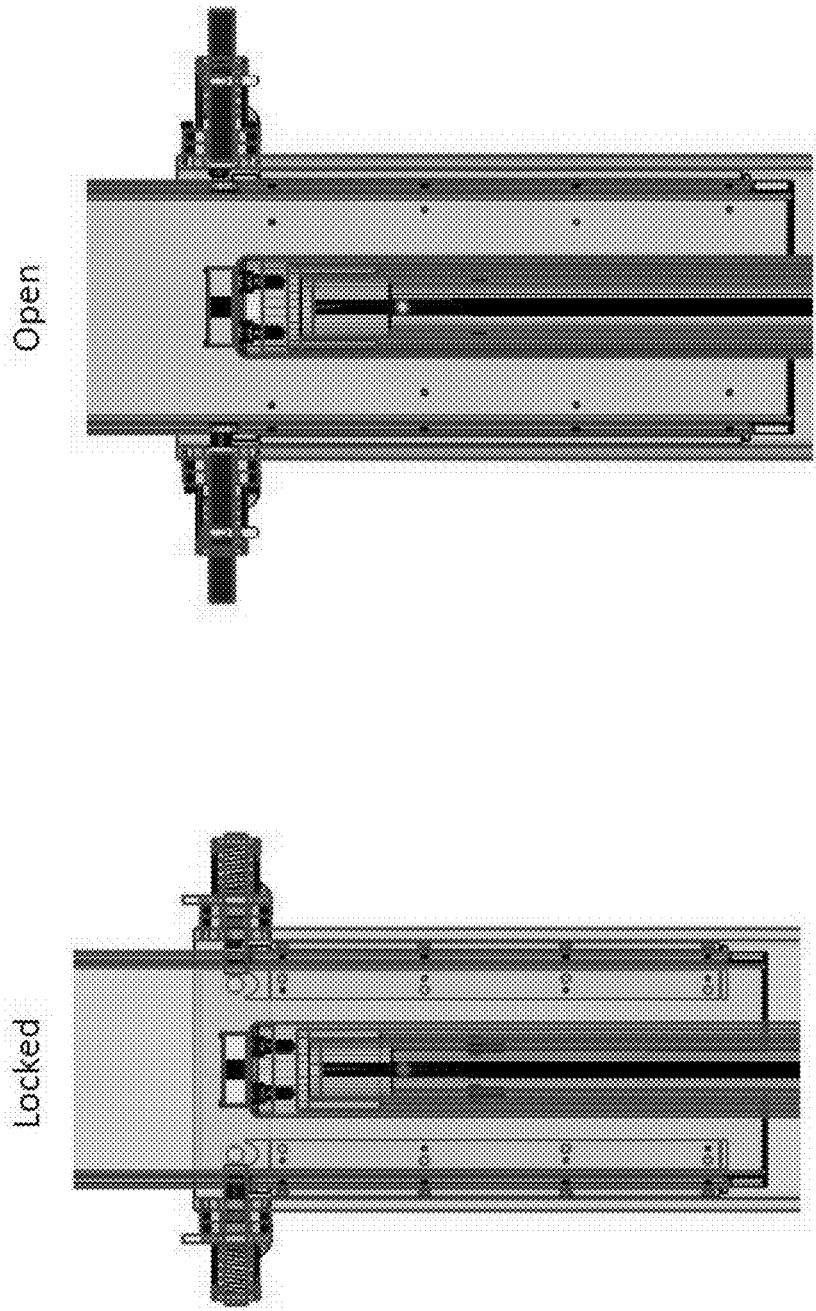

FIG. 53A-53G show exemplary modular units that can be added to the pod similar to a LEGO block. FIG. 53A shows an exemplary power generator as a modular add-on option. FIG. 53B shows an exemplary pod lift stand as a modular add-on option. FIG. 53C shows an exemplary lift bucket as a modular add-on option. FIG. 53D shows an exemplary pod walkway as a modular add-on option. FIG. 53E shows an exemplary pod foundation option. FIG. 53F shows an exemplary radio expansion unit as a modular add-on option. FIG. 53G shows an exemplary power plant or backup battery module as a modular add-on option.

FIGS. 54A-54C show exemplary monopole antenna ballast foundation using 3 8×20 containers.

FIGS. 55A-55D show exemplary ballast configurations supporting a plurality of modular pods sharing a common antenna module between the pods.

FIGS. 56A-56E show exemplary mast securing system that reduces risk of mast collapsing based on securing pin failure. In this system, the masts have portions that, as they extend, is usually pinned to secure the current segment and the next segment. However, as pins can fall out, the segments can collapse and cause injury. The hydraulic actuated mast is designed to fit inside the pod. It has a collapsed height of 9'-4" and can extended to the height of 60' in one embodiment. The mast consists of structural square steel tubing which telescope one section at a time by 3 stage hydraulic ram. Each section of the mast square tubing has a lock pin/ram push pin cut out, this pin is inserted to the section being erected pushed by the hydraulic ram. When the mast section is at the desired height, the twistlock is engage to lock the section in place for allowing the ram to come down and lift the next section. When the mast section is extended the twistlock handle is rotated to allow the twistlock pin to fully engage and penetrates to two mast section to lock in place so the ram can come down safely to lift the next mast section. The system of FIGS. 56A-56E provide a spring loaded lock system in place of a normal pin, and the lock system has a locked state, where the spring loaded rod extends through the two mast segments by a considerable distance through the two mast segment sides to prevent accidental collapse of the mast segments. Moreover, a lock and open pin is provided to ensure that the rod is at its intended locked or open position.

The advantages of the present invention can be achieved in an economical, practical, and facile manner. While preferred aspects and example configurations have been shown and described, it is to be understood that various further modifications and additional configurations will be apparent to those skilled in the art. It is intended that the specific embodiments and configurations herein disclosed are illustrative of the preferred nature of the invention, and should not be interpreted as limitations on the scope of the invention. While various embodiments of the invention have been described above, it should be understood that they have been presented by way of example only, and not by way of limitation. Although the disclosure is described above in terms of various exemplary embodiments and implementations, it should be understood that the various features and functionality described in one or more of the individual embodiments are not limited in their applicability to the particular embodiment with which they are described. They instead can be applied, alone or in some combination, to one or more of the other embodiments of the disclosure, whether or not such embodiments are described, and whether or not such features are presented as being a part of a described embodiment. Thus the breadth and scope of the present disclosure should not be limited by any of the above-described exemplary embodiments.

All references cited herein are incorporated herein by reference in their entirety. To the extent publications and patents or patent applications incorporated by reference contradict the disclosure contained in the specification, the specification is intended to supersede or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein.

Terms and phrases used in this application, and variations thereof, especially in the appended claims, unless otherwise expressly stated, should be construed as open ended as opposed to limiting. As examples of the foregoing, the term" "including" should be read to mean "including, without limitation,' "including but not limited to,' or the like; the term "comprising" as used herein is synonymous with "including," "containing," or "characterized by," and is inclusive or open-ended and does not exclude additional, unlisted elements or method steps; the term "having" should be interpreted as "having at least;" the term "includes' should be interpreted as "includes but is not limited to;" the term "example" is used to provide exemplary instances of the item in discussion, not an exhaustive or limiting list thereof; adjectives such as "known," "normal," "standard,"

and terms of similar meaning should not be construed as limiting the item described to a given time period or to an item available as of a given time, but instead should be read to encompass known, normal, or standard technologies that may be available or known now or at any time in the future; and use of terms like "preferably," "preferred," "desired," or "desirable," and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should be read as "and/or" unless expressly stated otherwise.

With respect to the use of substantially any plural or singular terms herein, those having skill in the art can translate from the plural to the singular or from the singular to the plural as is appropriate to the context or application. The various singular/plural permutations may be expressly set forth herein for sake of clarity.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

Having fully described at least one embodiment of the present invention, other equivalent or alternative methods of providing mobile cellular pods according to the present invention will be apparent to those skilled in the art. The invention has been described above by way of illustration, and the specific embodiments disclosed are not intended to limit the invention to the particular forms disclosed. The invention is thus to cover all modifications, equivalents, and alternatives falling within the spirit and scope of the following claims.

Claim elements and steps herein may have been numbered and/or lettered solely as an aid in readability and understanding. Any such numbering and lettering in itself is not intended to and should not be taken to indicate the ordering of elements and/or steps in the claims.

What is claimed is:

1. A cellular communication system, comprising:
   a modular shelter having pre-configured equipment to communicate with a telecommunication facility, wherein the modular shelter conforms to at least one dimension associated with a standard International Organization for Standardization (ISO) freight container, the modular shelter comprising:
   a door to enter the modular shelter;
   a computer rack to receive computer equipment;
   a radio unit rack to receive wireless communication equipment;
   an antenna compartment housing an extendable antenna mast; and
   an air conditioning machine to cool an interior of the modular shelter.

2. The system of claim 1, wherein the computer rack is adjustable to handle different sizes of the computer equipment.

3. The system of claim 1, the modular shelter further comprising an air conditioning compartment to house the air conditioning machine.

4. The system of claim 1, the modular shelter further comprising an equipment compartment, the equipment compartment housing the computer rack and the radio unit rack, wherein the door is coupled to the equipment compartment, and wherein the equipment compartment is sealed from an environment external to the modular shelter.

5. The system of claim 1, the antenna compartment further comprising an actuator to elevate the extendable antenna mast.

6. The system of claim 1, the antenna compartment further comprising a plurality of radio frequency entry openings to receive cables to an antenna of the extendable antenna mast.

7. The system of claim 1, further comprising a ballast coupled to the modular shelter.

8. The system of claim 1, wherein the modular shelter further comprises first and second substantially parallel corner posts disposed at a first end of the modular shelter, each of the first and second corner posts having first and second ends; an upper frame support extending between the first ends of the first and second corner posts; a lower frame support extending between the second ends of the first and second corner posts, and wherein the modular shelter has sufficient strength to withstand the forces of at least eight similar ones of the modular shelter stacked on top of the modular shelter.

9. The system of claim 1, wherein the modular shelter is configured to satisfy a stacking test requirement when at least eight similarly dimensioned ones of the modular shelter are stacked on top of the modular shelter.

10. The system of claim 1, wherein the modular shelter further comprises a plurality of corner posts, wherein each of the corner posts comprises first and second connection blocks disposed respectively adjacent the first and second ends of the corner post.

11. The system of claim 10, wherein at least one of the corner posts comprises an interior cavity configured to receive a jack configured to assist with leveling of the modular shelter.

12. The system of claim 1, wherein the modular shelter further comprises: a jack configured to move the modular shelter from a truck to a ground without requiring a crane; and a hinge connecting the jack and one of the corner posts, wherein the hinge is configured to allow the jack to pivot from a first position in which the jack is disposed substantially within an interior cavity of the one of the corner posts to a second position in which the jack is disposed outside of the one of the corner posts.

13. The system of claim 1, further a second modular shelter stacked above the modular shelter; and
a stair coupled to a side of the modular shelter;
wherein the second modular shelter stacked above the modular shelter, each of the modular shelter and the second modular shelter conforms to dimensions of the standard ISO freight container, the dimensions including the at least one dimension associated with the standard ISO freight container.

14. The system of claim 1, further comprising at least one second modular shelter stacked above the modular shelter, wherein the modular shelter and each of the at least one second modular shelter conforms to dimensions of the standard ISO freight container, the dimensions including the at least one dimension associated with the standard ISO freight container.

\* \* \* \* \*